(12) United States Patent
Kim et al.

(10) Patent No.: US 9,853,049 B2
(45) Date of Patent: Dec. 26, 2017

(54) MEMORY DEVICES HAVING COMMON SOURCE LINES INCLUDING LAYERS OF DIFFERENT MATERIALS

(71) Applicant: Samsung Electronics Co., Ltd., Suwon-Si, Gyeonggi-do (KR)

(72) Inventors: Kwang Soo Kim, Hwaseong-si (KR); Jae Hoon Jang, Seongnam-si (KR); Byoung Keun Son, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/241,450

(22) Filed: Aug. 19, 2016

(65) Prior Publication Data

US 2017/0309635 A1    Oct. 26, 2017

Related U.S. Application Data

(60) Provisional application No. 62/325,565, filed on Apr. 21, 2016.

(30) Foreign Application Priority Data

May 26, 2016    (KR) ........................ 10-2016-0064692

(51) Int. Cl.

| H01L 27/115 | (2017.01) |
|---|---|
| H01L 27/11582 | (2017.01) |
| H01L 23/528 | (2006.01) |
| H01L 23/532 | (2006.01) |
| H01L 29/08 | (2006.01) |
| H01L 27/11521 | (2017.01) |

(Continued)

(52) U.S. Cl.
CPC ...... *H01L 27/11582* (2013.01); *H01L 23/528* (2013.01); *H01L 23/53266* (2013.01); *H01L 23/53271* (2013.01); *H01L 27/11521* (2013.01); *H01L 27/11526* (2013.01); *H01L 27/11556* (2013.01); *H01L 27/11568* (2013.01); *H01L 27/11573* (2013.01); *H01L 29/0847* (2013.01); *H01L 29/7889* (2013.01); *H01L 29/7926* (2013.01)

(58) Field of Classification Search
None
See application file for complete search history.

(56) References Cited

U.S. PATENT DOCUMENTS

| 7,638,430 B2 | 12/2009 | Kim |
|---|---|---|
| 8,274,827 B2 | 9/2012 | Shirota et al. |

(Continued)

FOREIGN PATENT DOCUMENTS

| KR | 10-2004-0007155 A | 1/2004 |
|---|---|---|
| KR | 10-0414375 B1 | 7/2004 |

(Continued)

*Primary Examiner* — Daniel Whalen
(74) *Attorney, Agent, or Firm* — Ward and Smith, P.A.

(57) ABSTRACT

A memory device includes a gate structure including a plurality of gate electrode layers stacked on an upper surface of a substrate, a plurality of channel areas passing through the gate structure and extending in a direction perpendicular to the upper surface of the substrate, a source area disposed on the substrate to extend in a first direction and including impurities, and a common source line extending in the direction perpendicular to the upper surface of the substrate to be connected to the source area, and including a plurality of layers containing different materials.

17 Claims, 49 Drawing Sheets

(51) Int. Cl.
  *H01L 27/11526* (2017.01)
  *H01L 27/11556* (2017.01)
  *H01L 27/11568* (2017.01)
  *H01L 27/11573* (2017.01)
  *H01L 29/788* (2006.01)
  *H01L 29/792* (2006.01)

(56) References Cited

U.S. PATENT DOCUMENTS

| | | | |
|---|---|---|---|
| 2002/0088976 A1* | 7/2002 | Shin | H01L 27/11521 257/68 |
| 2008/0251824 A1 | 10/2008 | Yamazaki | |
| 2009/0206318 A1* | 8/2009 | Ko | H01L 27/2409 257/4 |
| 2012/0139027 A1* | 6/2012 | Son | H01L 29/7926 257/324 |
| 2013/0214344 A1* | 8/2013 | Lim | H01L 29/792 257/324 |
| 2015/0008499 A1 | 1/2015 | Lee et al. | |
| 2015/0221376 A1 | 8/2015 | Choi et al. | |
| 2015/0303214 A1 | 10/2015 | Kim et al. | |

FOREIGN PATENT DOCUMENTS

| | | |
|---|---|---|
| KR | 10-0604920 B1 | 7/2006 |
| KR | 10-0738577 B1 | 7/2007 |
| KR | 10-0808363 B1 | 2/2008 |
| KR | 10-2015-0091666 A | 8/2015 |

* cited by examiner

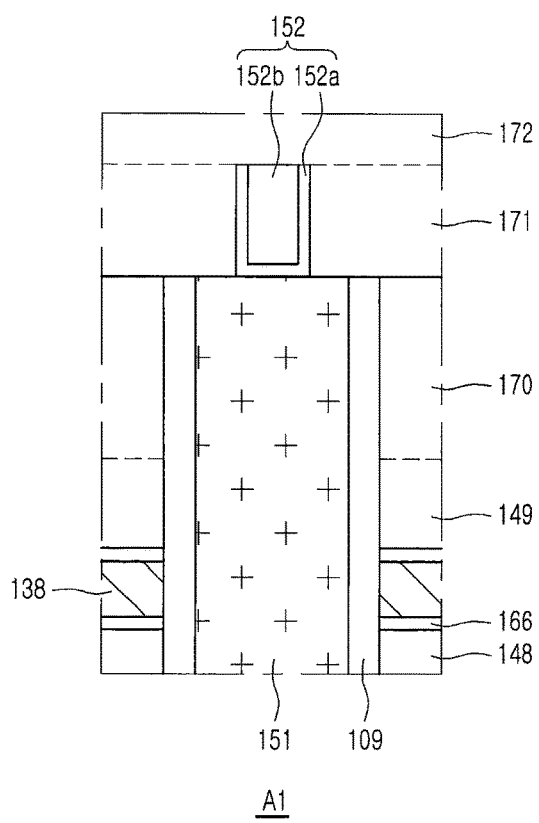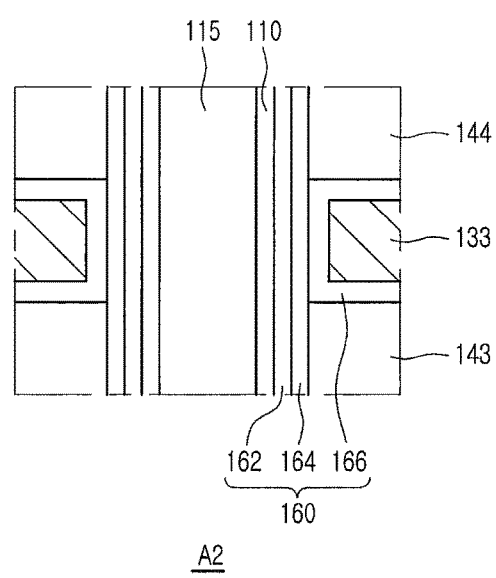
FIG. 6
FIG. 7

MEMORY DEVICES HAVING COMMON SOURCE LINES INCLUDING LAYERS OF DIFFERENT MATERIALS

CROSS-REFERENCE TO RELATED APPLICATIONS

This application claims priority to U.S. Provisional Patent Application No. 62/325,565, filed Apr. 21, 2016, which claims priority to Korean Patent Application No. 10-2016-0064692, filed May 26, 2016, the contents of which are hereby incorporated herein by reference as if set forth in their entireties.

FIELD

The present inventive concept relates generally to semiconductors and, more particularly to memory devices.

BACKGROUND

Electronic devices have gradually become smaller, but have more demands to process large amounts of data. Accordingly, a degree of integration of semiconductor memory devices used in such electronic products should be increased. To provide an increased degree of integration of semiconductor memory devices, some memory devices have been provided having a vertical transistor structure, instead of a planar transistor structure.

SUMMARY

Some embodiments of the present inventive concept provide a memory device that includes a gate structure including a plurality of gate electrode layers stacked on an upper surface of a substrate; a plurality of channel areas passing through the gate structure and extending in a direction perpendicular to the upper surface of the substrate; a source area disposed on the substrate to extend in a first direction and including impurities; and a common source line extending in the direction perpendicular to the upper surface of the substrate to be connected to the source area, and including a plurality of layers containing different materials.

Further embodiments of the present inventive concept provide a memory device including a substrate; a source area disposed on the substrate to extend in a first direction and including n-type impurities; a plurality of channel areas extending in a direction perpendicular to an upper surface of the substrate; a plurality of gate electrode layers stacked on the upper surface of the substrate and disposed to be adjacent to at least a portion of the plurality of channel areas; and a common source line layer disposed on the source area to extend in the first direction, and including a first layer containing polysilicon having a higher concentration of n-type impurities than the source area and a second layer disposed on an upper surface of the first layer and containing at least one of a metal, a metal silicide, and a metal compound.

Still further embodiments of the present inventive concept provide vertical memory devices including a source area on a substrate, the source area extending in a first direction and including impurities; and a common source line extending in a direction perpendicular to an upper surface of the substrate to be connected to the source area and including a plurality of layers containing different materials.

BRIEF DESCRIPTION OF DRAWINGS

The above and other aspects, features, and advantages of the present inventive concept will be more clearly understood from the following detailed description taken in conjunction with the accompanying drawings, in which:

FIG. 6 is an enlarged view illustrating the region A1 of the memory device illustrated in FIG. 5.

FIG. 7 is an enlarged view illustrating the region A2 of the memory device illustrated in FIG. 5.

DETAILED DESCRIPTION

Figure 1:
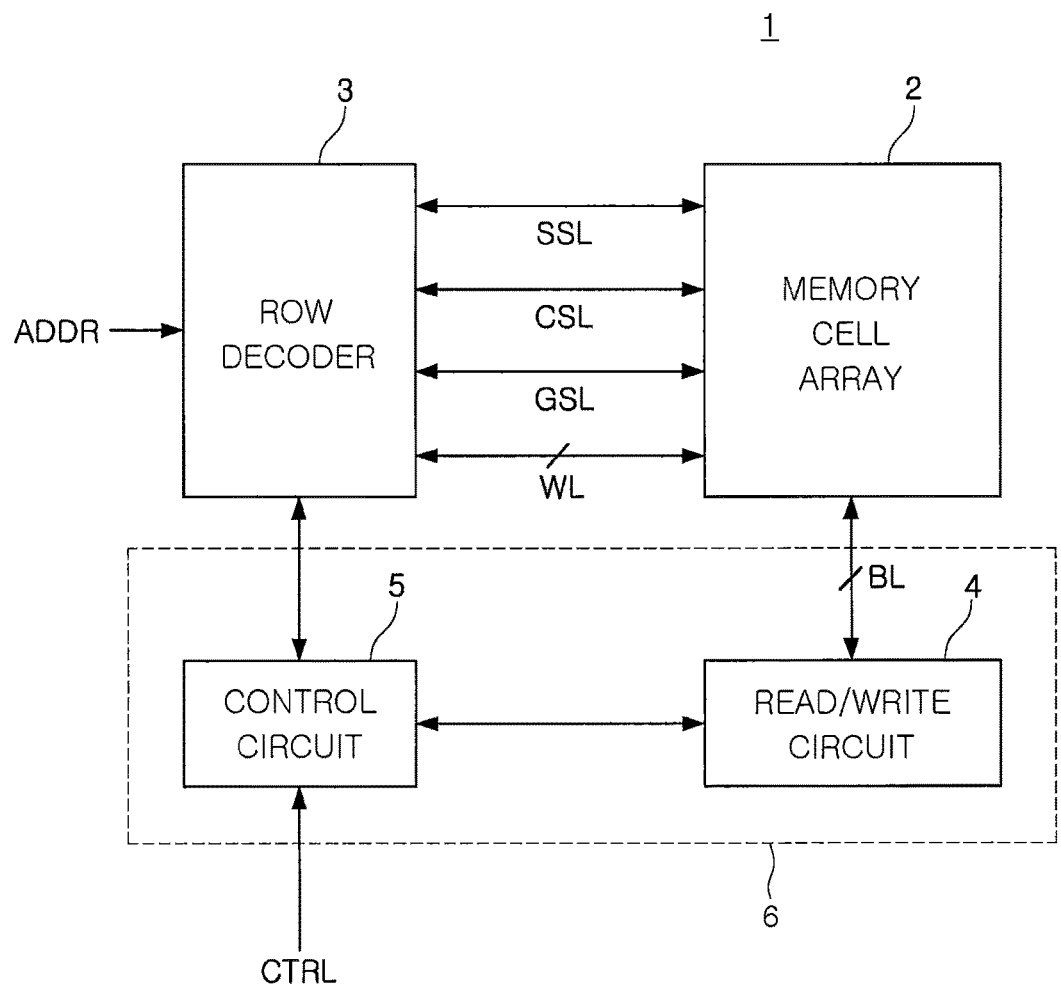
FIG. 1 is a schematic block diagram of a memory device according to some embodiments of the present inventive concept.

Hereinafter, the inventive concept will be described in detail by explaining example embodiments of the invention with reference to the attached drawings. Like reference numerals in the drawings denote like elements and, thus, detailed descriptions thereof will be omitted in the interest of brevity.

Referring first to FIG. 1, a semiconductor device 1 according to some embodiments of the present inventive concept may include a memory cell array 2, a row decoder 3, and a core logic circuit 6. The core logic circuit 6 may include a read/write circuit 4 and a control circuit 5.

The memory cell array 2 may include a plurality of memory cells arranged in a plurality of rows and columns. The plurality of memory cells included in the memory cell array 2 may be connected to the row decoder 3 via a word line WL, a common source line CSL, a string select line SSL, a ground select line GSL, and the like, and may be connected to the read/write circuit 4 via a bit line BL. In some example embodiments, the plurality of memory cells arranged in the same row may be connected to the same word line WL, and the plurality of memory cells arranged in the same column may be connected to the same bit line BL.

The plurality of memory cells included in the memory cell array 2 may be divided into a plurality of memory blocks. Each memory block may include a plurality of word lines WL, a plurality of string select lines SSL, a plurality of ground select lines GSL, a plurality of bit lines BL, and at least one common source line CSL.

The row decoder 3 may receive address information ADDR from an external source and decode the received address information ADDR to determine a voltage supplied to at least a portion of the word lines WL, common source line CSL, string select lines SSL, and ground select lines GSL, connected to the memory cell array 2.

The read/write circuit 4 may select at least a portion of the bit lines BL connected to the memory cell array 2 according to a command received from the control circuit 5. The read/write circuit 4 may read data stored in a memory cell connected to the selected portion of the bit lines BL, or may write data to the memory cell connected to the selected portion of the bit lines BL. The read/write circuit 4 may include circuits, such as a page buffer circuit, an input/output buffer circuit, a data latch circuit, and the like, in order to perform the above-described operations.

The control circuit 5 may control operations of the row decoder 3 and the read/write circuit 4 in response to a control signal CTRL transmitted from an external source. When data stored in the memory cell array 2 is read, the control circuit 5 may control an operation of the row decoder 3 to supply a voltage for a reading operation to the word line WL in which data to be read is stored. When the voltage for the reading operation is supplied to a specific word line WL, the control circuit 5 may control the read/write circuit 4 to read data stored in a memory cell connected to the word line WL to which the voltage for the reading operation is supplied.

Meanwhile, when data is written to the memory cell array 2, the control circuit 5 may control an operation of the row decoder 3 so as to supply a voltage for a writing operation to a word line WL to which the data is to be written. When the voltage for the writing operation is supplied to a specific word line WL, the control circuit 5 may control the read/write circuit 4 to write the data to a memory cell connected to the word line WL to which the voltage for the writing operation is supplied.

Figure 2:
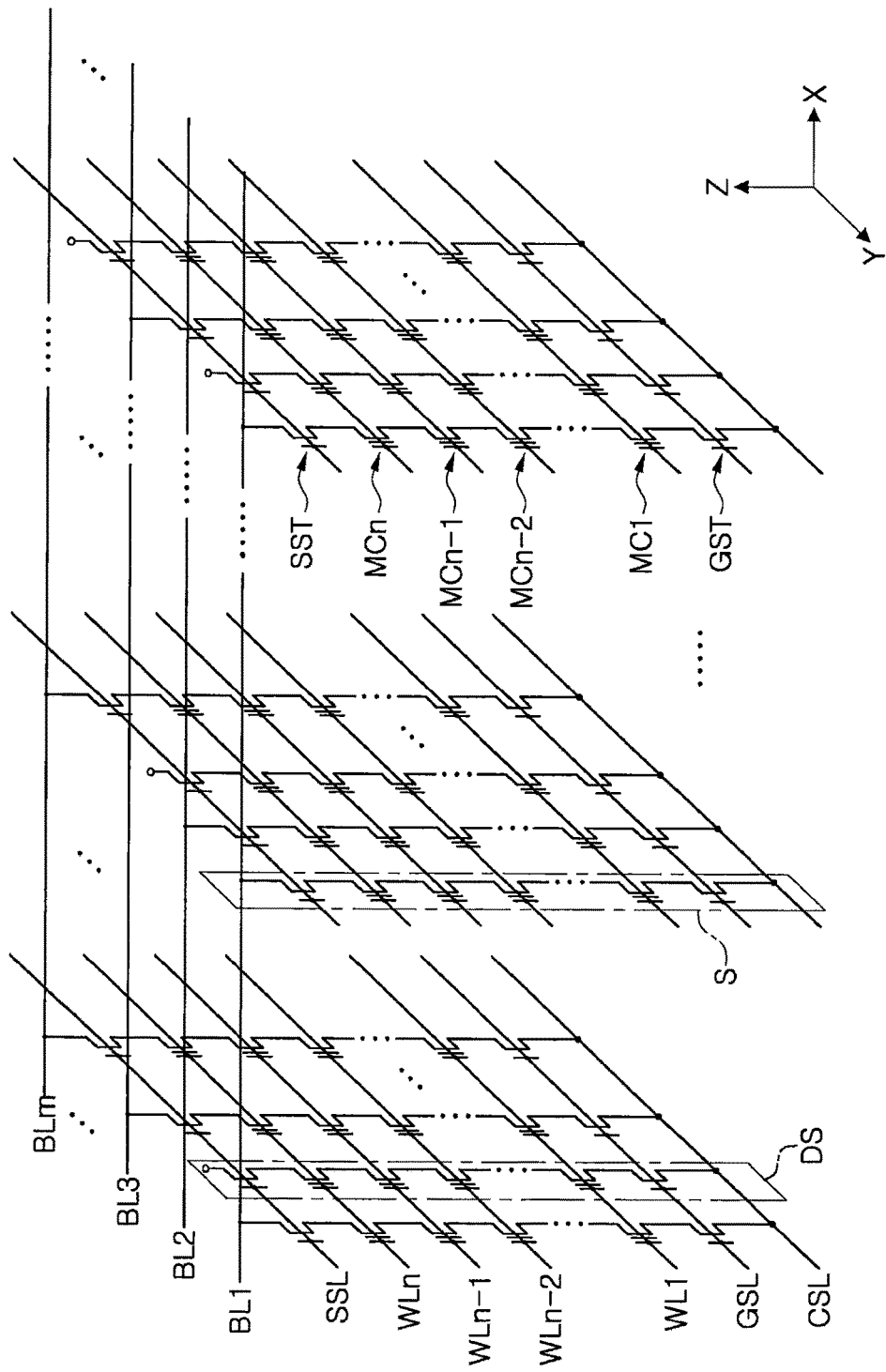
FIG. 2 is a circuit diagram illustrating a memory cell array of a memory device according to some embodiments of the present inventive concept.

FIG. 2 is an equivalent circuit diagram illustrating a memory cell array of a memory device according to some example embodiments of the present inventive concept. The memory device according to the example embodiments of the present inventive concept may be a vertical NAND flash device.

Referring to FIG. 2, the memory cell array may include a plurality of memory cells strings S, each of which includes n memory cells MC1 to MCn connected to each other in series, and a ground select transistor GST and a string select transistor SST respectively connected to both ends of the memory cells MC1 to MCn in series. The n memory cells MC1 to MCn connected to each other in series may be respectively connected to n word lines WL1 to WLn for selecting at least a portion of the memory cells MC1 to MCn. Meanwhile, a dummy cell may be further disposed between the ground select transistor GST and the first memory cell MC1 and between the string select transistor SST and the $n^{th}$ memory cell MCn.

A gate terminal of the ground select transistor GST may be connected to a ground select line GSL, and a source terminal of the ground select transistor GST may be connected to a common source line CSL. Meanwhile, a gate terminal of the string select transistor SST may be connected to a string select line SSL, and a source terminal of the string select transistor SST may be connected to a drain terminal of the memory cell MCn. In FIG. 2, one ground select transistor GST and one string select transistor SST are connected to the n memory cells MC1 to MCn connected to each other in series. However, a plurality of ground select transistors GST or a plurality of string select transistors SST may be connected to the n memory cells MC1 to MCn without departing from the scope of the present inventive concept.

A drain terminal of the string select transistor SST may be connected to a plurality of bit lines BL1 to BLm. When a signal is applied to the gate terminal of the string select transistor SST via the string select line SSL, the signal applied via the bit lines BL1 to BLm may be transmitted to the n memory cells MC1 to MCn connected to each other in series, and thereby a data reading or data writing operation may be performed. In addition, an erase operation in which data written in the n memory cells MC1 to MCn are removed may be performed by applying a predetermined erase voltage via a well region formed in a substrate.

Referring again to FIG. 2, the memory device according to the some example embodiments of the present inventive concept may include at least one dummy string DS. The dummy string DS may be a string including a dummy channel, which is not connected to the bit lines BL1 to BLm.

Figure 3:
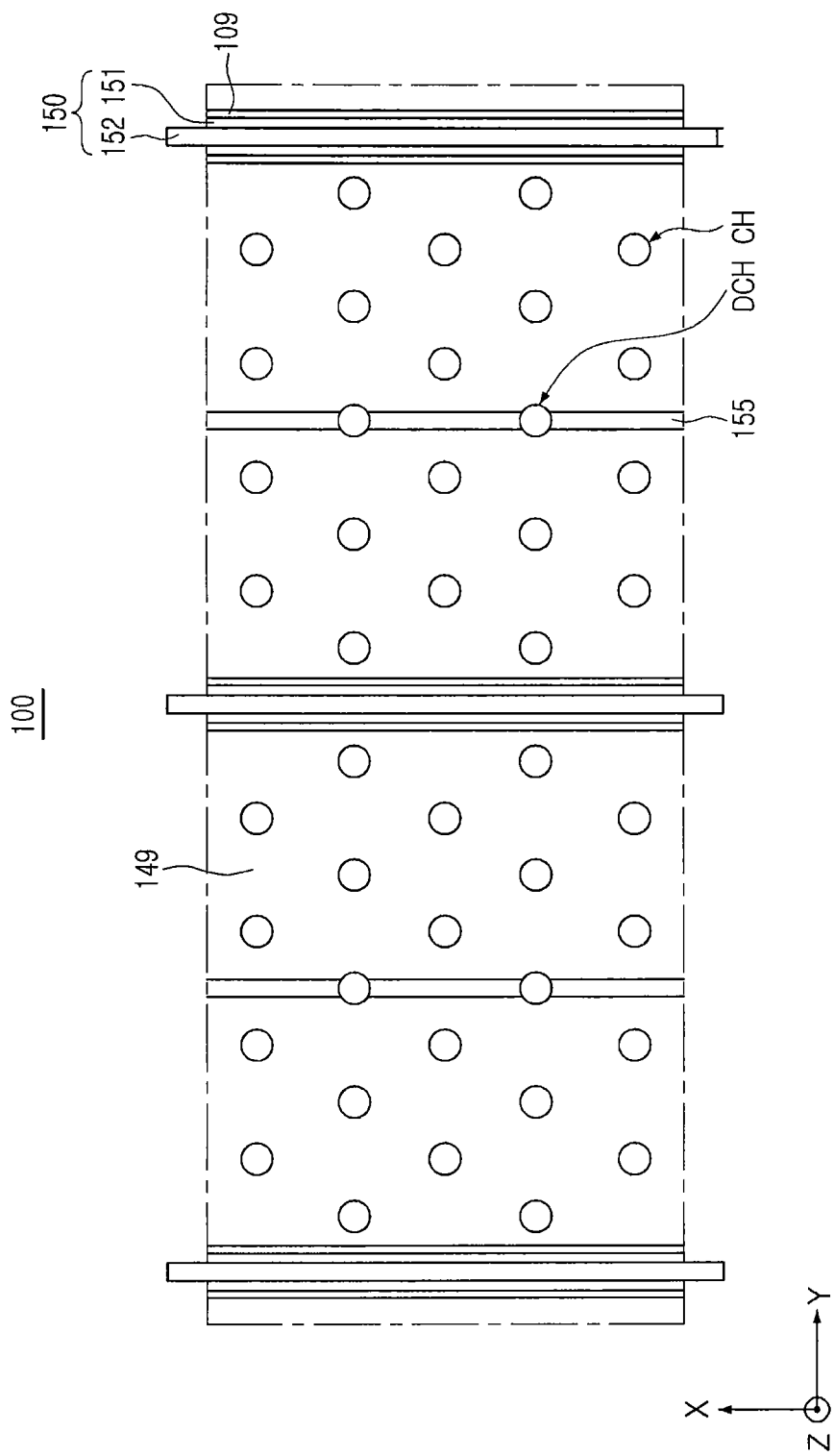
FIG. 3 is a plan view schematically illustrating a portion of a memory device according to some embodiments of the present inventive concept.

Referring now to FIG. 3, a plan view illustrating a portion of a memory device according to some example embodiments of the present inventive concept will be discussed. As illustrated in FIG. 3, a memory device 100 according to some example embodiments of the present inventive concept may include a plurality of channel areas CH, a plurality of dummy channel areas DCH, a common source line 150, and an isolation insulating layer 155. In the example embodiments illustrated in FIG. 3, the plurality of channel areas CH and the plurality of dummy channel areas DCH may be arranged to be isolated from each other on an X-Y plane. A plurality of gate electrode layers and a plurality of insulating layers may be alternately stacked in a z-axis direction to provide a gate structure, and the plurality of channel areas CH and the plurality of dummy channel areas DCH may pass through the gate structure to extend in the z-axis direction.

The gate structure may be divided into a plurality of parts by side spacers 109 disposed on side surfaces of the common source line 150. The side spacers 109 may reduce the likelihood, or possibly prevent, the common source line 150 from being in direct contact with the gate structure, and may include an insulating material, such as silicon oxide.

In the memory device 100 according to the example embodiments of the present inventive concept, the common source line 150 may include a plurality of layers formed of different materials. In some example embodiments, the common source line 150 may include a first layer 151 disposed in a lower portion in the z-axis direction and a second layer 152 disposed on the first layer 151. The first layer 151 and the second layer 152 may be formed of different materials. In addition, the first layer 151 and the second layer 152 may be formed of one of a metal, a metal silicide, a metal compound, and polysilicon doped with impurities.

In some example embodiments, the first layer 151 may be formed of polysilicon doped with n-type impurities. Normally, the common source line 150 is formed of a metal such as tungsten (W). However, according to the example embodiments of the present inventive concept, the first layer 151, a portion of the common source line 150, may be formed by depositing polysilicon doped with n-type impurities. Since the first layer 151 is formed of polysilicon, the gate structure may not be melted or bent, and a peeling phenomenon occurring in the common source line 150 may be suppressed. Accordingly, reliability of the memory device 100 may be improved.

Polysilicon doped with n-type impurities may have a relatively high resistance, compared to a metal such as tungsten (W). In order to compensate for a resistance component present in the polysilicon, the second layer 152 may be formed on the first layer 151. The second layer 152 may include Ti/TiN provided as a barrier layer, and a metal such as tungsten (W).

The second layer 152 may extend in a first direction (an x-axis direction), like the first layer 151. In some example embodiments, the second layer 152 may extend to be longer than the first layer 151 in the first direction. Since the second layer 152 is disposed on the first layer 151, the resistance component of the first layer 151 may be compensated. In order to increase the effect of compensating for the resistance by forming the second layer 152, the second layer 152 may be formed to be longer than the first layer 151 in the first direction.

Figure 4:
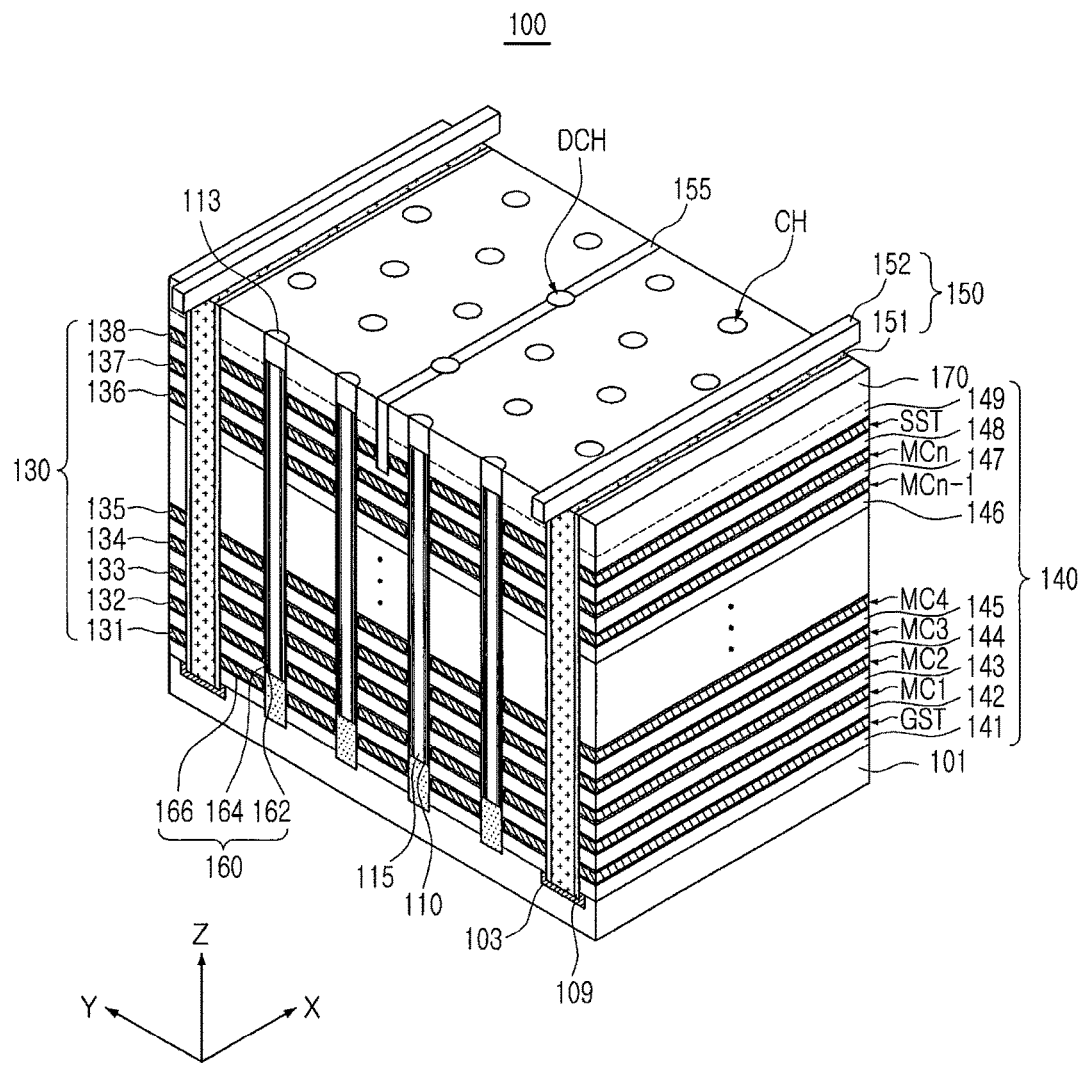
FIG. 4 is a perspective view illustrating a portion of a memory device according to some embodiments illustrated in FIG. 3.

FIG. 4 is a perspective view illustrating a portion of the memory device according to the example embodiments illustrated in FIG. 3. As illustrated in FIG. 4, the memory device 100 according to the example embodiments of the present inventive concept may include a substrate 101, a plurality of channel areas CH and dummy channel areas DCH disposed to be perpendicular to an upper surface (the x-y plane in the example embodiments illustrated in FIG. 4) of the substrate 101, a plurality of gate electrode layers 131 to 138 (generally denoted 130) disposed to be adjacent to the channel areas CH on the substrate 101. The plurality of gate electrode layers 130 may be stacked alternately with a plurality of insulating layers 141 to 149 (generally denoted 140) to provide a gate structure, and at least a portion of the gate electrode layers 130, for example, the gate electrode layer 138, may be divided into several parts by the isolation insulating layer 155.

The plurality of channel areas CH and dummy channel areas DCH may extend in a direction (the z-axis direction in the example embodiments illustrated in FIG. 4) perpendicular to the upper surface of the substrate 101. Each of the channel areas CH may include a channel layer 110, a filling insulating layer 115 filling an inner space of the channel layer 110, and a drain area 113 disposed on the channel layer 110. In some example embodiments, the channel layer 110 may have a pillar shape, such as a cylindrical shape or a prismatic shape, with no filling insulating layer 115. Furthermore, each of the channel areas CH may have an inclined side, and thus a width thereof may decrease toward the substrate 101, depending on an aspect ratio thereof.

The plurality of channel areas CH and the dummy channel areas DCH may be disposed to be isolated from each other on the X-Y plane. The numbers and arrangement of the plurality of channel areas CH and dummy channel areas DCH may be variously modified according to example embodiments. For example, the plurality of channel areas CH and dummy channel areas DCH may be arranged to form a zigzag pattern in at least one direction. In the example embodiments illustrated in FIG. 4, the plurality of channel areas CH may be symmetrically arranged with the isolation insulating layer 155 therebetween, and the plurality of dummy channel areas DCH may pass through the isolation insulating layer 155. However, it will be understood that embodiments of the present inventive concept are not limited thereto.

The channel layer 110 may be electrically connected to the substrate 101 via an epitaxial layer 111 thereunder. The channel layer 110 may include a semiconductor material, such as polysilicon or single-crystalline silicon. The semiconductor material may be doped with n-type or p-type impurities or may not be doped with impurities. The epitaxial layer 111 may be a layer grown by a selective epitaxial growth (SEG) process. The epitaxial layer 111 may be formed to recess the substrate 101 to a predetermined depth, as illustrated in FIG. 4.

The plurality of dummy channel areas DCH may have a similar structure to the channel areas CH. In other words, the plurality of dummy channel areas DCH may include the drain area 113, the channel layer 110, and the filling insulating layer 115, and may selectively include the epitaxial layer 111. However, the plurality of dummy channel areas DCH may be electrically isolated from a bit line on the gate structure, unlike the channel areas CH. Accordingly, a writing operation or the like may not be executed in memory cells MC1 to MCn provided by the dummy channel areas DCH.

The plurality of gate electrode layers 130 may be stacked alternately with the plurality of insulating layers 140 in the z-axis direction. Each of the plurality of gate electrode layers 130 may be adjacent to at least one channel layer 110, and may be provided as gate electrodes of the ground select transistor GST, a plurality of memory cells MC1 to MCn, and a string select transistor SST. In some example embodiments, gate electrode layers for dummy devices may be further disposed between the ground select transistor GST and the first memory cell MC1 and between the string select transistor SST and the $n^{th}$ memory cell MCn. Meanwhile, the total number of the memory cells MC1 to MCn is n in the example embodiments illustrated in FIG. 4, wherein n is a number defined by $2^a$ (herein, a is a natural number).

The plurality of gate electrode layers 130 may extend to form word lines WL1 to WLn. In some example embodiments, the plurality of gate electrode layers 130 may extend together with the plurality of insulating layers 140 in the first direction (the x-axis direction in the example embodiments illustrated in FIG. 4) to have different lengths, and form pad regions. In the pad regions, each of the plurality of gate electrode layers 130 may be connected to a contact plug.

The plurality of gate electrode layers 130 may be formed of conductive material such as polysilicon or a metal silicide material, and the plurality of insulating layers 140 may be formed of insulating material, such as silicon oxide or silicon nitride. The metal silicide material may be, for example, one selected from Co, Ni, Hf, Pt, W, and Ti. In some example embodiments, the plurality of gate electrode layers 130 may include a metal, such as tungsten (W). Furthermore, although not shown, the plurality of gate electrode layers 130 may further include a barrier layer for reducing diffusion, and the barrier layer may include at least one of tungsten nitride (WN), tantalum nitride (TaN), and titanium nitride (TiN).

The plurality of gate electrode layers 130, together with the channel layers 110 and gate insulating layers 160, may provide memory cells MC1 to MCn, a ground select transistor GST, and a string select transistor SST. The gate insulating layers 160 may include tunneling layers 162, charge storage layers 164, and blocking layers 166, sequentially stacked between the channel layers 110 and the plurality of gate electrode layers 130. The configuration of the gate insulating layers 160 may not be limited to the above-described three layers.

The blocking layer 166 may include a high-k dielectric material. In these embodiments, the high-k dielectric material may refer to a dielectric material having a higher dielectric constant than silicon oxide. The tunneling layer 162 may allow charges to move to the charge storage layer 164 in an F-N tunneling mechanism. The tunneling layer 162 may include, for example, silicon oxide. The charge storage layer 164 may be a charge-trapping layer or a floating gate conductive layer. For example, the charge storage layer 164 may include a dielectric material, quantum dots, or nanocrystals. In these embodiments, the quantum dots or nanocrystals may be formed of microparticles of a metal or a semiconductor material. The gate insulating layers 160 will be described later with reference to FIG. 7.

When a writing operation is executed in the memory device 100, charges moving through the tunneling layer 162 may be trapped in the charge storage layer 164. Memory cells MC1 to MCn including the charge storage layer 164 in which charges are trapped may have a different threshold voltage from memory cells MC1 to MCn in which charges are not trapped. During a reading operation, the memory device 100 may detect whether the charges are trapped or not from the threshold voltage of each of the memory cells MC1 to MCn, and determine whether data is written or not.

A source area 103 may be formed in the substrate 101. The source area 103 may be formed by injecting n-type impurities into a portion of the substrate 101, and may extend in the first direction (the x-axis direction in the example embodiments illustrated in FIG. 4). A common source line 150 and side spacers 109 may be formed on the source area 103. The side spacers 109 may be disposed on outer side surfaces of the common source line 150, and may divide the gate structure into a plurality of parts.

The common source line 150 may be connected to the source area 103 under the plurality of gate electrode layers 130, and may extend in the first direction, like the source area 103. Furthermore, the common source line 150 may be formed to be perpendicular to the upper surface of the substrate 101. In the example embodiments of the present inventive concept, the common source line 150 may include a first layer 151 and a second layer 152 formed of different materials.

In the memory device 100 according to the example embodiments of the present inventive concept, the first layer 151 of the common source line 150 may be formed of polysilicon doped with n-type impurities. Since the first layer 151 disposed in a relatively lower portion of the common source line 150 is formed of not a metal but of polysilicon, melting or warpage of the gate structure, occurring when the common source line 150 is formed only of a metal, may be reduced and the possibility of peeling of the common source line 150 may be lowered.

The common source line 150 may be formed by forming side spacers 109 and then sequentially depositing different materials between the side spacers 109. The first layer 151 may be formed by depositing polysilicon including n-type impurities. Accordingly, a concentration of n-type impurities in the common source line 150 may be higher than that in the source area 103 formed by injecting n-type impurities into the portion of the substrate 101.

The second layer 152 may be disposed on an upper surface of the first layer 151. A lower surface of the second layer 152 may be in direct contact with the upper surface of the first layer 151, and the second layer 152 may extend in the first direction, like the first layer 151. In some example embodiments, the second layer 152 may extend longer than the first layer 151 in the first direction. Since the second layer 152 is disposed on the upper surface of the first layer 151, the influence of polysilicon having a higher resistance than a metal may be compensated. A width of the second layer 152 (a length in a y-axis direction) may be determined within a range that does not interfere with a stud connected to an adjacent channel area CH.

Figure 5:
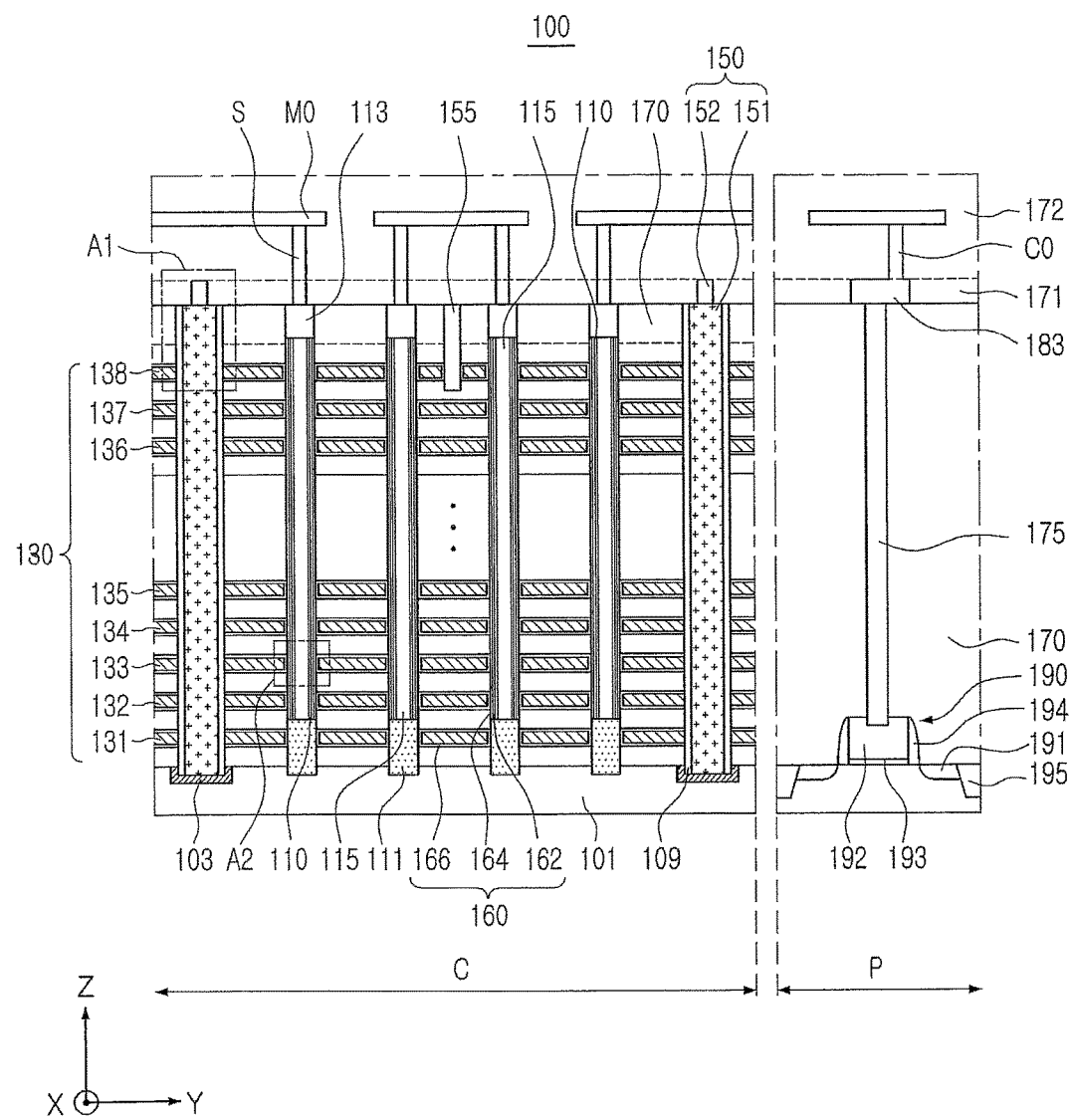
FIG. 5 is a cross-section illustrating a portion of a memory device according to the some embodiments illustrated in FIG. 3.

FIG. 5 is a cross-section illustrating a portion of the memory device according to the example embodiments illustrated in FIG. 3. Hereinafter, the memory device 100 is described with reference to FIG. 5, together with FIG. 4.

Referring to FIG. 5, the memory device 100 according to the example embodiments of the present inventive concept may include a cell region C and a peripheral circuit region P. The peripheral circuit region P is a region defined around the cell region C, and a plurality of peripheral circuit devices 190 may be disposed therein.

The plurality of peripheral circuit devices 190 are circuit devices transferring a signal required to write data to the memory cells MC1 to MCn or erase data from the memory cells MC1 to MCn, and to read the written data, and may include a horizontal transistor. Referring to FIG. 5, a peripheral circuit device 190 may include an active area 191, a horizontal gate electrode 192, and a horizontal gate insulating layer 193. A horizontal spacer 194 may be disposed on a sidewall of the horizontal gate electrode 192, and the active area 191 may be formed to be adjacent to a device isolation layer 195. The horizontal gate electrode 192 and the active area 191 may be connected to at least one peripheral contact 175.

The peripheral contact 175 may pass through an interlayer insulating layer 170 to extend in a direction perpendicular to the upper surface of the substrate 101. The interlayer insulating layer 170 through which the peripheral contact 175 passes may be formed over the cell region C and the peripheral circuit region P. Furthermore, the interlayer insulating layer 170 may include an insulating material, such as silicon oxide or silicon nitride. The peripheral contact 175 may be connected to a contact metal layer 183 on the interlayer insulating layer 170. The contact metal layer 183 may be connected to an interconnection line M0 formed in upper insulating layers 171 and 172 via an interconnection contact C0.

The contact metal layer 183 may be disposed on the same level as the second layer 152 belonging to the common source line 150. In other words, an upper surface of the contact metal layer 183 may be coplanar with an upper surface of the second layer 152, and the contact metal layer 183 and the second layer 152 may have substantially the same thickness. This is because the contact metal layer 183 and the second layer 152 are formed in the same manufacturing process, and will be discussed further below.

As discussed above, the cell region C may include the plurality of channel areas CH, the plurality of gate electrode layers 130, the source area 103, the common source line 150 disposed on the source area 103, and the isolation insulating layer 155. The isolation insulating layer 155 may divide the gate electrode layer 138 provided as a gate electrode of the string select transistor SST into a plurality of parts.

Each of the plurality of channel areas CH may include the channel layer 110, the filling insulating layer 115, the epitaxial layer 111, and the drain area 113, and the drain area 113 may be connected to at least one of the plurality of interconnection lines M0 via the stud S. Each of the plurality of interconnection lines M0 formed in the cell region C may be electrically connected to the bit line disposed thereon. Each of the plurality of interconnection lines M0 may be connected to a different bit line. Meanwhile, unlike the plurality of channel areas CH, the plurality of dummy channel areas DCH may not be connected to the stud S.

The interlayer insulating layer 170 may be disposed on the gate structure including the plurality of gate electrode layers 130 and the plurality of insulating layers 140. As discussed above, the interlayer insulating layer 170 may be disposed over the cell region C and the peripheral circuit region P. The upper insulating layers 171 and 172 may be disposed on the interlayer insulating layer 170. The upper insulating layers 171 and 172 may include a first upper insulating layer 171 and a second upper insulating layer 172. A thickness of the first upper insulating layer 171 may be substantially the same as the thicknesses of the contact metal layer 183 and the second layer 152 of the common source line 150. This may be a characteristic that appears due to the manufacturing process.

FIG. 6 is an enlarged view illustrating the region A1 of the memory device illustrated in FIG. 5, and FIG. 7 is an enlarged view illustrating the region A2 of the memory device illustrated in FIG. 5. Referring first to FIG. 6, the region A1 of FIG. 5 may include the first and second upper insulating layers 171 and 172, the interlayer insulating layer 170, the side spacers 109, and the common source line 150. The common source line 150 may include the first layer 151 and the second layer 152. The side spacers 109 included in the common source line 150 may be disposed on outer side surfaces of the first layer 151 to reduce the likelihood that the common source line 150 contacts the gate electrode layers 130. The first layer 151 may be formed of polysilicon doped with n-type impurities, and a concentration of n-type impurities in the first layer 151 may be higher than that in the source area 103.

The common source line 150 according to the example embodiments of the present inventive concept may have a relatively higher resistance value, compared to a common source line formed only of a metal. Therefore, according to the example embodiments of the present inventive concept, the common source line 150 may include the second layer 152 formed of a different material from the first layer 151 in order to reduce the influence by a high resistance value of the common source line 150. The second layer 152 may be formed of a material having a higher conductivity than the first layer 151. The second layer 152 may extend in the first direction like the first layer 151, and may be longer than the first layer 151 in the first direction.

The second layer 152 of the common source line 150 may include a barrier layer 152a and a metal layer 152b. The barrier layer 152a may be formed of Ti, TiN, or the like, and the metal layer 152b may be formed of tungsten (W). In some example embodiments, the second layer 152 may be formed by a damascene process.

Referring now to FIG. 7, the region A2 of FIG. 5 may include the gate electrode layer 133, the insulating layers 143 and 144, the gate insulating layer 160, and the filling insulating layer 115 and channel layer 110 included in the channel area CH. The channel layer 110 may have an annular shape, and the filling insulating layer 115 may be disposed thereinside. The gate insulating layers 160 may have a structure in which the tunneling layer 162, the charge storage layer 164, and the blocking layer 166 are sequentially stacked between the gate electrode layer 133 and the channel layer 110.

Relative thicknesses of the layers forming the gate insulating layers 160 are not limited to those illustrated in FIG. 7, and may be variously modified. Furthermore, the blocking layer 166 may have a shape surrounding the gate electrode layer 133, and the charge storage layer 164 and the tunneling layer 162 may be disposed on an outer circumferential surface of the channel layer 110. However, it will be understood that embodiments of the present inventive concept is not limited thereto.

The blocking layer 166 may include silicon oxide ($SiO_2$), silicon nitride ($Si_3N_4$), silicon oxynitride (SiON), or a high-k dielectric material. In these embodiments, the high-k dielectric material may be one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$). In FIG. 7, the blocking layer 166 is illustrated as including a single layer, but may include a high-k dielectric layer and a low-k dielectric layer having different dielectric constants. In these embodiments, the low-k dielectric layer may be disposed to be in contact with the charge storage layer 164. The high-k dielectric layer may be formed of a material having a higher dielectric constant than the tunneling layer 162, and the low-k dielectric layer may be formed of a material having a lower dielectric constant than the high-k dielectric layer. Since the low-k dielectric layer is disposed on a side surface of the high-k dielectric layer, an energy band such as a barrier height may be controlled and thereby characteristics of a non-volatile memory device, such as erase characteristics, may be improved.

The charge storage layer 164 may be a charge trapping layer or a floating gate conductive layer. When the charge storage layer 164 is the floating gate conductive layer, it may be formed by depositing polysilicon using a low pressure chemical vapor deposition (LPCVD) method. When the charge storage layer 164 is a charge trapping layer, it may include at least one of silicon oxide ($SiO_2$), silicon nitride ($Si_3N_4$), silicon oxynitride (SiON), hafnium oxide ($HfO_2$), zirconium oxide ($ZrO_2$), tantalum oxide ($Ta_2O_3$), titanium oxide ($TiO_2$), hafnium aluminum oxide ($HfAl_xO_y$), hafnium tantalum oxide ($HfTa_xO_y$), hafnium silicon oxide ($HfSi_xO_y$), aluminum nitride ($Al_xN_y$), and aluminum gallium nitride ($AlGa_xN_y$).

The tunneling layer 162 may include at least one of silicon oxide ($SiO_2$), silicon nitride ($Si_3N_4$), silicon oxynitride (SiON), hafnium oxide ($HfO_2$), hafnium silicon oxide ($HfSi_xO_y$), aluminum oxide ($Al_2O_3$), and zirconium oxide ($ZrO_2$).

Hereinafter, a memory device 200 according to some example embodiments of the present inventive concept will be described with reference to FIGS. 8A to 8D and FIG. 9. FIGS. 8A to 8D are perspective views illustrating portions of memory devices according to example embodiments of the present inventive concept, and FIG. 9 is a cross-section illustrating a portion of the memory device according to the example embodiments illustrated in FIG. 8A.

Figure 8A:
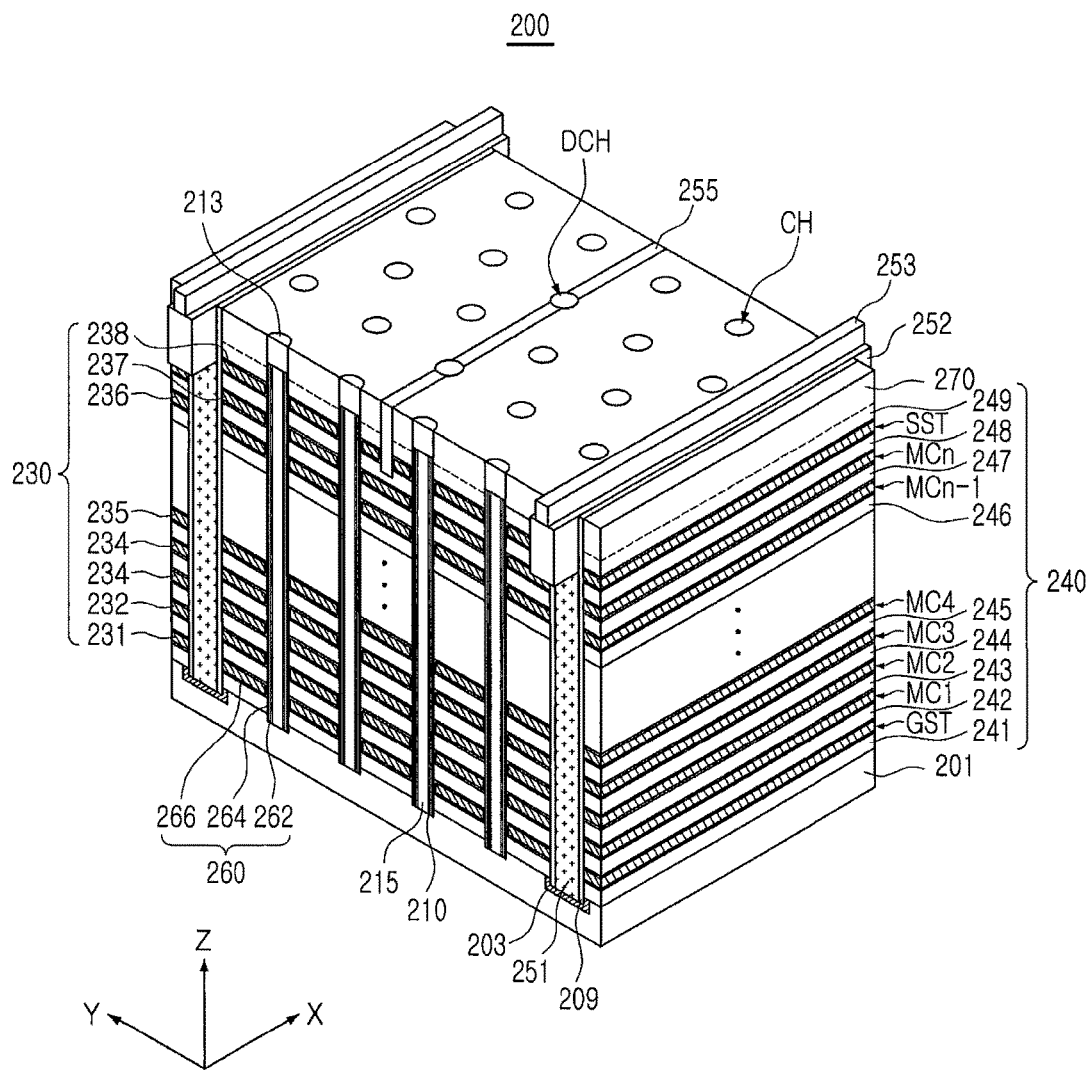
FIGS. 8A to 8D are perspective views illustrating portions of memory devices according to some embodiments of the present inventive concept.
Figure 9:
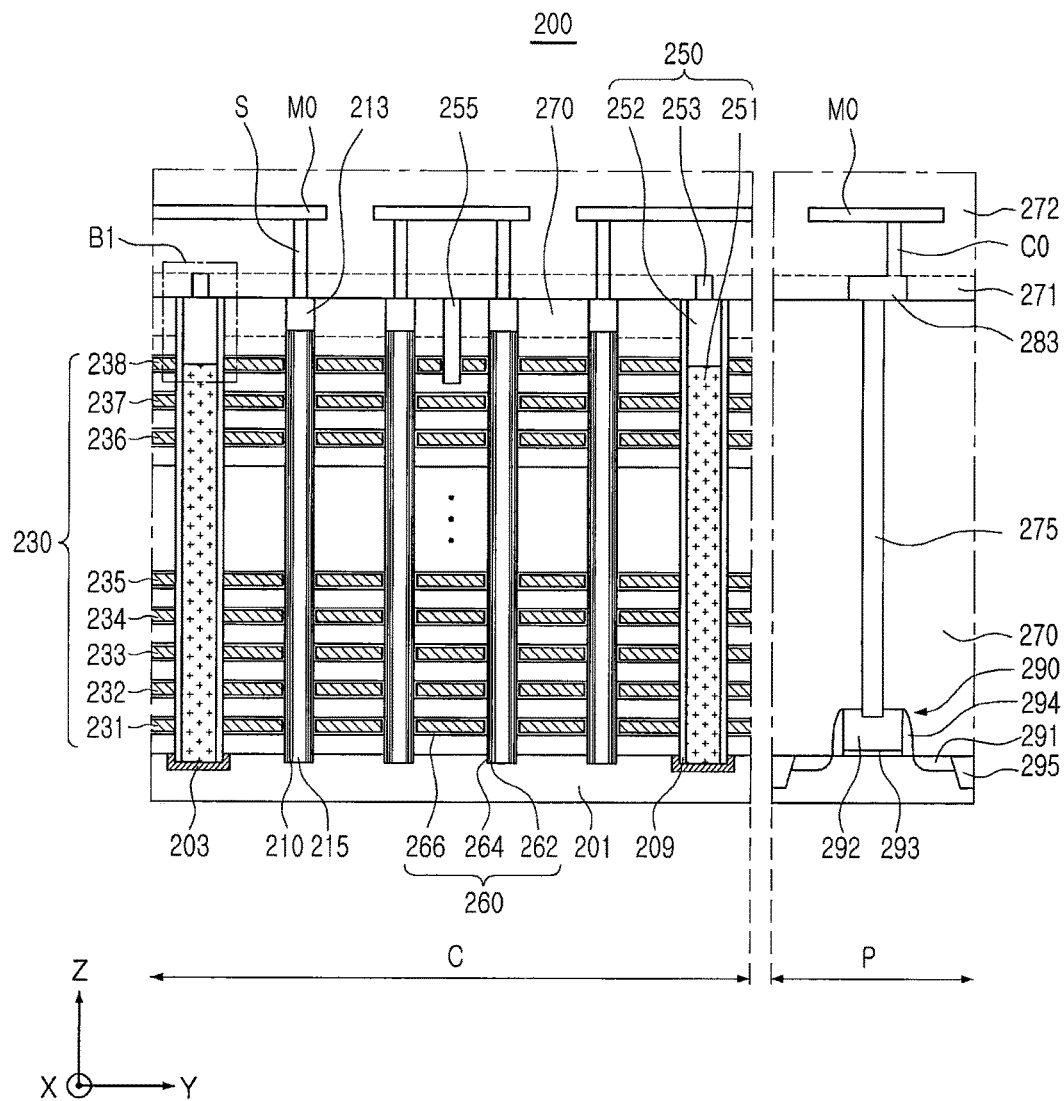
FIG. 9 is a cross-section illustrating a portion of the memory device according to some embodiments illustrated in FIG. 8A.

Referring to FIGS. 8A and 9, the memory device 200 according to the example embodiments of the present inventive concept may include a substrate 201, a plurality of gate electrode layers 231 to 238 (generally denoted 230) and insulating layers 241 to 249 (generally denoted 240) alternately stacked on the substrate 201, and a plurality of channel areas CH and dummy channel areas DCH passing through the plurality of gate electrode layers 230 to extend in a direction perpendicular to the substrate 201. Each of the plurality of channel areas CH may include a channel layer 210, a filling insulating layer 215, and a drain area 213. Unlike the memory device 100 described in the previous example embodiments, an epitaxial layer may not be formed in each of the channel areas CH in the example embodiments illustrated in FIGS. 8A and 9.

A gate insulating layer 260 may be disposed between the plurality of gate electrode layers 230 and channel layers 210. The gate insulating layer 260 may include a tunneling layer 262, a charge storage layer 264, and a blocking layer 266, sequentially stacked on the gate electrode layers 230. In the example embodiments illustrated in FIGS. 8A and 9, the blocking layer 266 is illustrated as surrounding the gate electrode layers 230, and the charge storage layer 264 and the tunneling layer 262 are illustrated as surrounding the channel layer 210. However, it will be understood that embodiments of the present inventive concept is not limited thereto.

The plurality of gate electrode layers 230 may be divided into a plurality of parts by a common source line 250 and side spacers 209 extending in the direction perpendicular to the substrate 201 (the z-axis direction) and the first direction (the x-axis direction). The common source line 250 may include a plurality of layers 251, 252, and 253, formed of different materials. At least a portion of the plurality of layers 251, 252, and 253 included in the common source line 250 may be formed of polysilicon including impurities having the same conductivity type as the source area 203. In some example embodiments, a first layer 251 of the common source line 250 and the source area 203 may include n-type impurities. Furthermore, the concentration of the n-type impurities in the first layer 251 may be higher than that in the source area 203.

The first layer 251 formed of polysilicon including n-type impurities may have a smaller height in the z-axis direction than the side spacers 209 disposed on the side surfaces thereof. Referring to FIGS. 8A and 9, a second layer 252 and a third layer 253 may be disposed on an upper surface of the first layer 251, and the second layer 252 may be disposed between the side spacers 209. The second layer 252 and the third layer 253 may be formed of a different material from the first layer 251, such as a metal or a metal silicide. An upper surface of the second layer 252 may be disposed on the same level as an upper surface of an interlayer insulating layer 270 and upper surfaces of the side spacers 209, and may be coplanar therewith.

The third layer 253 may be disposed on the second layer 252. The second layer 252 and the third layer 253 may extend in the first direction (the x-axis direction) like the first layer 251. In some example embodiments, the second layer 252 and the third layer 253 may extend longer than the first layer 251 in the first direction. Since the second layer 252 and the third layer 253 are formed to be longer than the first layer 251, a large resistance component of the first layer 251 formed of polysilicon including n-type impurities may be compensated.

Each of the second layer 252 and the third layer 253 may include a plurality of layers formed of Ti, TiN, W, or the like, and may be formed by a damascene process. A method of forming the second layer 252 and the third layer 253 will be discussed further herein.

Referring to FIG. 9, the memory device 200 may include a cell region C and a peripheral circuit region P. The cell region C may be a region in which memory cells MC1 to MCn provided by the plurality of gate electrode layers 230, the gate insulating layer 260, the channel layer 210, and the like, are disposed. Meanwhile, the peripheral circuit region P may be a region in which peripheral circuit devices 290 configured to drive the memory device 200 are disposed. The interlayer insulating layer 270 formed over the cell region C and the peripheral circuit region P may be disposed on the peripheral circuit devices 290 and the plurality of gate electrode layers 230.

The peripheral circuit device 290 may be connected to a peripheral contact 275 passing through the interlayer insulating layer 270, and the peripheral contact 275 may be connected to a contact metal layer 283. The contact metal layer 283 may be connected to an interconnection line M0 disposed in upper insulating layers 271 and 272 via an interconnection contact C0.

The contact metal layer 283 may have the same thickness as the third layer 253 disposed on the second layer 252 of the common source line 250. Accordingly, an upper surface of the contact metal layer 283 may be coplanar with an upper surface of the third layer 253. In addition, an upper surface of the first upper insulating layers 271 may be coplanar with the upper surface of third layer 253. This is because the contact metal layer 283 and the third layer 253 are formed in the same process, which will be discussed further below.

Each of the plurality of channel areas CH may include the channel layer 210, the filling insulating layer 215, and the drain area 213, and the drain area 213 may be connected to at least one of the plurality of interconnection lines M0 via a stud S. Each of the plurality of interconnection lines M0 formed in the cell region C may be electrically connected to a bit line formed thereon. Each of the plurality of interconnection lines M0 may be connected to a different bit line. Meanwhile, unlike the plurality of channel areas CH, the plurality of dummy channel areas DCH may not be connected to the stud S.

Figure 8B:
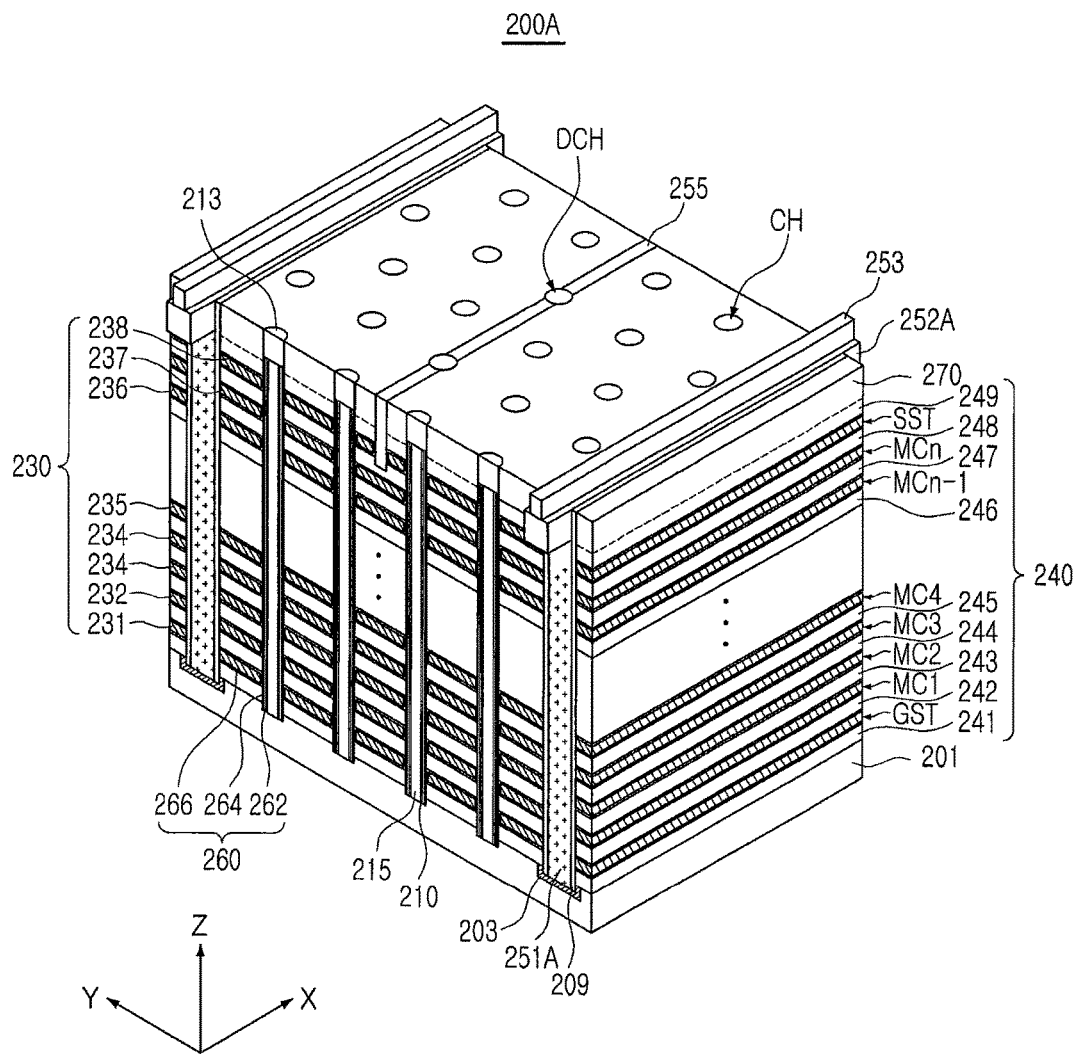
Figure 8C:
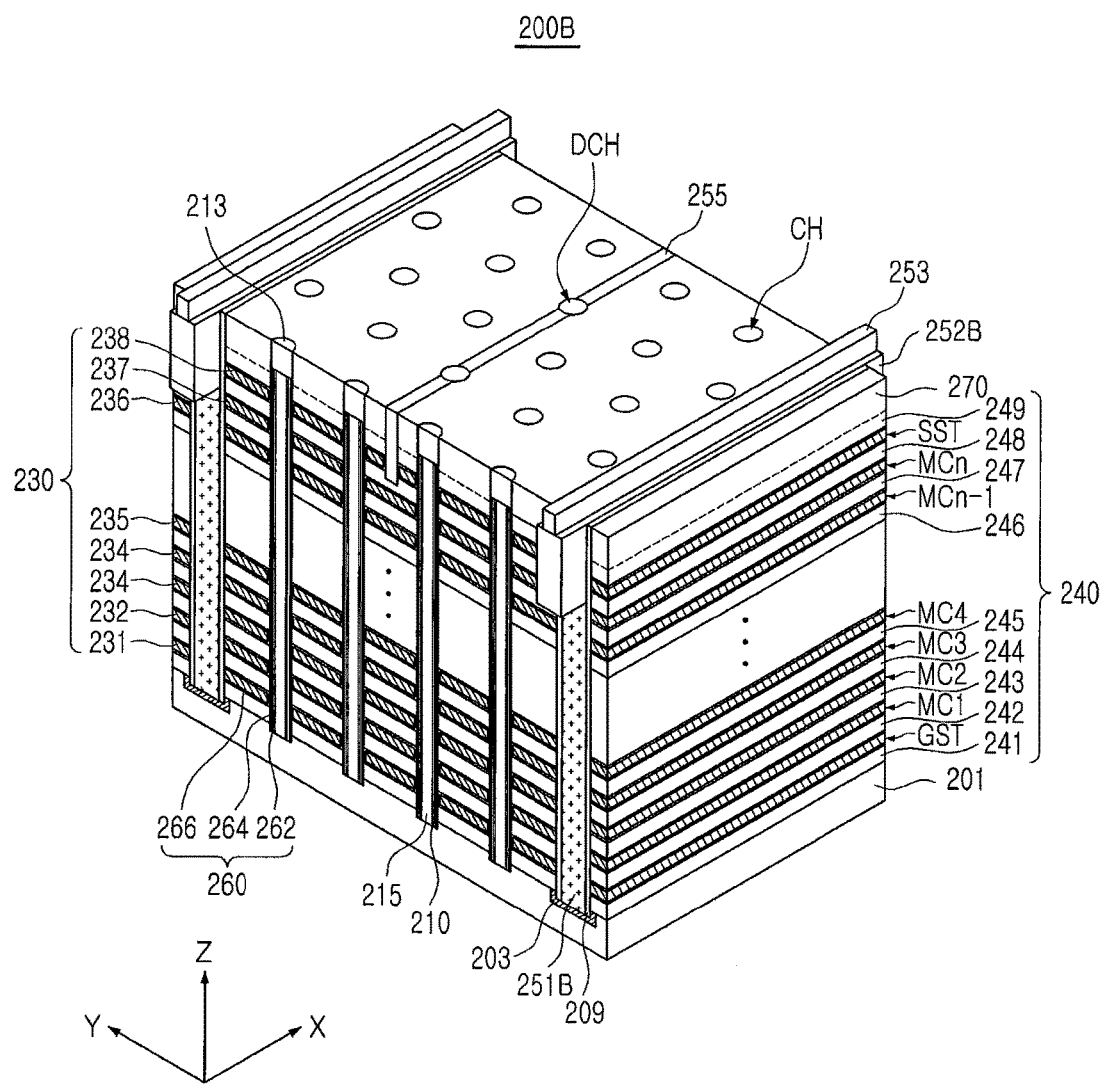
Figure 8D:
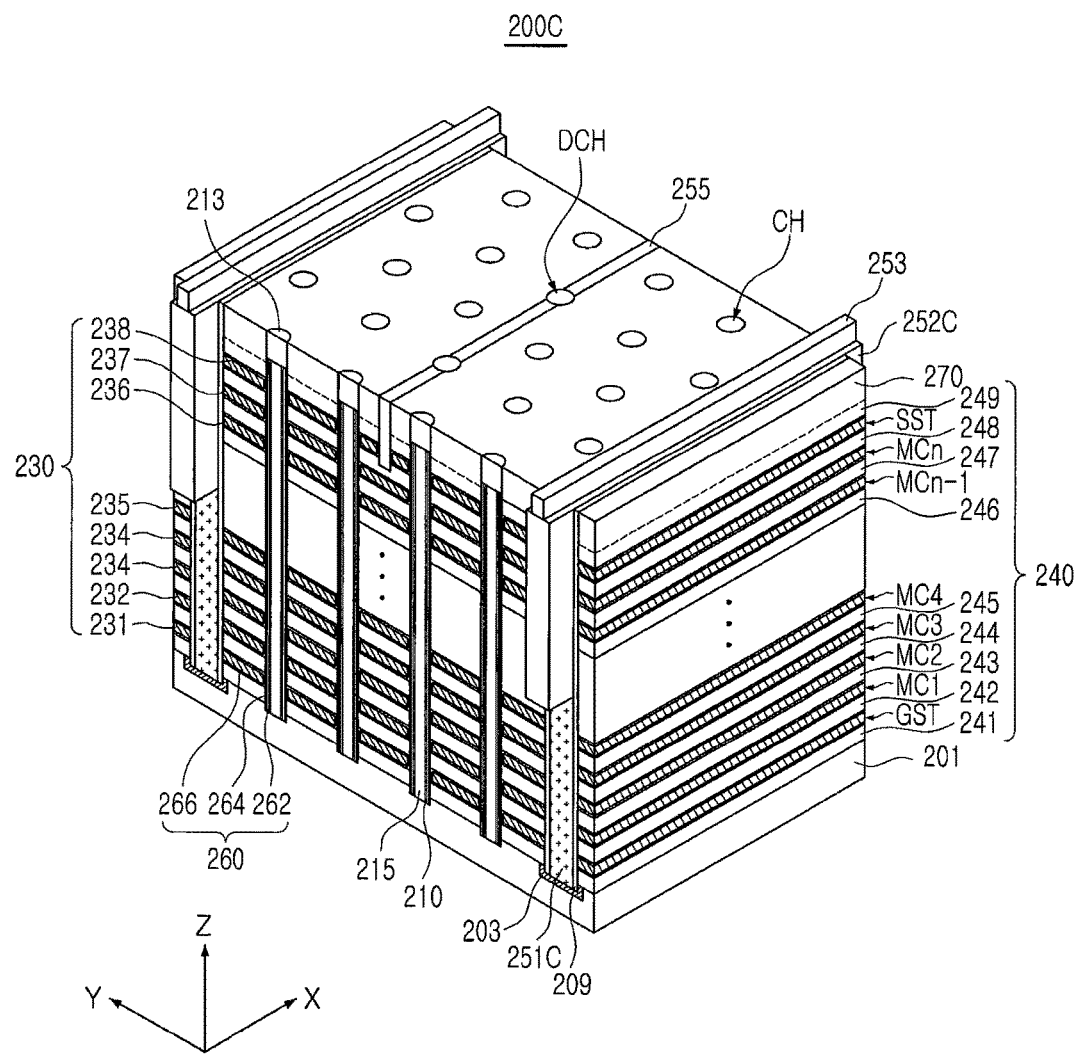

Referring to FIGS. 8B to 8D, memory devices 200A, 200B, and 200C according to different example embodiments of the present inventive concept are described. In the memory devices 200A, 200B, and 200C according to the example embodiments illustrated in FIGS. 8B to 8D, descriptions of components similar to or the same as those in the memory device 200 according to the example embodiments illustrated in FIG. 8A may be omitted in the interest of brevity.

Referring to FIG. 8B, the memory device 200A may include a common source line including first to third layers 251A, 252A, and 253. At least one of the first to third layers 251A, 252A, and 253 may be formed of a different material. In some example embodiments, the first layer 251A may be formed of polysilicon doped with n-type impurities, and the second layer 252A and the third layer 253 may be formed of a metal, a metal silicide, or a metal compound.

In the example embodiments illustrated in FIG. 8B, the second layer 252A may be thinner than the second layer 252 in the example embodiments illustrated in FIG. 8A. In other words, a lower surface of the second layer 252A may be disposed higher than an upper surface of the uppermost gate electrode layer 283 in the z-axis direction.

Referring to FIG. 8C, a common source line of the memory device 200B may include first to third layers 251B, 252B, and 253. In the example embodiments illustrated in FIG. 8C, a thickness of the second layer 252B may be greater than the thicknesses of the second layers 252 and 252A in the example embodiments illustrated in FIGS. 8A and 8B. A lower surface of the second layer 252B may be disposed lower than a lower surface of the uppermost gate electrode layer 283 in the z-axis direction.

Referring to FIG. 8D, a common source line of the memory device 200C may include first to third layers 251C, 252C, and 253. In the example embodiments illustrated in FIG. 8D, a lower surface of a second layer 252C may be disposed in a middle area of a gate structure formed of a plurality of gate electrode layers 230 and insulating layers 240. In other words, the second layer 252C may have a greater thickness than the second layers 252, 252A, 252B according to the example embodiments illustrated in FIGS. 8A to 8C. Accordingly, a thickness of the first layer 251C formed of polysilicon including n-type impurities may be decreased, and influence of a high resistance component of polysilicon may be effectively compensated.

Figure 10:
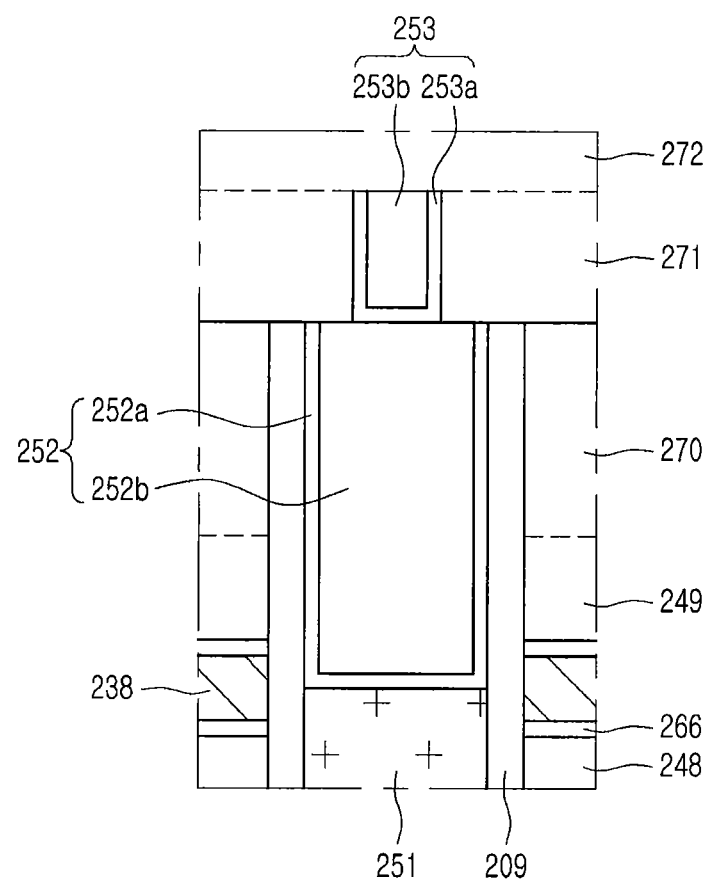
FIG. 10 is an enlarged view illustrating region B1 of the memory device illustrated in FIG. 9.

FIG. 10 is an enlarged view illustrating the region B1 of the memory device illustrated in FIG. 9. As illustrated in FIG. 10, the region B1 in FIG. 9 may include the first and second upper insulating layers 271 and 272, the interlayer insulating layer 270, the side spacers 209, and the first to third layers 251, 252, and 253 belonging to the common source line 250. The side spacers 209 may be disposed on outer side surfaces of the first layer 251 and the second layer 252 to reduce the likelihood that the common source line 250 contacts the gate electrode layers 230. At least a portion of the first to third layers 251, 252, and 253 may be formed of polysilicon doped with n-type impurities, and the concentration of n-type impurities in the polysilicon may be higher than that in the source area 203.

The common source line 250 according to the example embodiments of the present inventive concept may have a relatively higher resistance value, compared to a common source line formed only of a metal. Therefore, according to the example embodiments of the present inventive concept, the common source line 250 may include the second and third layers 252 and 253 including metals on the first layer 251 in order to reduce the influence of the resistance of the polysilicon included in the first layer 251 of the common source line 250. Each of the second and third layers 252 and 253 may extend in the first direction like the first layer 251, and may be longer than the first layer 251 in the first direction.

Each of the second and third layers 252 and 253 may include a plurality of layers. In some example embodiments, the second layer 252 may include a barrier layer 252a and a metal layer 252b disposed on the barrier layer 252a. The third layer 253 may also include a barrier layer 253a and a metal layer 253b disposed on the barrier layer 253a. The barrier layers 252a and 253a may be formed of Ti/TiN, and the metal layers 252b and 253b may be formed of tungsten (W). Thicknesses of the second layer 252 and the third layer 253 may be variously modified.

Figure 11:
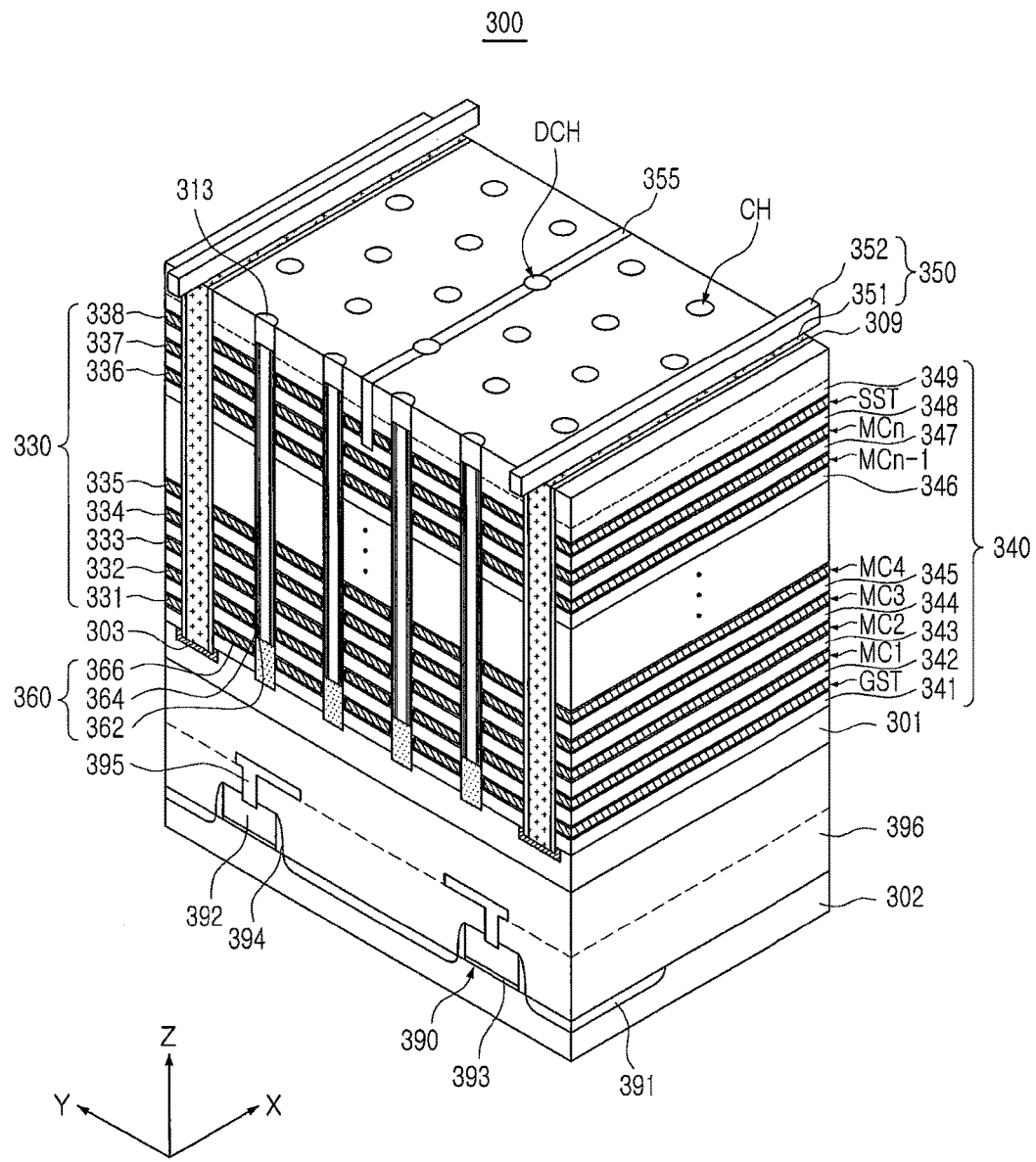
FIG. 11 is a perspective view illustrating a portion of a memory device according to some embodiments of the present inventive concept.
Figure 12:
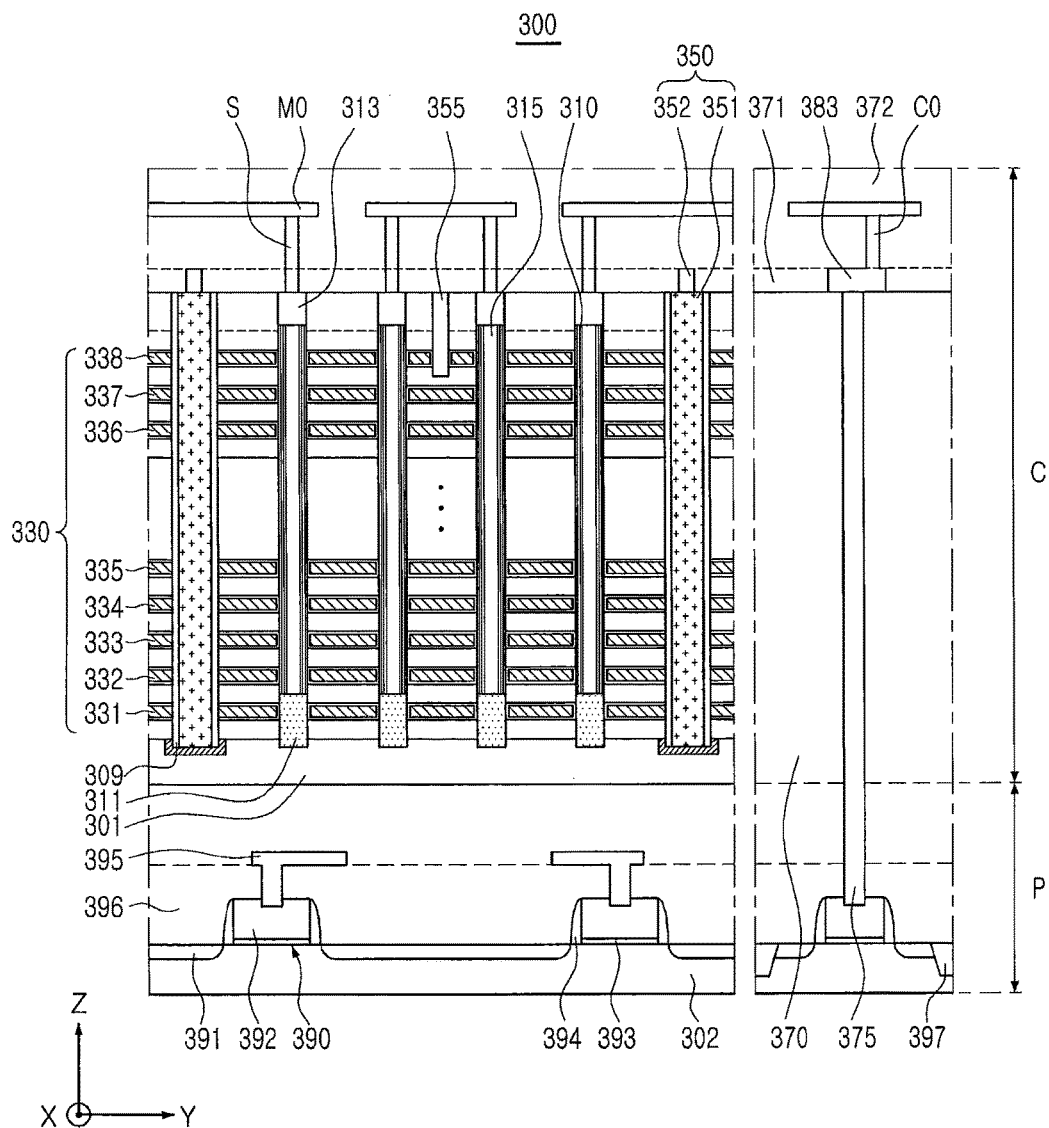
FIG. 12 is a cross-section illustrating a portion of the memory device according to the some embodiments illustrated in FIG. 11.

FIG. 11 is a perspective view illustrating a portion of a memory device according to some example embodiments of the present inventive concept, and FIG. 12 is a cross-section illustrating a portion of the memory device according to the example embodiments illustrated in FIG. 11. As illustrated in FIGS. 11 and 12, a memory device 300 according to some example embodiments of the present inventive concept may have a cell-on-peripheral (COP) structure in which a cell region C is disposed on a peripheral circuit region P. Meanwhile, in other embodiments of the present inventive concept, the memory device 300 may be implemented to have a peripheral on cell (POC) structure in which the peripheral circuit region P is disposed on the cell region C.

The memory device 300 may include a first substrate 301 and a second substrate 302. The first substrate 301 may be included in the cell region C, and the second substrate 302 may be included in the peripheral circuit region P. A plurality of peripheral circuit devices 390 and a second interlayer insulating layer 396 may be formed on the second substrate 302. The plurality of peripheral circuit devices 390 may include active areas 391, horizontal gate electrodes 392, horizontal gate insulating layers 393, and horizontal spacers 394. A device isolation layer 397 may be disposed between the plurality of peripheral circuit devices 390.

The plurality of peripheral circuit devices 390 may be connected to a peripheral interconnection line 395, and the peripheral interconnection line 395 may be embedded in the second interlayer insulating layer 396. The second interlayer insulating layer 396 may be formed of an insulating material, such as silicon oxide or silicon nitride. The first substrate 301 may be disposed on the second interlayer insulating layer 396, and the first substrate 301 may have a different crystalline structure from the second substrate 302.

The cell region C may include a plurality of gate electrode layers 331 to 338 (generally denoted 330) and insulating layers 341 to 349 (generally denoted 340) alternately stacked on the first substrate 301, and a plurality of channel areas CH and dummy channel areas DCH extending perpendicularly to an upper surface of the first substrate 301. Configurations of the plurality of channel areas CH may be similar to those of the memory device 100 according to the above-described example embodiments.

A source area 303 including n-type impurities may be formed on the first substrate 301, and a common source line 350 and side spacers 309 may be formed on the source area 303. The common source line 350 and the side spacers 309 may extend in the first direction (the x-axis direction), and the plurality of gate electrode layers 330 may be divided into a plurality of parts by the common source line 350 and the side spacers 309.

A first layer 351 of the common source line 350 may be formed of not a metal but polysilicon doped with n-type impurities. In some example embodiments, a concentration of the n-type impurities in the first layer 351 may be higher than a concentration of the n-type impurities in the source area 303. In order to compensate for such a disadvantage of polysilicon having a higher resistance value than a metal, a second layer 352 may be formed on the first layer 351. The second layer 352 may include a metal, and may extend in the first direction while attached on an upper surface of the first layer 351. The second layer 352 may be longer than the first layer 351 in the first direction.

Figure 13:
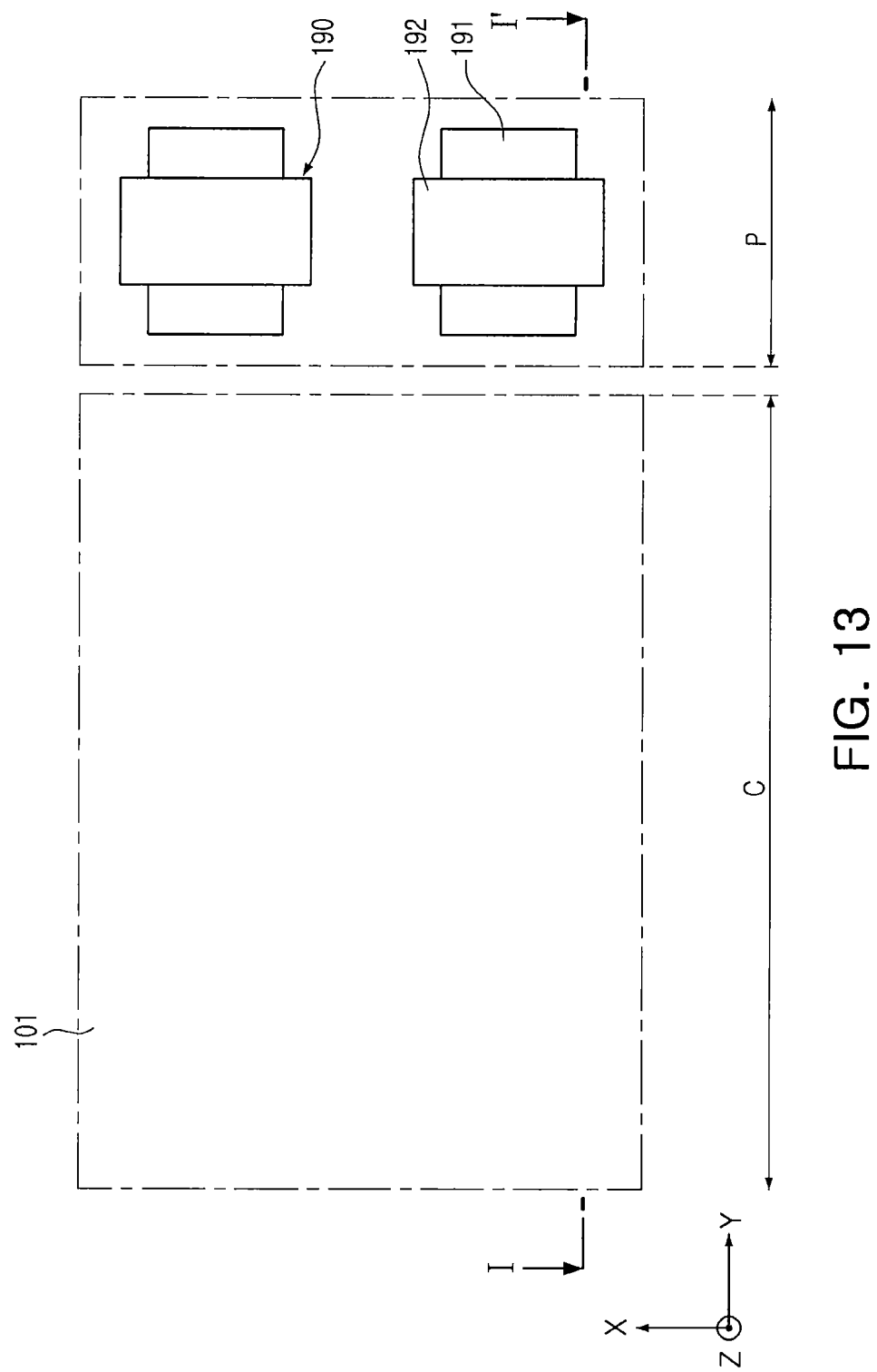
FIGS. 13 to 36 are views illustrating processing steps in the fabrication of the memory device described in FIGS. 3 to 7.
Figure 14:
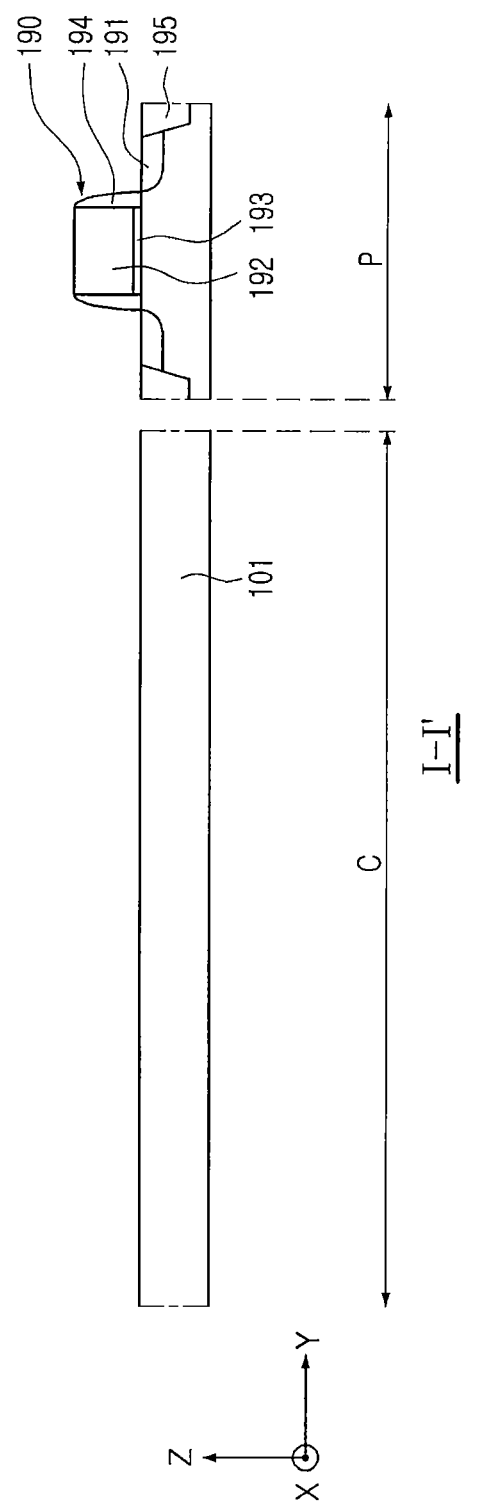

FIGS. 13 to 36 are views illustrating processing steps in the fabrication of the memory device illustrated in FIGS. 3 to 7. Referring first to FIGS. 13 and 14, FIG. 14 is a cross-section illustrating a region taken along the line I-I' in FIG. 13. A cell region C and a peripheral circuit region P may be defined in a substrate 101, and a plurality of peripheral circuit devices 190 may be formed in the peripheral circuit region P. The peripheral circuit devices 190 may include an active area 191 and a horizontal gate electrode 192, and a horizontal gate insulating layer 193 may be disposed on the horizontal gate electrode 192 and the substrate 101. A horizontal spacer 194 may be formed on a side surface of the horizontal gate electrode 192, and the active area 191 may be formed in a region other than a device isolation layer 195.

The substrate 101 may be a single crystalline silicon substrate, and may include at least one well region doped with first conductivity-type impurities. The plurality of peripheral circuit devices 190 may be formed on the well region, and the well region disposed in a lower portion of the cell region C may be a region doped with p-type impurities.

Figure 15:
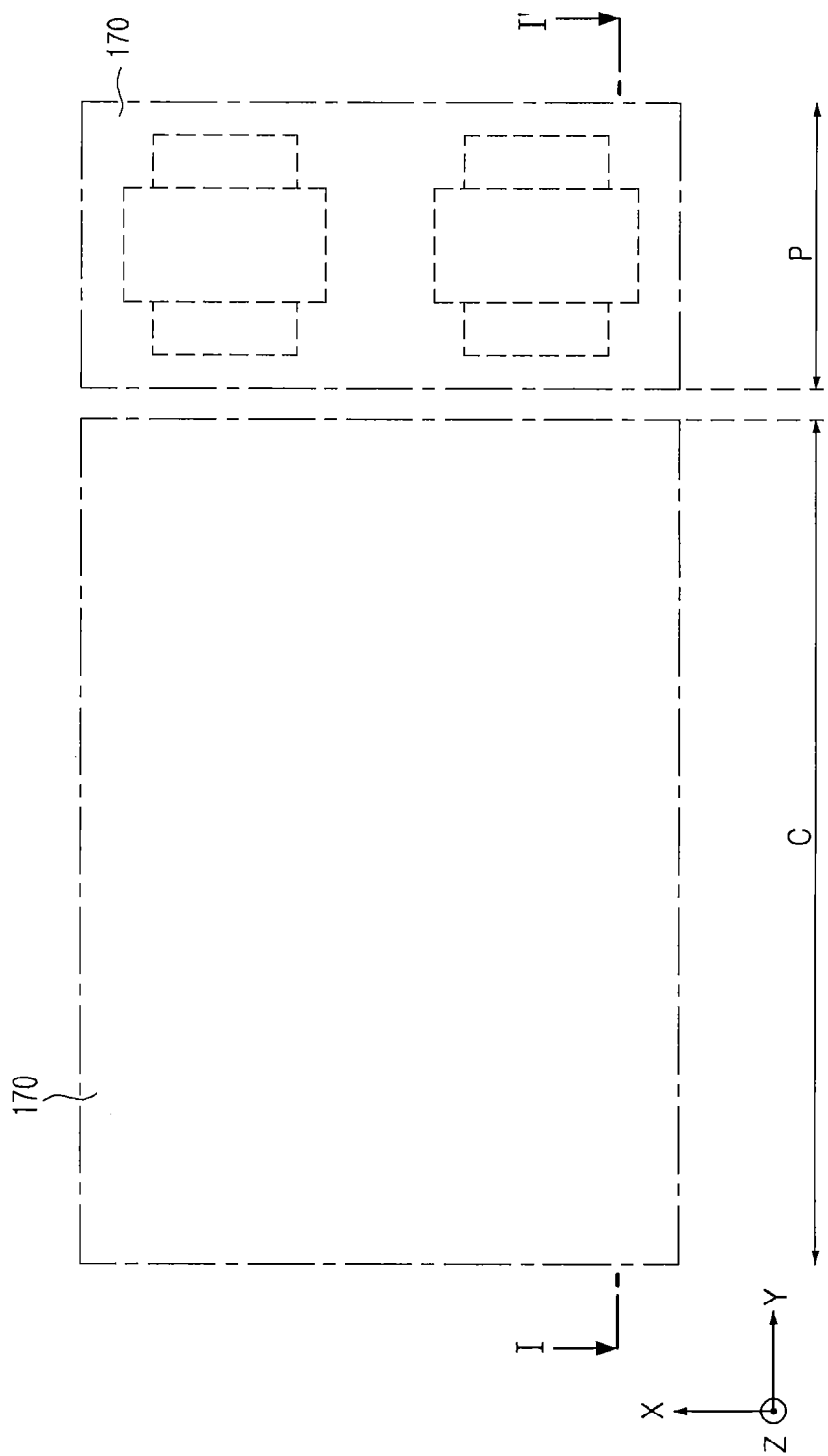
Figure 16:
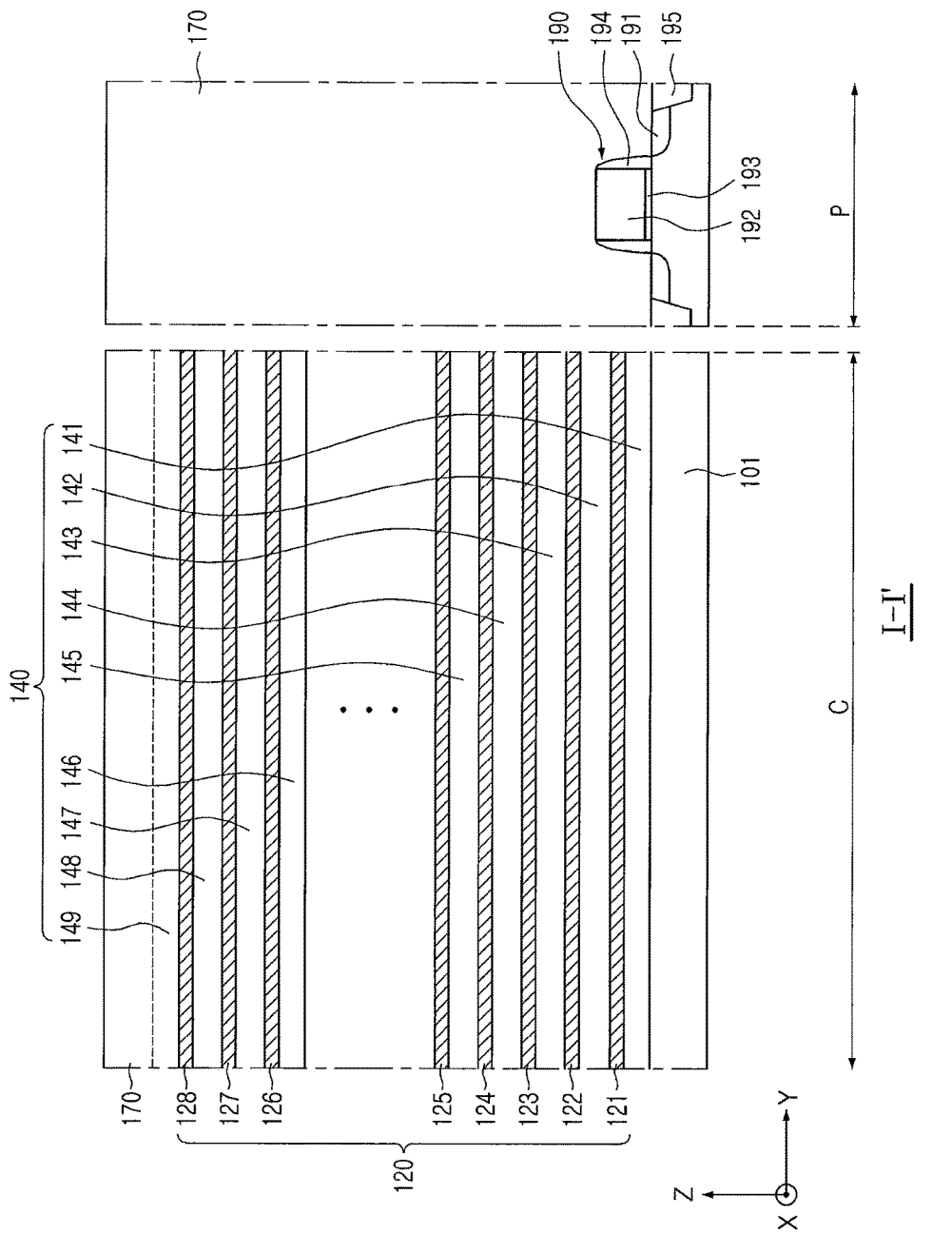

Referring to FIGS. 15 and 16, a plurality of sacrificial layers 121 to 128 (generally denoted 120), a plurality of insulating layers 141 to 149 (generally denoted 140), and an interlayer insulating layer 170 may be formed on the substrate 101. The plurality of sacrificial layers 120 and the insulating layers 140 may be formed over the cell region C and the peripheral circuit region P, and then removed from a region other than the cell region C. The interlayer insulating layer 170 may be formed in the peripheral circuit region P and the cell region C, and the plurality of sacrificial layers 120 and insulating layers 140 may be formed particularly in the cell region C.

The plurality of sacrificial layers 120 may include a material having a predetermined etch selectivity from the plurality of insulating layers 140. In some example embodiments, when the plurality of insulating layers 140 are formed of silicon oxide, the plurality of sacrificial layers 120 may be formed of silicon nitride. Accordingly, only the plurality of sacrificial layers 120 may be removed in a subsequent process while remaining the plurality of insulating layers 140. Numbers and thicknesses of the plurality of sacrificial layers 120 and insulating layers 140 may be variously modified in various example embodiments. In the example embodiments illustrated in FIG. 16, the plurality of sacrificial layers 120 and insulating layers 140 may have substantially the same thickness. However, it will be understood that embodiments of the present inventive concept are not limited thereto. Portions of the sacrificial layers 120 or the insulating layers 140 may have different thicknesses.

The interlayer insulating layer 170 may include an insulating material such as silicon oxide, high density plasma (HDP) oxide, or tetra-ethyl-ortho-silicate (TEOS) oxide. Depending on a manufacturing process thereof, the interlayer insulating layer 170 may be formed in different process steps. In some example embodiments, a lower portion of the interlayer insulating layer 170 directly covering the plurality of peripheral circuit devices 190 may be formed of HDP oxide having an excellent gap filling property, and an upper portion of the interlayer insulating layer 170 may be formed of TEOS oxide having a high deposition rate.

Figure 17:
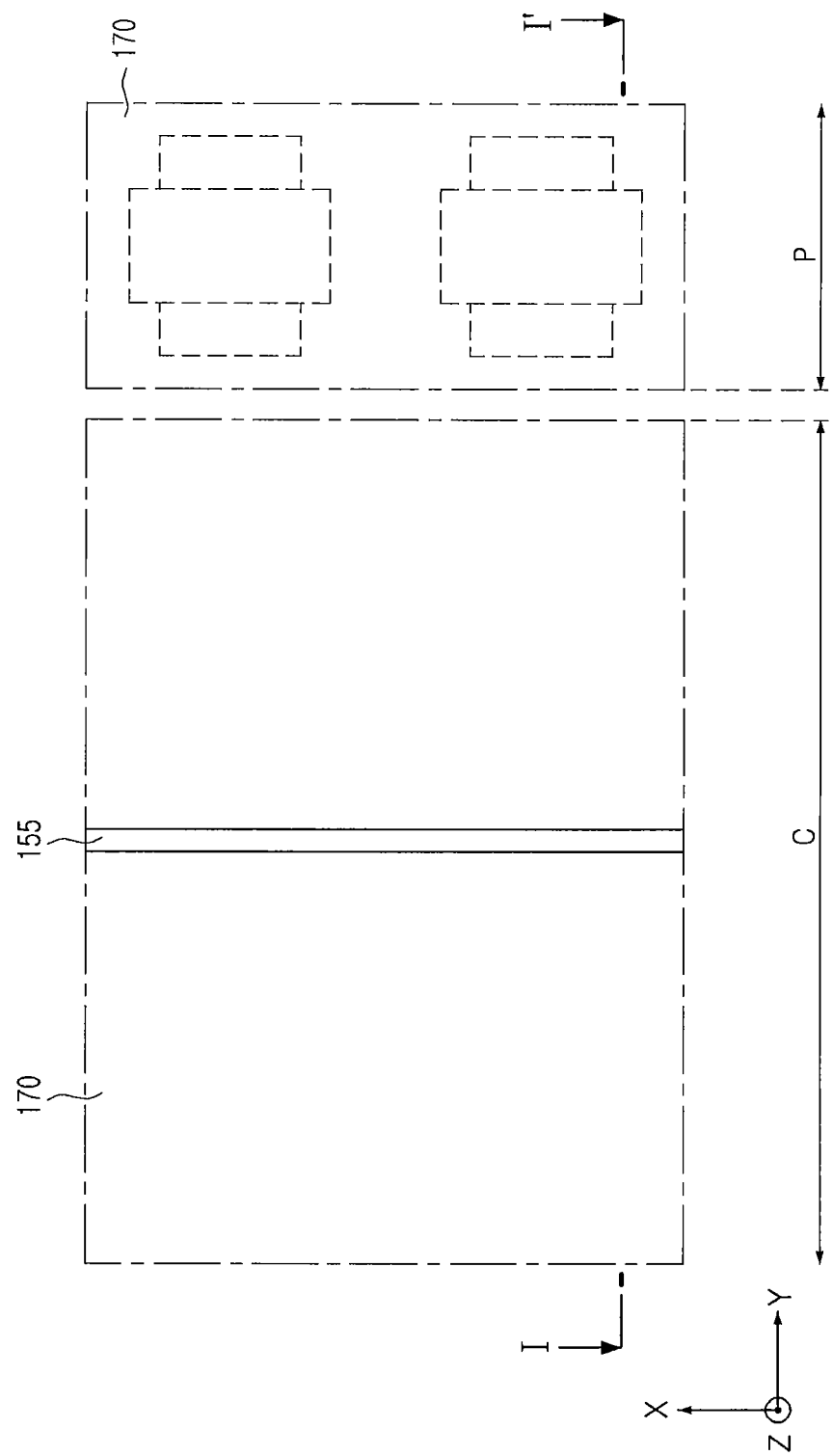
Figure 18:
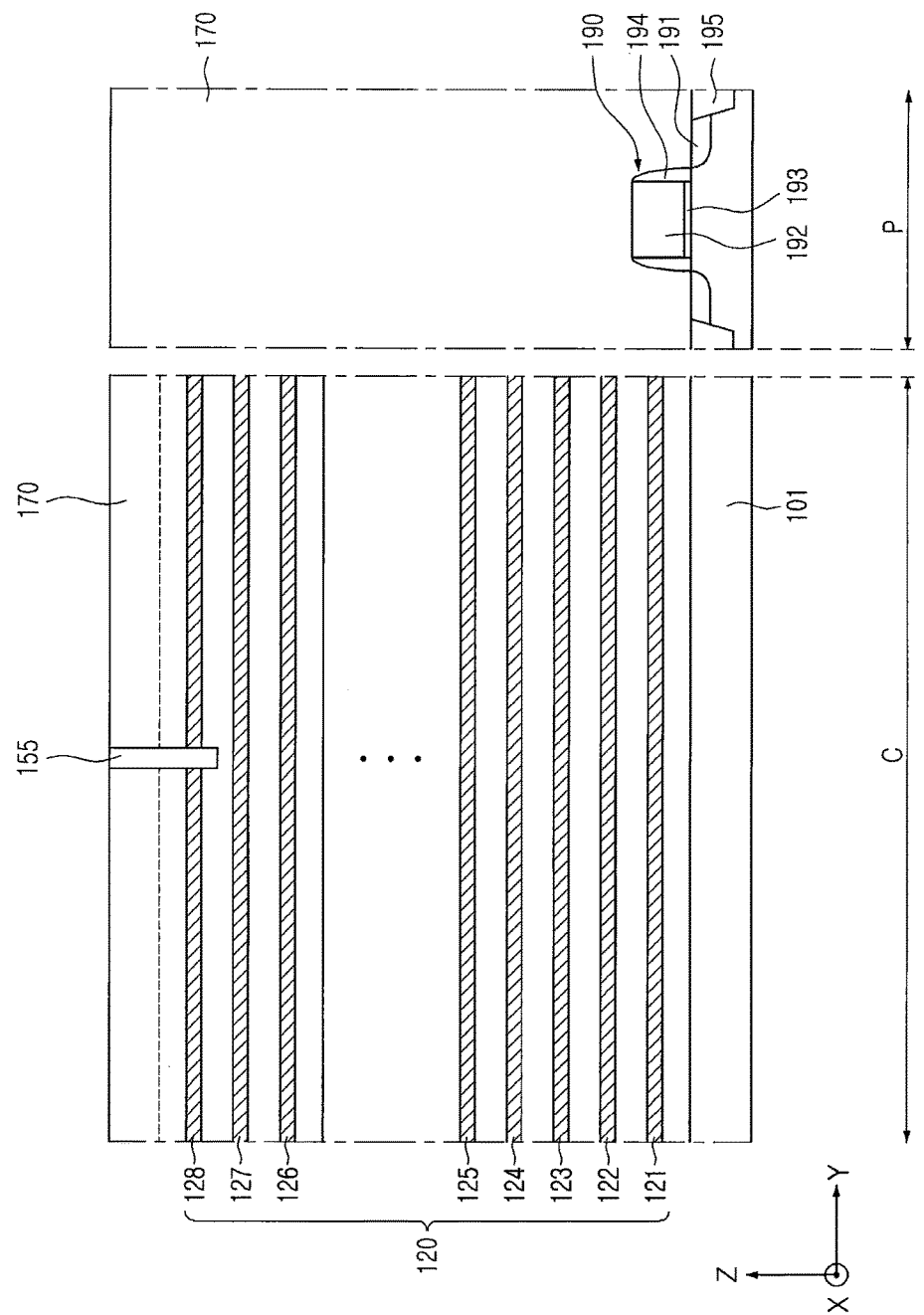

Referring to FIGS. 17 and 18, an isolation insulating layer 155 may be formed on an upper surface of the interlayer insulating layer 170. The isolation insulating layer 155 may include an insulating material such as silicon oxide, like the interlayer insulating layer 170 or the plurality of insulating layers 140. In some example embodiments, the isolation insulating layer 155 may include a material having a predetermined etch selectivity from the plurality of sacrificial layers 120.

The isolation insulating layer 155 may divide at least one of the sacrificial layers, for example, the sacrificial layer 128, into a plurality of parts. The sacrificial layer 128 divided by the isolation insulating layer 155 may be a layer to be replaced by gate electrode layers of string select transistors SST in a subsequent process.

Figure 19:
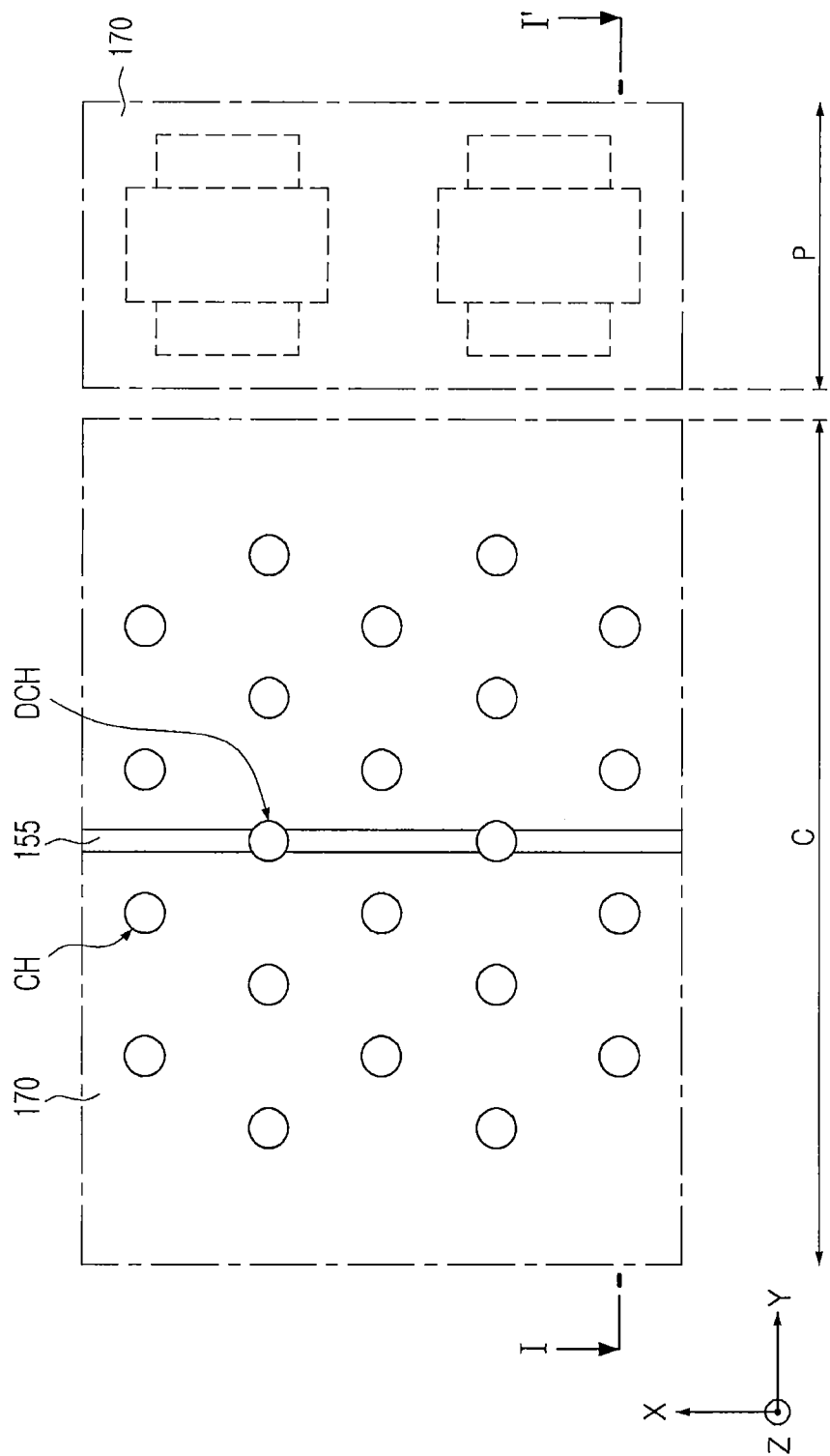
Figure 20:
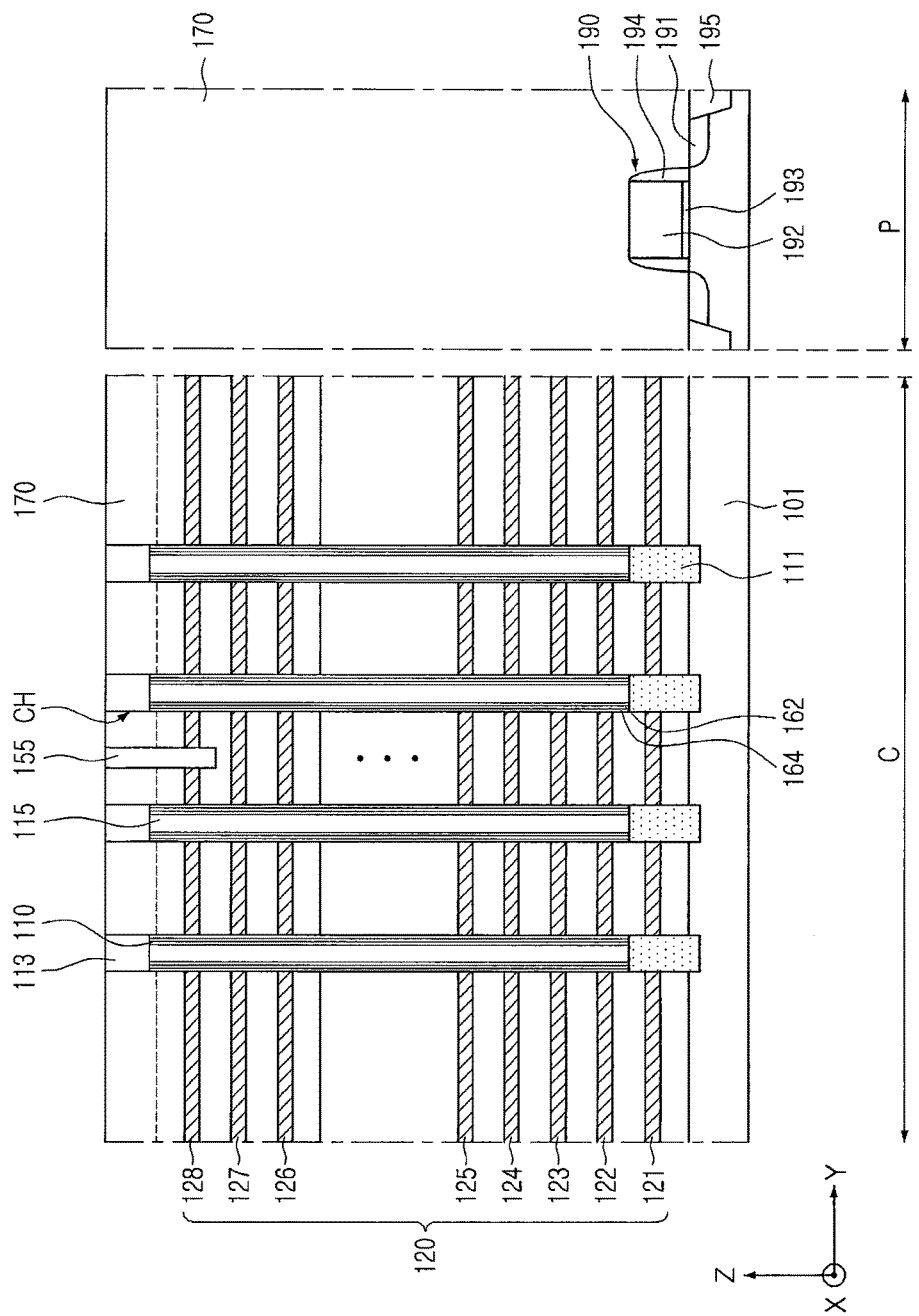

Referring now to FIGS. 19 and 20, a plurality of channel areas CH and a plurality of dummy channel areas DCH may be formed. The channel areas CH and the dummy channel areas DCH may pass through the plurality of sacrificial layers 120, the insulating layers 140, and the interlayer insulating layer 170. Referring to FIG. 19, the dummy channel areas DCH may be formed to pass through the isolation insulating layer 155, and may be disposed in a region in which the isolation insulating layer 155 is not formed. Numbers and locations of the dummy channel areas DCH and the channel areas CH are not limited to those illustrated in FIGS. 19 and 20, and may be variously modified.

Referring to FIG. 20, the channel areas CH may include a channel layer 110, a filling insulating layer 115, a drain area 113, and an epitaxial layer 111, and the dummy channel areas DCH may have a similar structure thereto. A tunneling layer 162 and a charge storage layer 164 may be disposed on outer side surfaces of the channel layer 110.

In order to form the dummy channel areas DCH and the channel areas CH, channel holes passing through the interlayer insulating layer 170, the plurality of sacrificial layers 120, and the insulating layers 140 may be formed first. The channel holes may recess the substrate 101 by a predetermined depth. Accordingly, a portion of the substrate 101 may be exposed on bottoms of the channel holes. The epitaxial layer 111 may be formed in a selective epitaxial growth (SEG) process using the portion of the substrate 101 exposed on the bottoms of the channel holes as a seed layer.

After the epitaxial layer 111 is formed, the charge storage layer 164 and the tunneling layer 162 may be formed in the channel holes using an atomic layer deposition (ALD) or chemical vapor deposition (CVD) process, and the channel layer 110 may be formed on an inner side of the tunneling layer 162. The channel layer 110 may have a thickness of about $\frac{1}{50}$ to $\frac{1}{5}$ a diameter of the channel holes. The channel layer 110 may be formed of polysilicon including a predetermined amount of impurities.

The channel layer 110 may have an annular shape having an empty inside, and the filling insulating layer 115 may be formed in the channel layer 110. Selectively, before the filling insulating layer 115 is formed, a hydrogen annealing process in which a structure including the channel layer 110 is heat-treated in a gas atmosphere including hydrogen or deuterium may be further executed. In the hydrogen annealing process, a significant amount of crystal defects existing in the channel layer 110 may be cured. The drain area 113 may be formed of a conductive material such as polysilicon on the channel layer 110.

Figure 21:
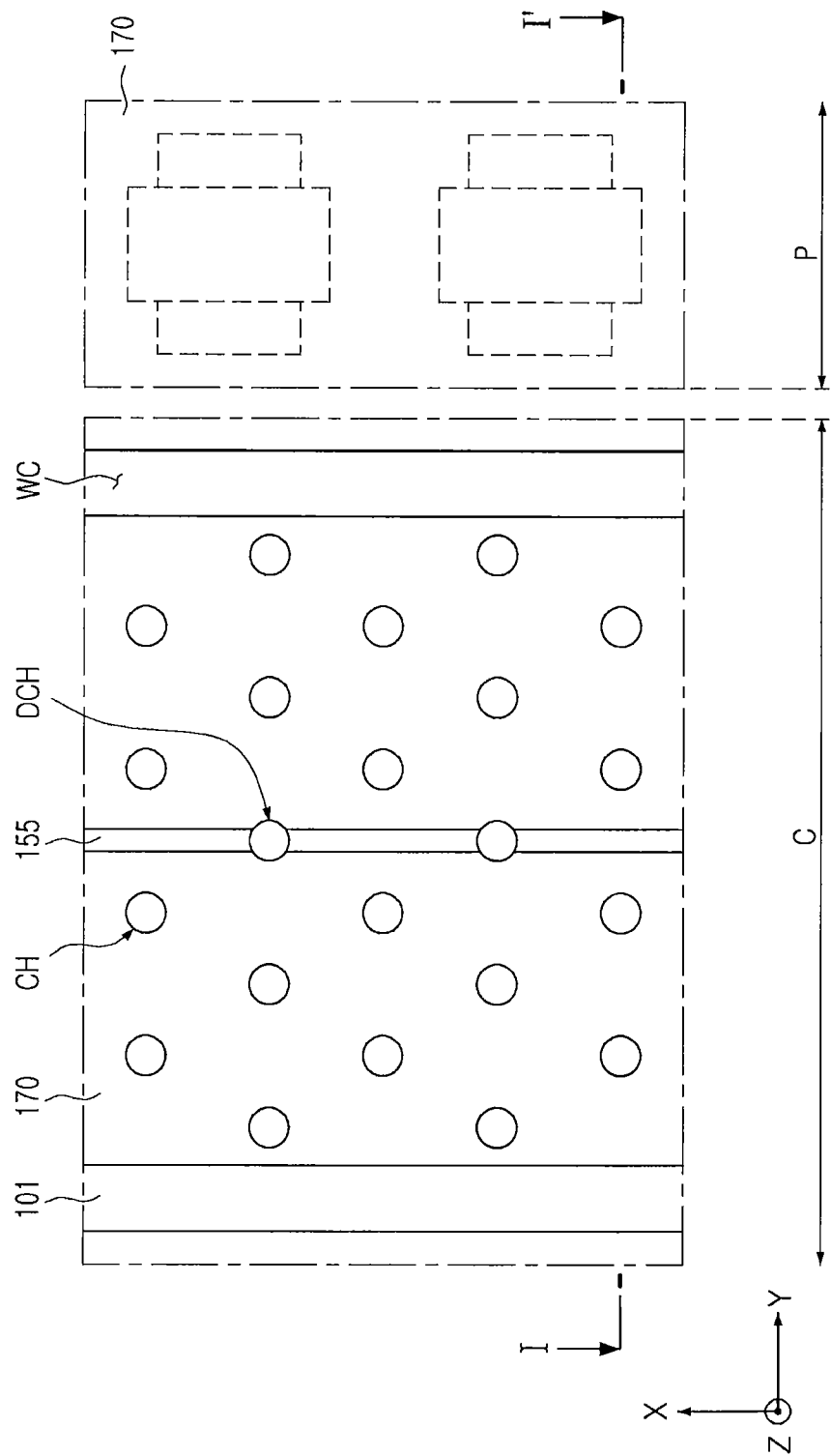
Figure 22:
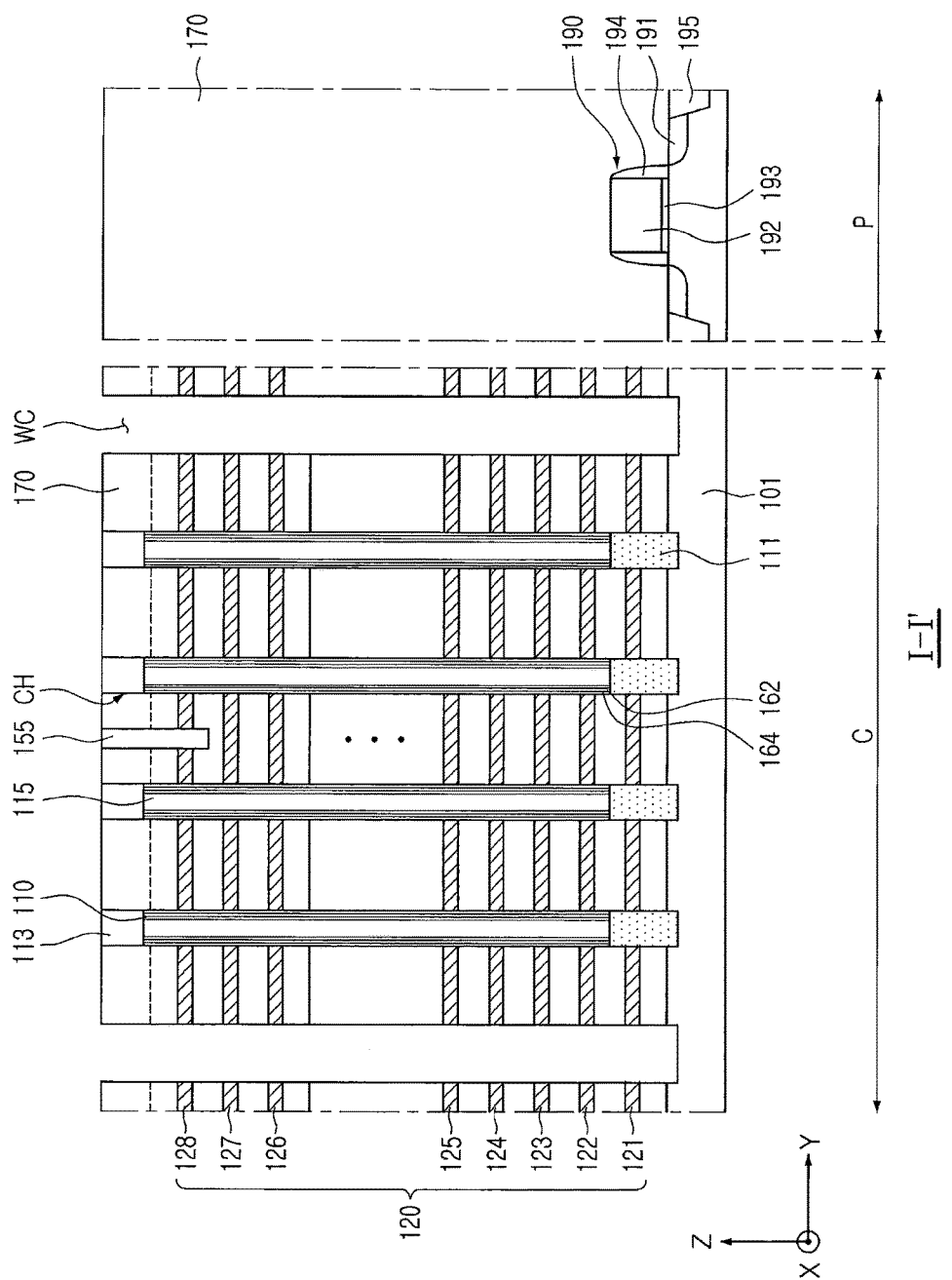

Referring to FIGS. 21 and 22, a word-line cut WC by which the plurality of sacrificial layers 120 and insulating layers 140 are divided into a plurality of parts may be formed. The word-line cut WC may extend in the first direction (the x-axis direction), and the substrate 101 may be partially exposed on a bottom of the word-line cut WC.

Figure 23:
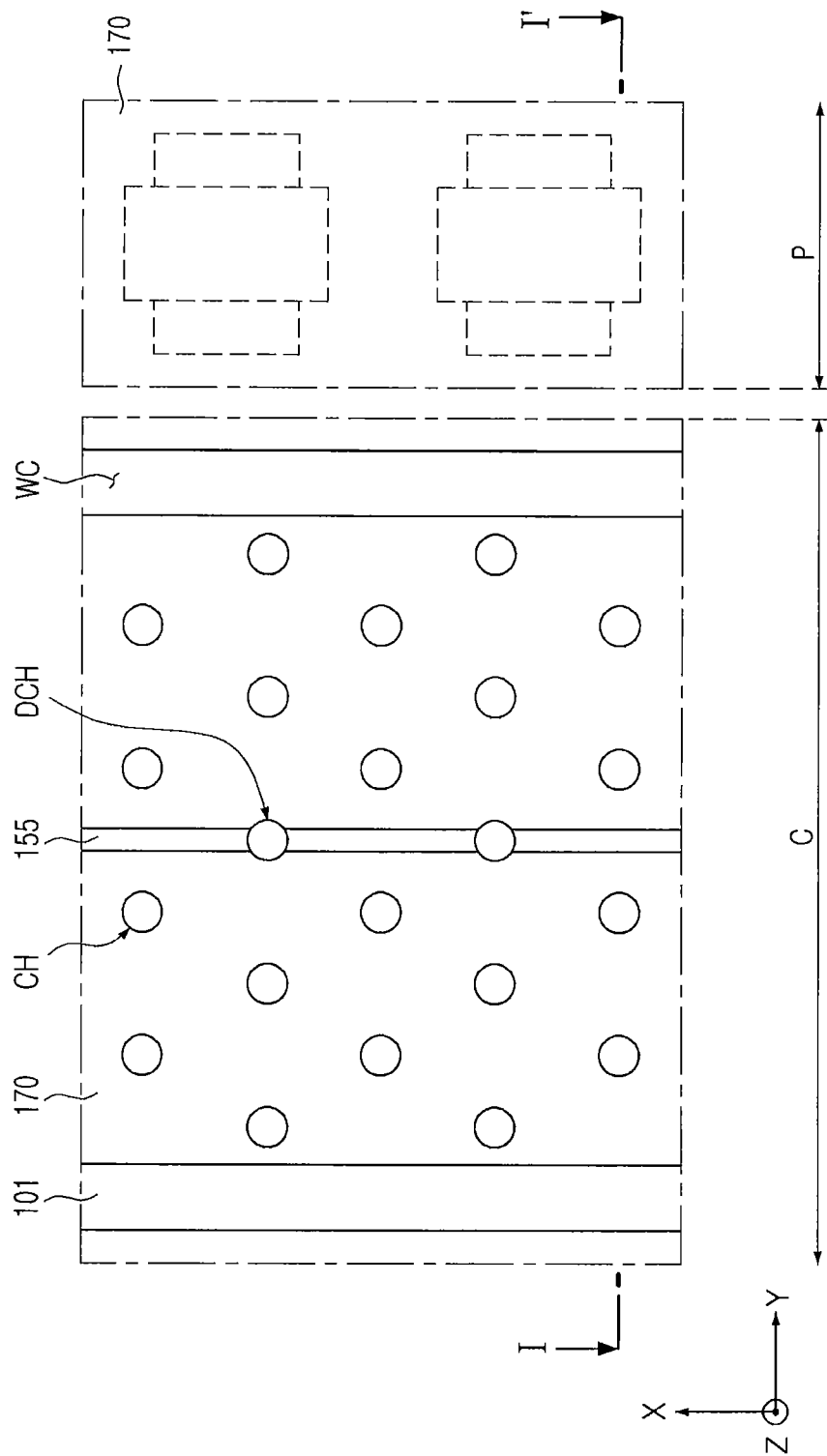
Figure 24:
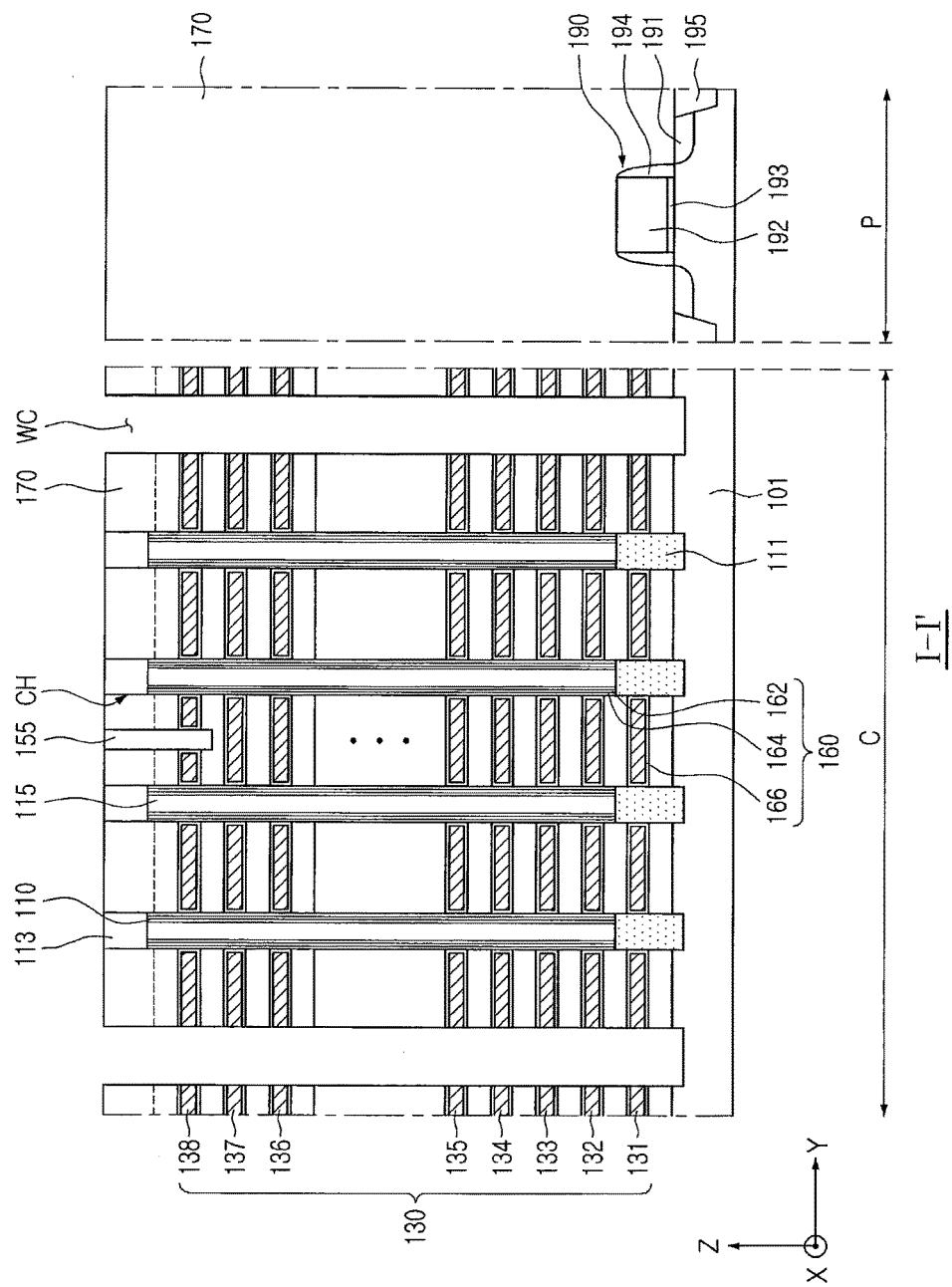

Referring to FIGS. 23 and 24, the plurality of sacrificial layers 120 may be replaced by the plurality of gate electrode layers 131 to 138 (generally denoted 130) through the word-line cut WC. The plurality of gate electrode layers 130, together with the plurality of insulating layers 140, may provide a gate structure.

In order to form the plurality of gate electrode layers 130, an etching process may be performed to selectively remove the plurality of sacrificial layers 120 through the word-line cut WC. While the plurality of sacrificial layers 120 are removed, the plurality of insulating layers 140 may remain. A blocking layer 166 and the gate electrode layers 130 may be sequentially formed in portions in which the plurality of sacrificial layers 120 are removed. The blocking layer 166 may include a high-k dielectric material, and may include two or more layers. In these embodiments, the high-k dielectric material may refer to a dielectric material having a higher dielectric constant than silicon oxide.

The gate electrode layers 130 may include a metal, polysilicon, or a metal silicide material. The metal silicide material may include, for example, a silicide of a metal selected from Co, Ni, Hf, Pt, W, and Ti, or a combination thereof. When the gate electrode layers 130 is formed of a metal silicide material, the gate electrode layers 130 may be formed by filling side openings with silicon, forming an additional metal layer, and performing a silicidation process. Meanwhile, in some example embodiments, the gate electrode layers 130 may include a plurality of metal layers, such as Ti, TiN, and W.

Figure 25:
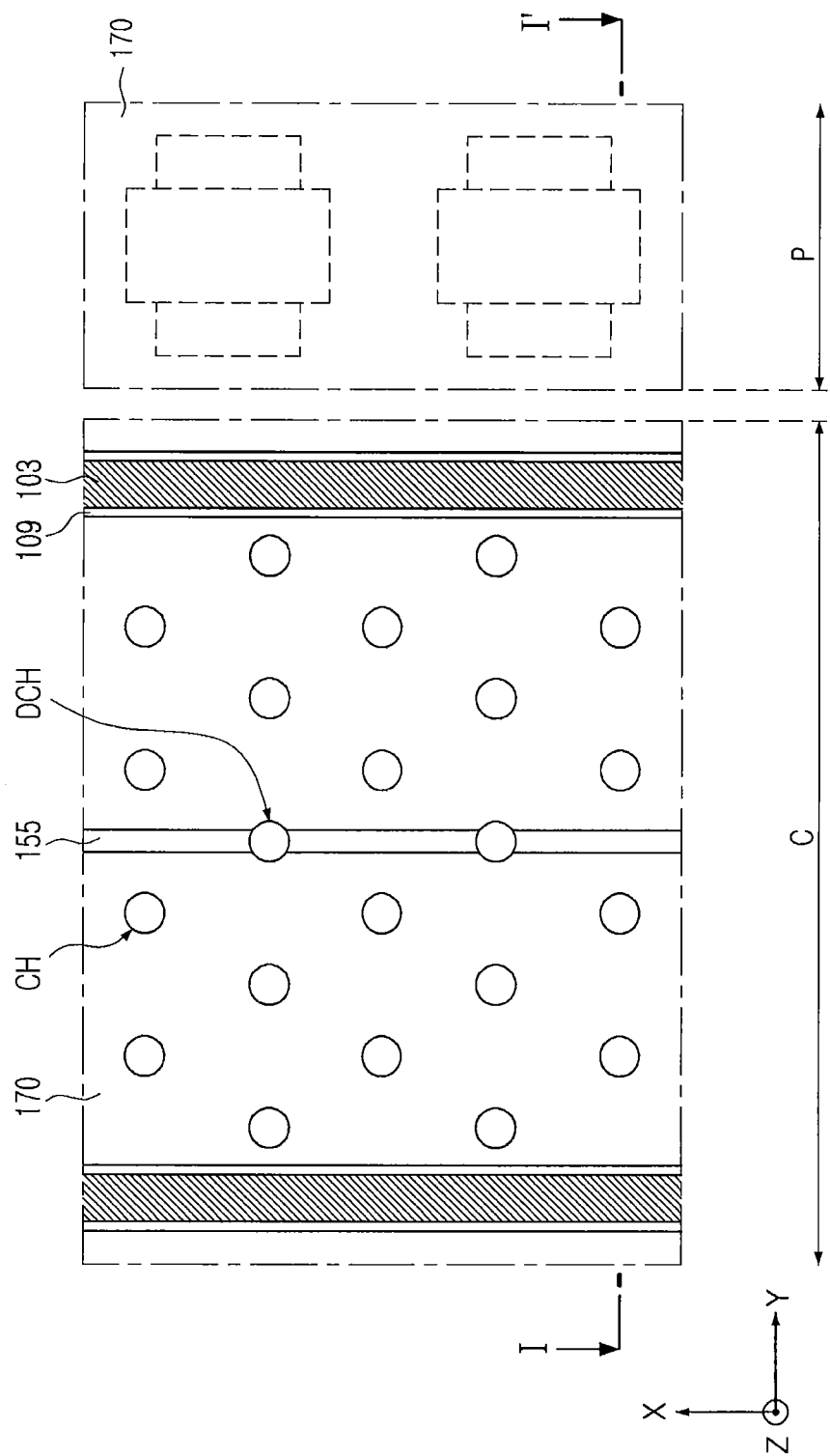
Figure 26:
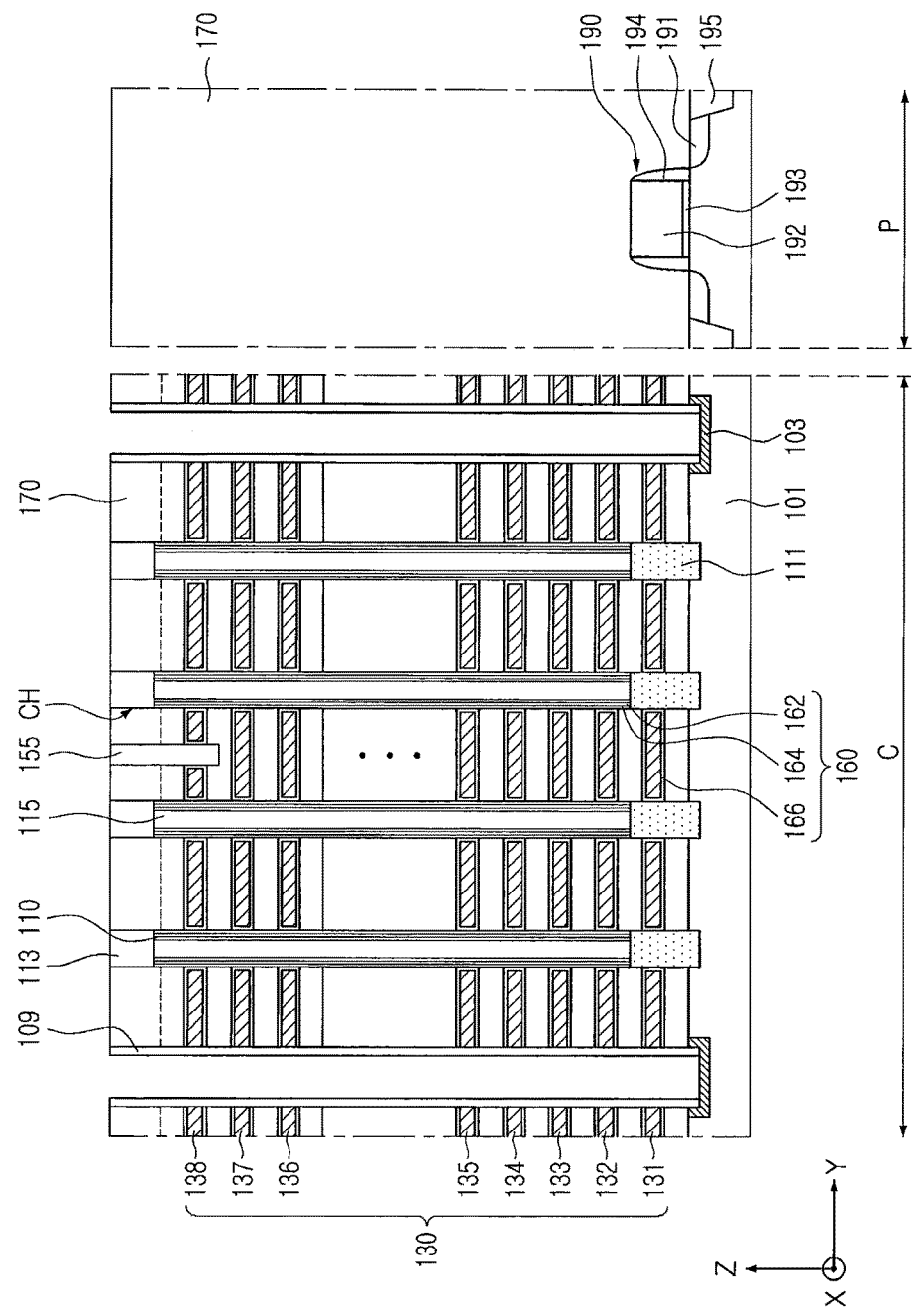

Referring now to FIGS. 25 and 26, the side spacers 109 may be formed on inner side surfaces of the word-line cut WC, and a source area 103 may be formed by injecting impurities into the substrate 101 exposed through the word-line cut WC. The side spacers 109 may be formed by depositing an insulating material in the word-line cut WC and removing the insulating material from a portion other than the inner side surfaces of the word-line cut WC using an anisotropic etching process. The source area 103 may be formed by injecting impurities in an ion-implanting process. In some example embodiments, the source area 103 may include n-type impurities.

Figure 27:
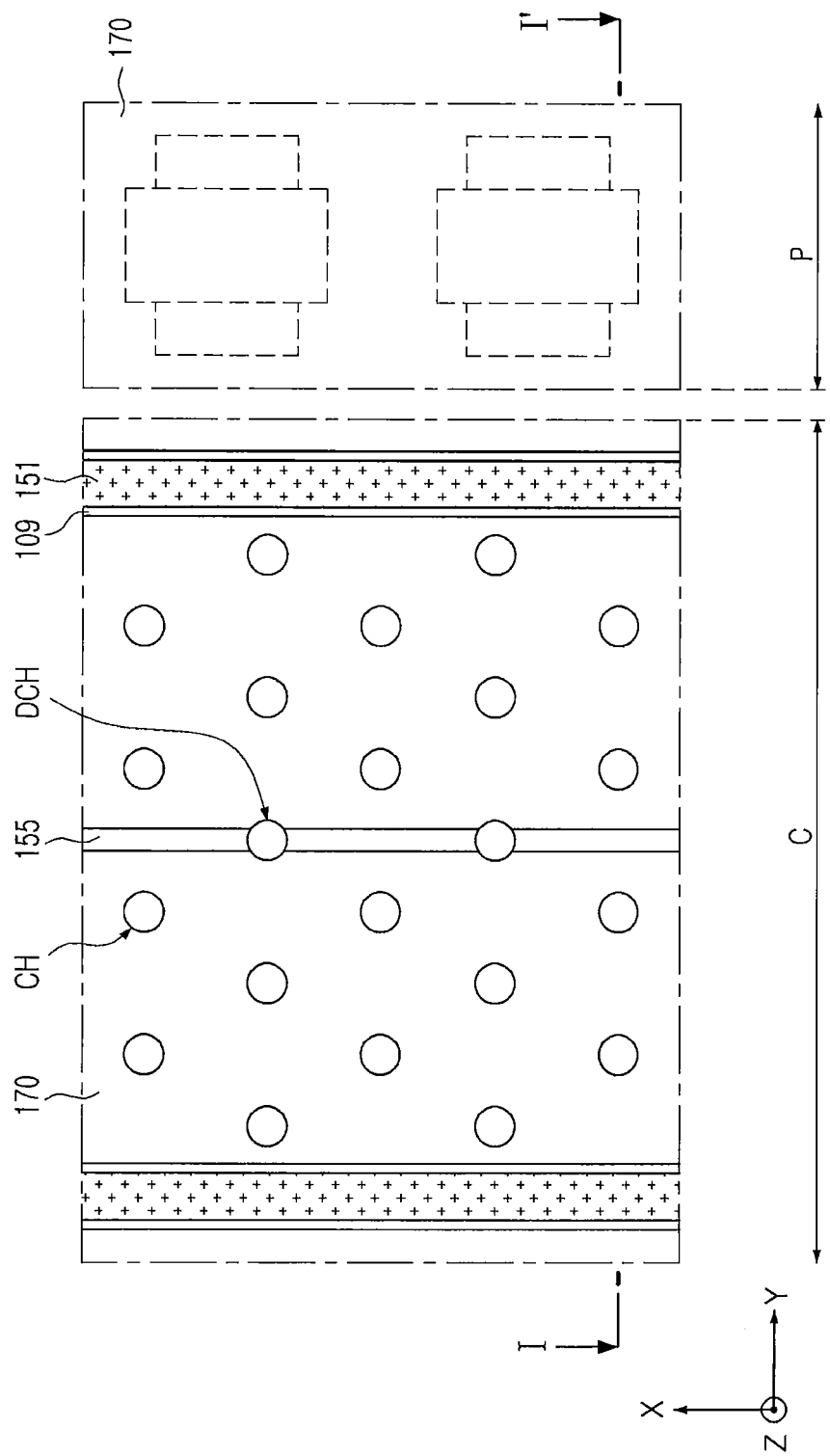
Figure 28:
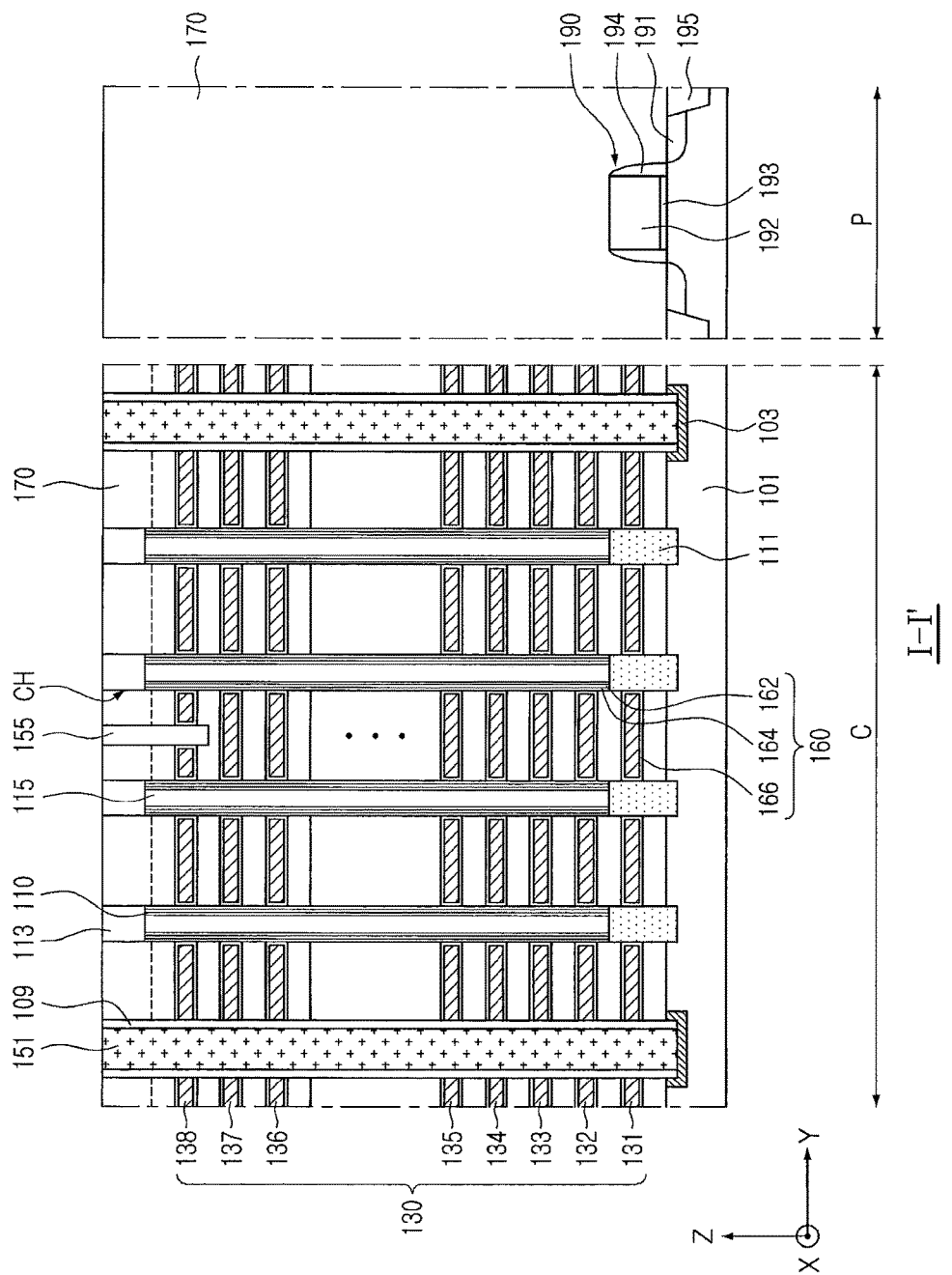

Referring to FIGS. 27 and 28, a first layer 151 of a common source line may be formed at an inner space of the side spacers 109. The first layer 151 may extend in a direction perpendicular to the substrate 101 (the z-axis direction) and in the first direction (the x-axis direction) in which the word-line cut WC extends. The first layer 151 may include a conductive material, and may be in direct contact with the source area 103 to be connected thereto under the plurality of gate insulating layers 130.

According to the example embodiments of the present inventive concept, the first layer 151 may be formed of polysilicon including n-type impurities, and an impurity concentration of the first layer 151 may be higher than that of the source area 103. The first layer 151 may be formed by depositing polysilicon including n-type impurities in a space between the side spacers 109 and performing a chemical mechanical polishing (CMP) process on an upper surface of the interlayer insulating layer 170.

Figure 29:
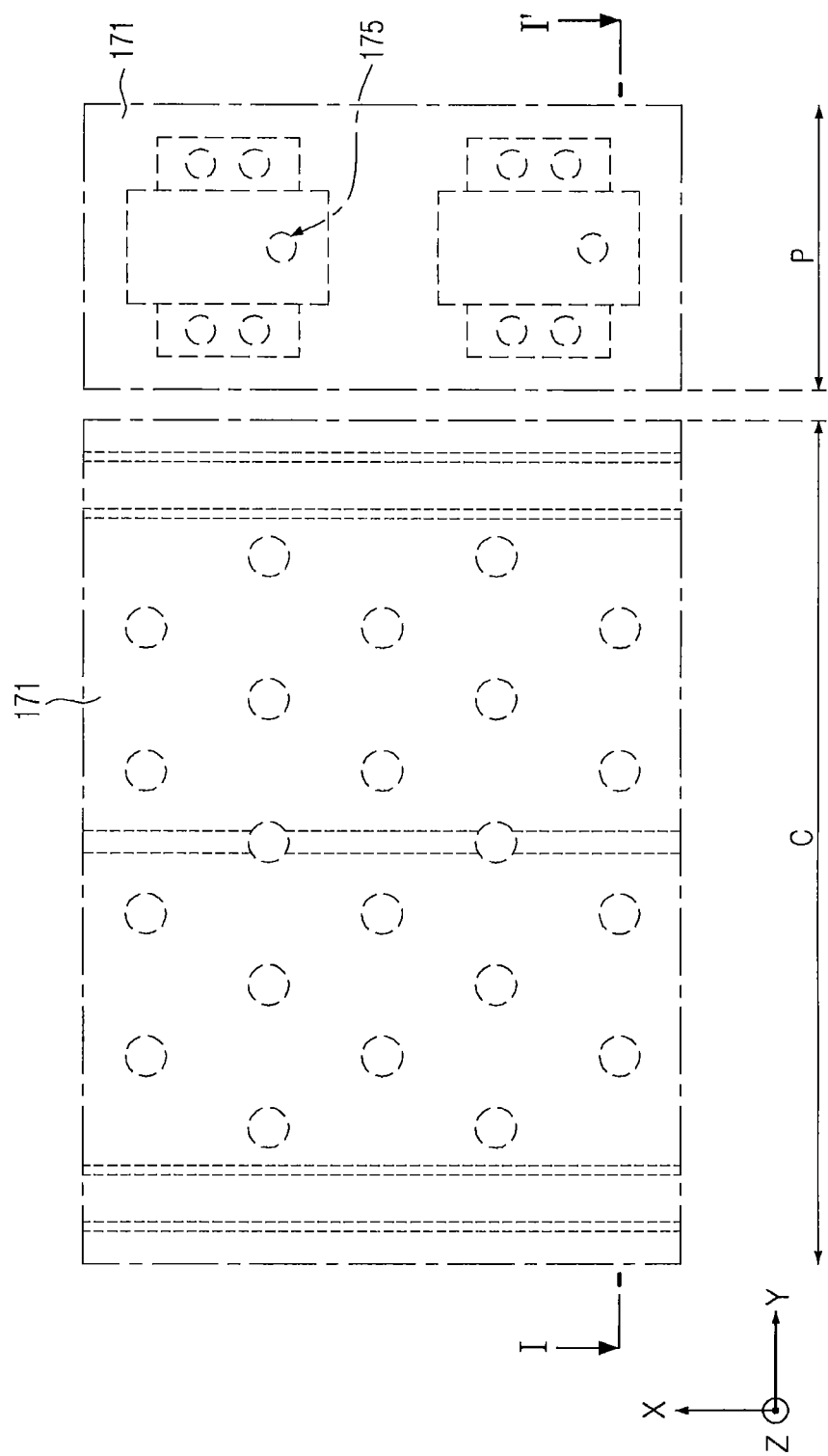
Figure 30:
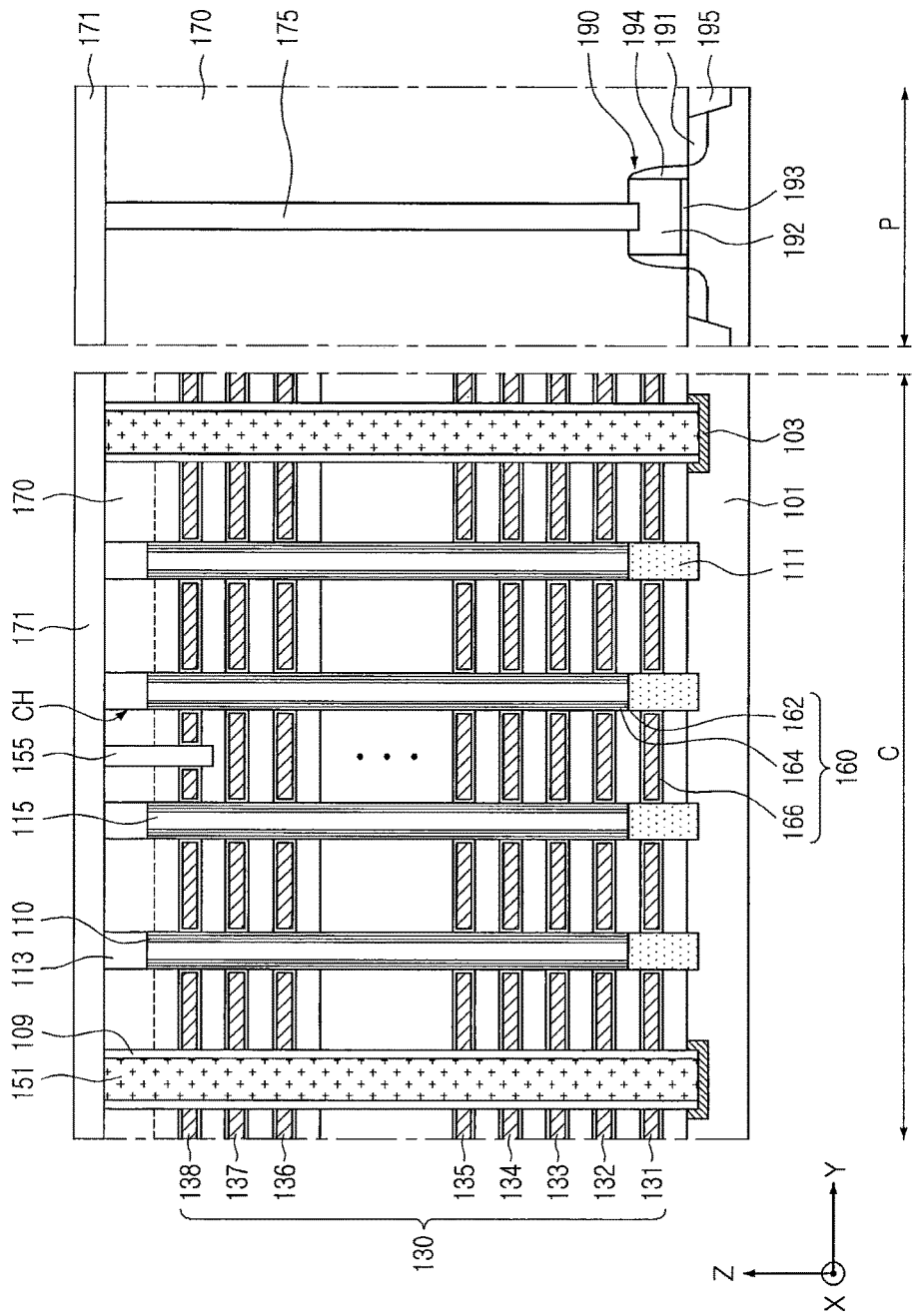

Referring now to FIGS. 29 and 30, a peripheral contact 175 passing through the interlayer insulating layer 170, and an upper insulating layer 171, may be formed on the interlayer insulating layer 170 and the first layer 151. The upper insulating layer 171 may include silicon oxide, like the interlayer insulating layer 170 and the isolation insulating layer 155.

Figure 31:
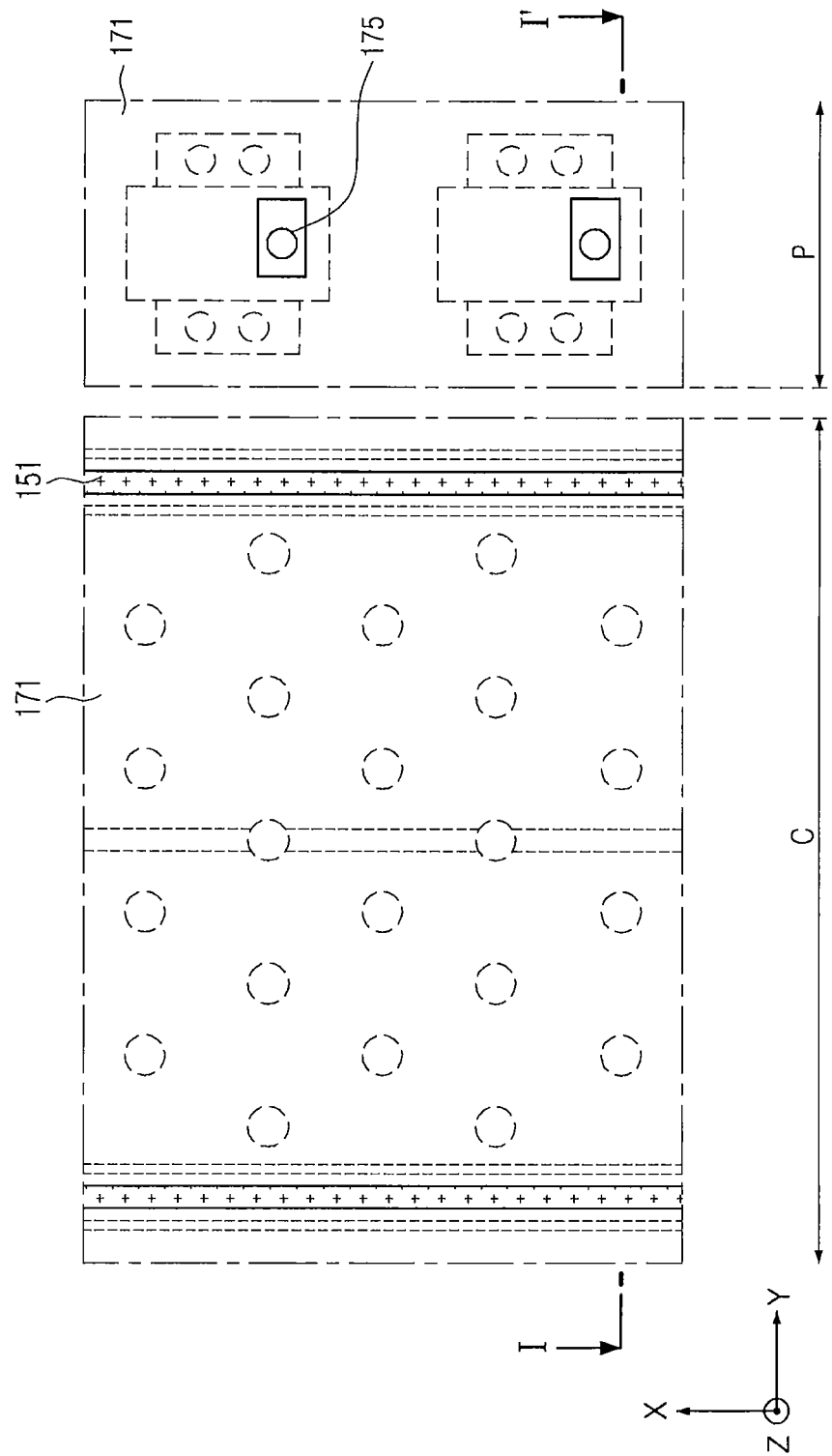
Figure 32:
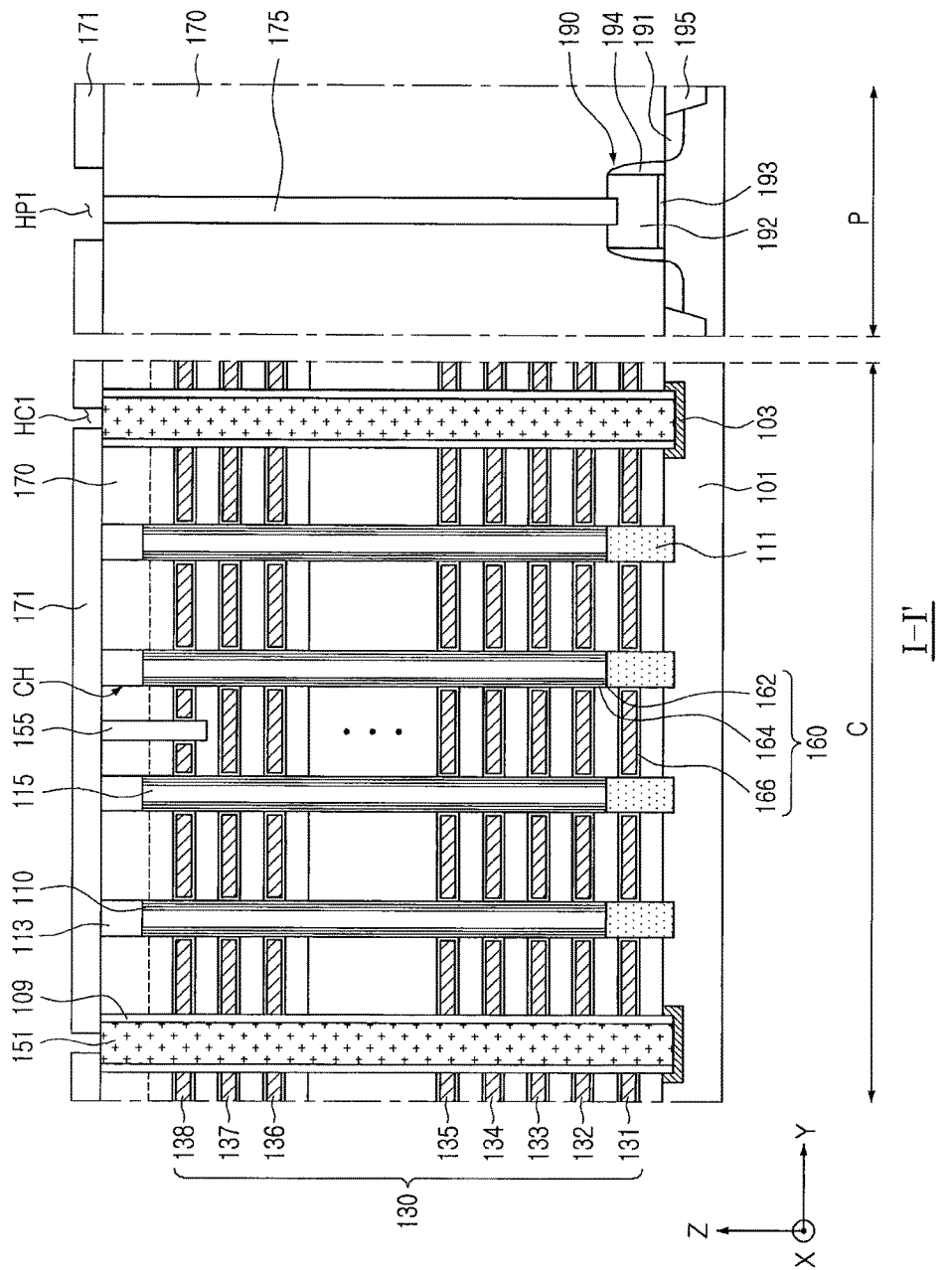

Referring to FIGS. 31 and 32, a cell-opening region HC1 and a peri-opening region HP1 may be formed by partially removing the upper insulating layer 171 on the first layer 151 and the peripheral contact 175. An upper surface of the first layer 151 may be partially exposed in the cell-opening region HC1, and upper surfaces of the peripheral contact 175 and the interlayer insulating layer 170 may be partially exposed. The cell-opening region HC1 may extend in the first direction (the x-axis direction), like the first layer 151.

Figure 33:
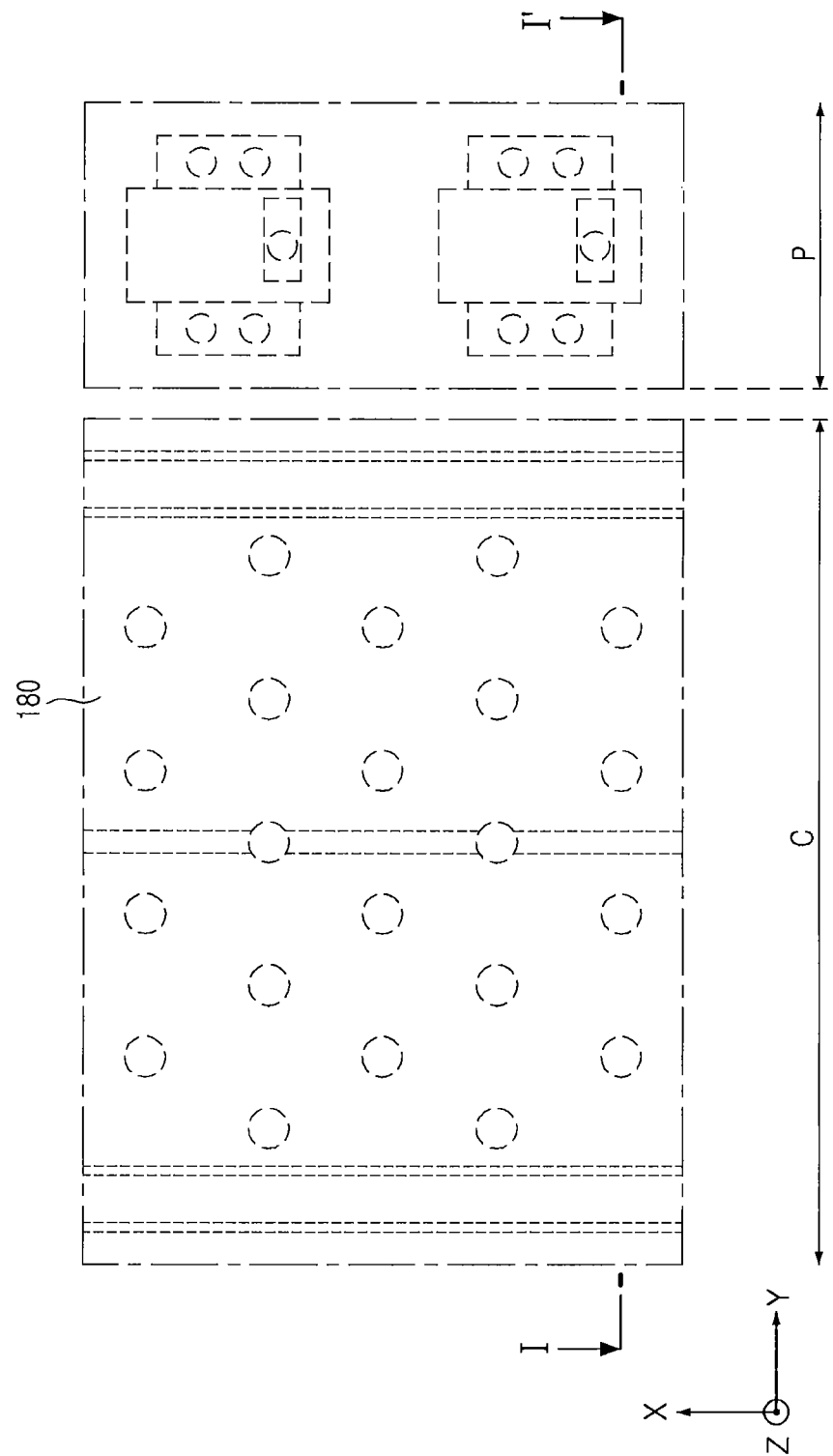
Figure 34:
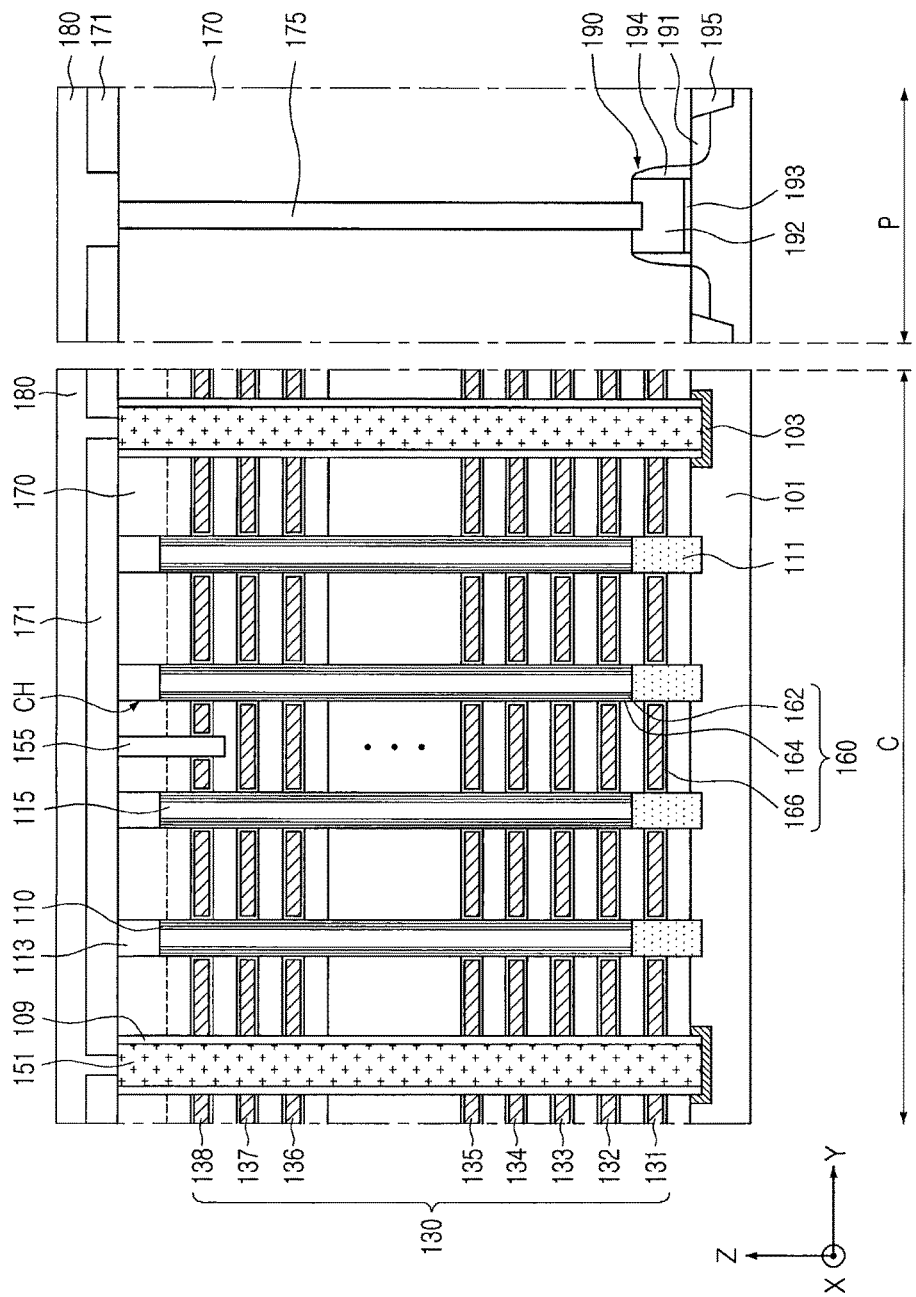

Referring to FIGS. 33 and 34, an upper metal layer 180 may be formed of a metal such as tungsten (W). In some example embodiments, the upper metal layer 180 may include a plurality of metal layers, in particular, sequentially stacked Ti/TiN and W layers. The Ti/TiN layer may be provided as a barrier layer. Next, referring to FIGS. 35 and 36, a contact metal layer 183 and a second layer 152 of the common source line 150 may be formed by performing a CMP process on the upper metal layer 180.

As discussed above with respect to FIGS. 29 to 36, the second layer 152 of the common source line 150 may be formed together with the contact metal layer 183 in a damascene process. Accordingly, the second layer 152 and the contact metal layer 183 may have substantially the same thickness, and an upper surface of the second layer 152 may be coplanar with an upper surface of the contact metal layer 183.

Figure 35:
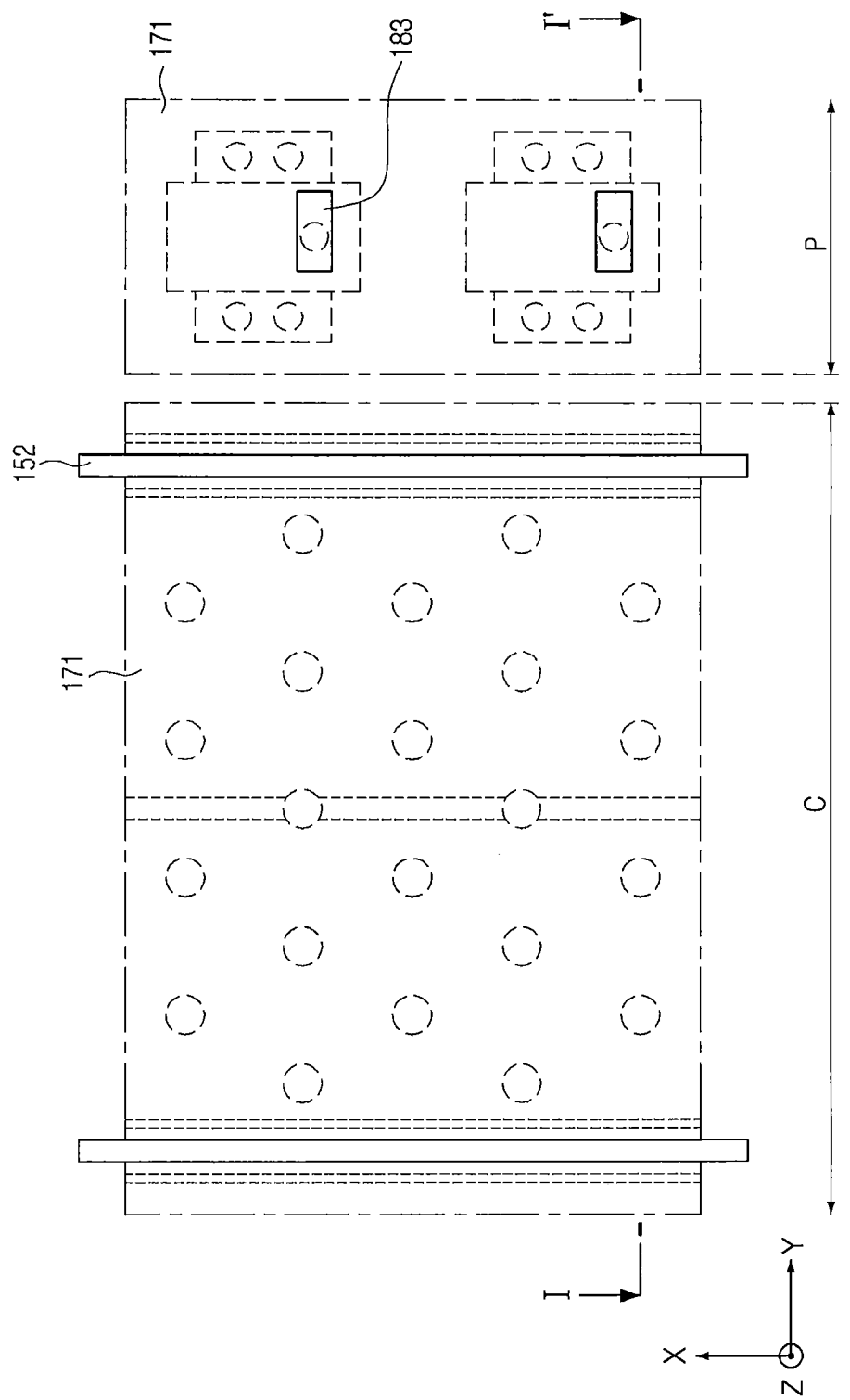
Figure 36:
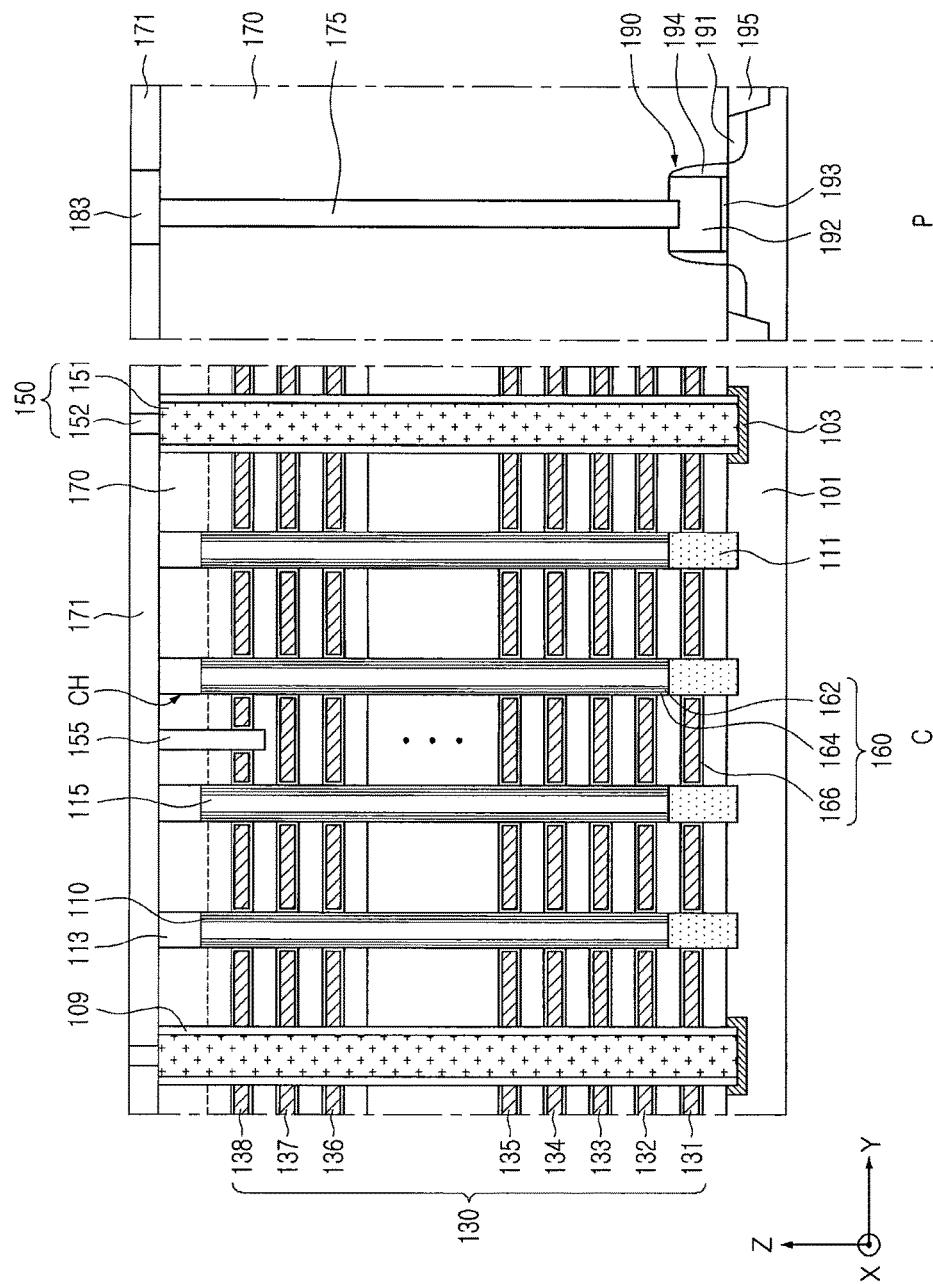

Meanwhile, referring to FIG. 35, the second layer 152 may extend in the first direction (the x-axis direction) on the upper surface of the first layer 151. In some example embodiments, the second layer 152 may extend longer than the first layer 151 in the first direction. Accordingly, since a resistance component due to the first layer 151 formed of polysilicon doped with n-type impurities may be compensated by the second layer 152 in some degree.

Figure 37:
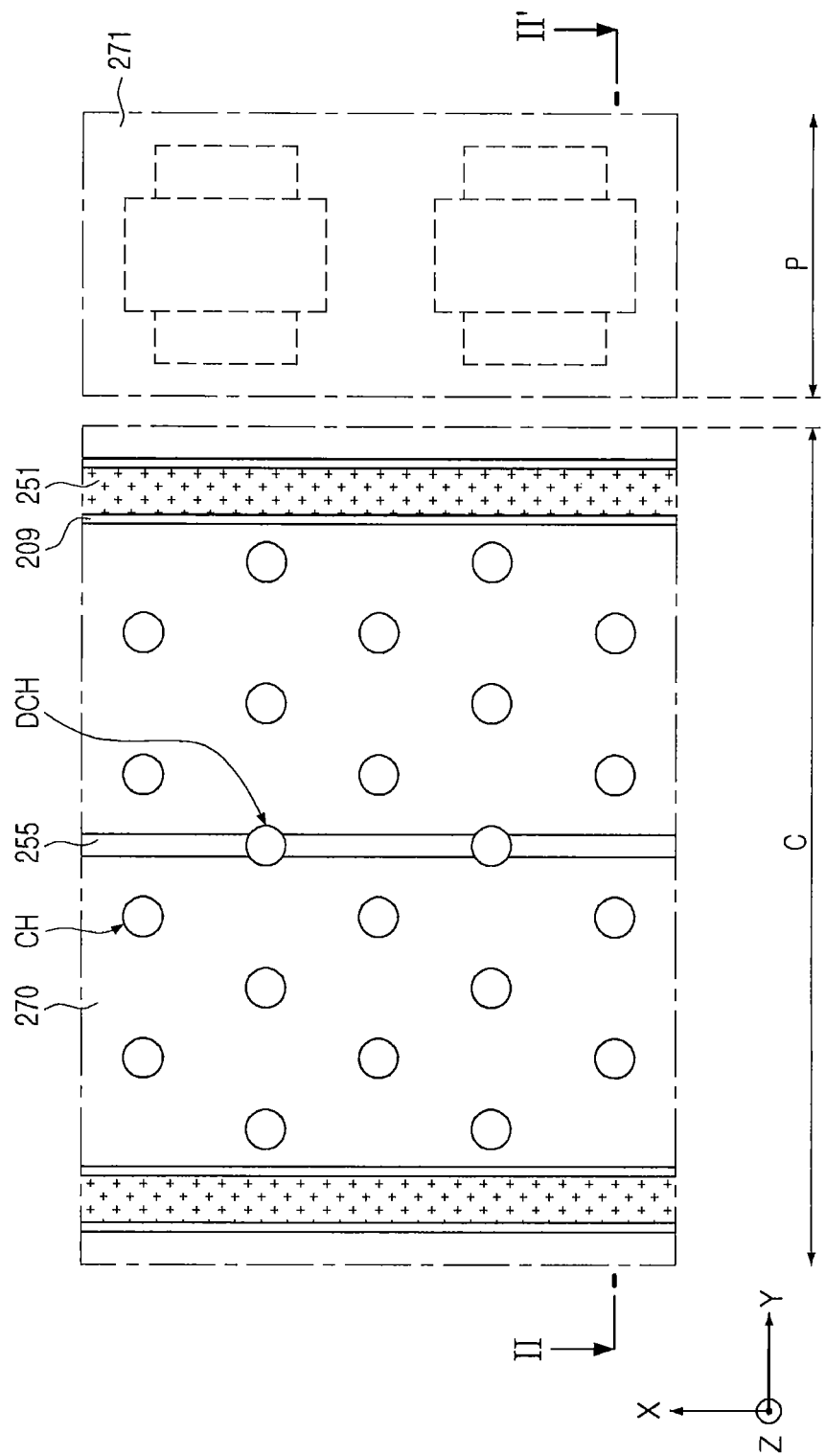
FIGS. 37 to 46 are views illustrating processing steps in the fabrication of the memory device illustrated in FIGS. 8 to 10.
Figure 38:
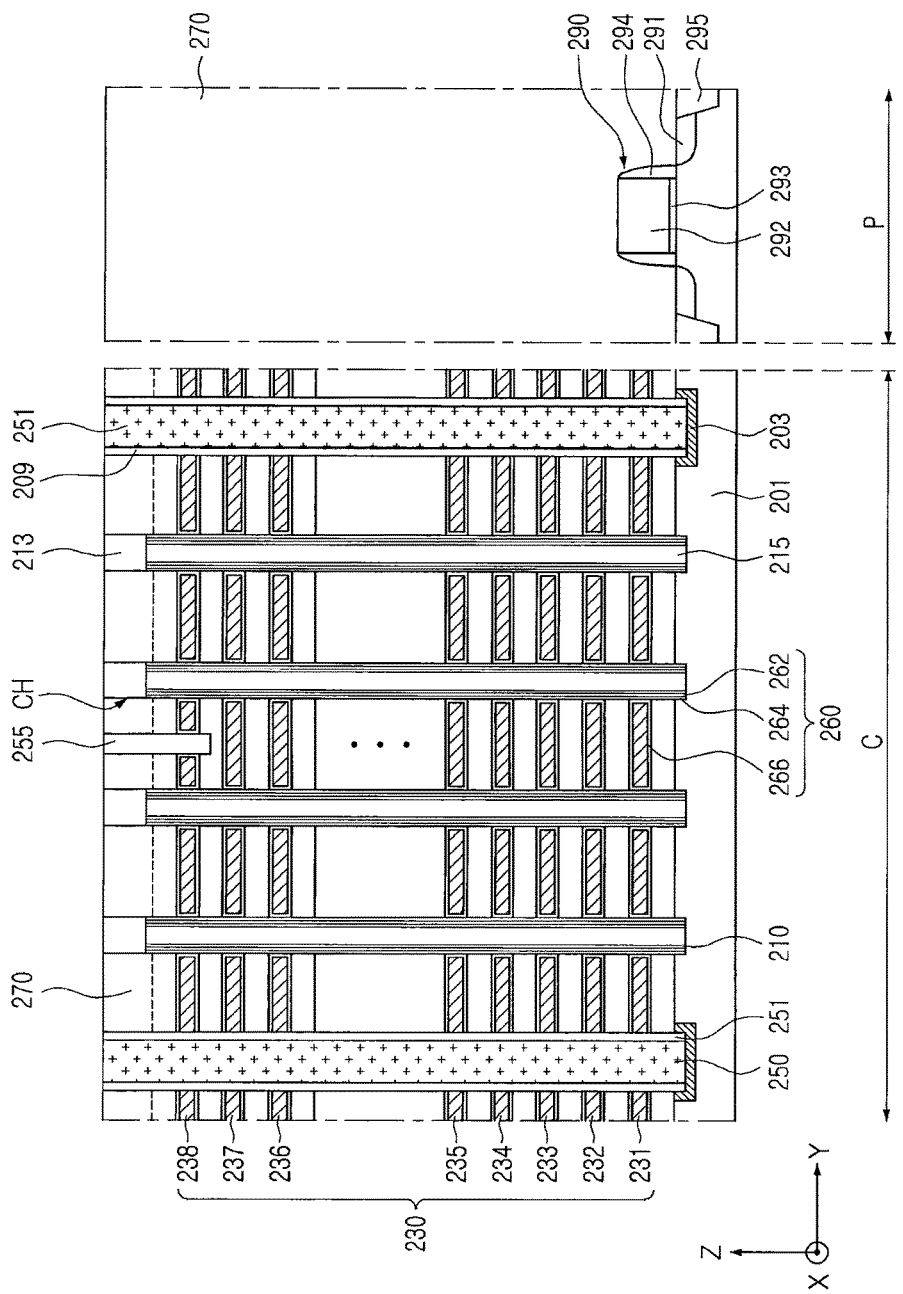

FIGS. 37 to 46 are views illustrating processing steps in the fabrication of the memory devices illustrated in FIGS. 8 to 10. FIG. 38 is a cross-section taken along the line II-II' in FIG. 37. Referring to FIGS. 37 and 38, a cell region C and a peripheral circuit region P may be defined, and a plurality of gate electrode layers 231 to 238 (generally denoted 230), a plurality of channel areas CH and dummy channel areas DCH, a source area 203, and a first layer 251 of a common source line may be formed on a substrate 201 in the cell region C. A plurality of peripheral circuit devices 290 may be formed in the peripheral circuit region P disposed to be adjacent to the cell region C. The peripheral circuit device 290 may include an active area 291, a horizontal gate electrode 292, a horizontal gate insulating layer 293, and a horizontal spacer 294. A device isolation layer 295 may be disposed around the active area 291.

Each of the channel areas CH may include a channel layer 210, a drain area 213 disposed on the channel layer 210, and a filling insulating layer 215 filling an inner space of the channel layer 210. A gate insulating layer 260 may be disposed between the plurality of gate electrode layers 230 and the channel layer 210. The gate insulating layer 260 may include a tunneling layer 262, a charge storage layer 264, and a blocking layer 266.

The first layer 251 of the common source line may be connected to the source area 203. The first layer 251 may include n-type impurities, like the source area 203. In some example embodiments, the first layer 251 may be formed of polysilicon doped with n-type impurities. A concentration of n-type impurities in the first layer 251 may higher than that in the source area 203.

Figure 39:
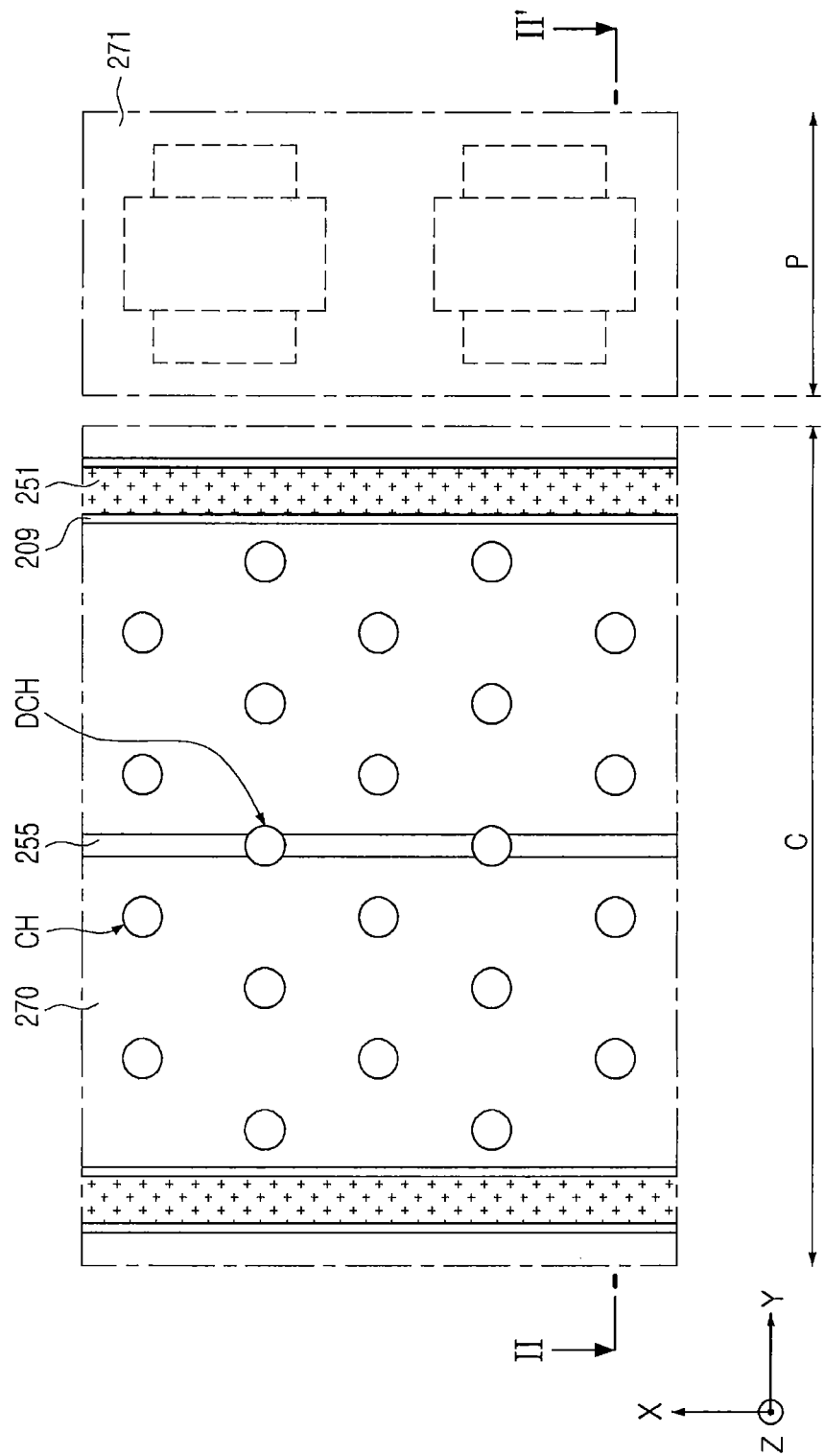
Figure 40:
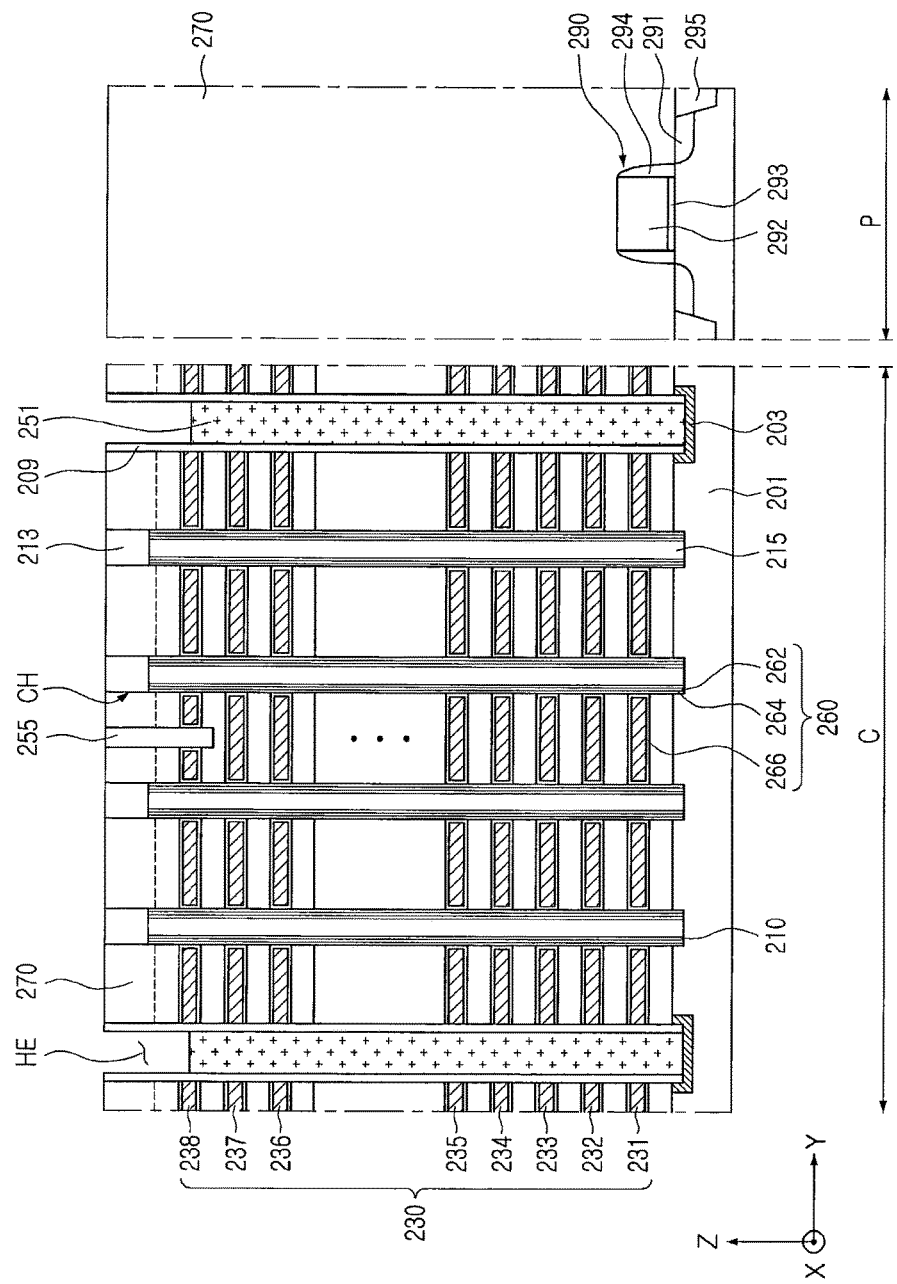

Referring to FIGS. 39 and 40, an open area HE may be formed by removing at least a portion of the common source line 250. In the example embodiments illustrated in FIG. 40, a bottom surface of the open area HE are disposed between an upper surface and a bottom surface of the uppermost gate electrode layer 238. However, embodiments of the present inventive concept are not limited thereto. In other words, a depth of the open area HE may be variously modified, and the common source line 250 may be modified depending on the depth of the open area HE as illustrated in FIGS. 8B to 8D.

Figure 41:
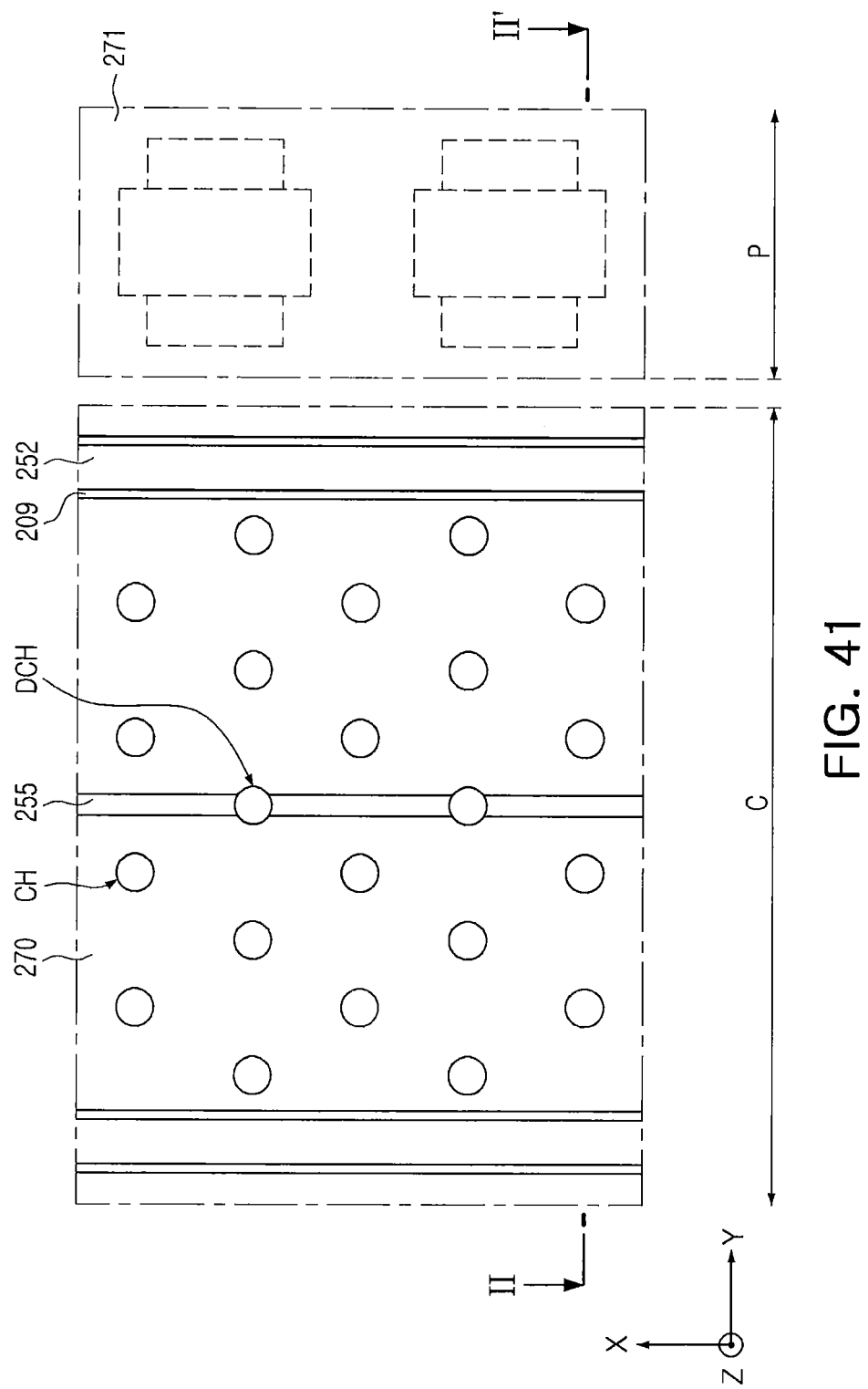
Figure 42:
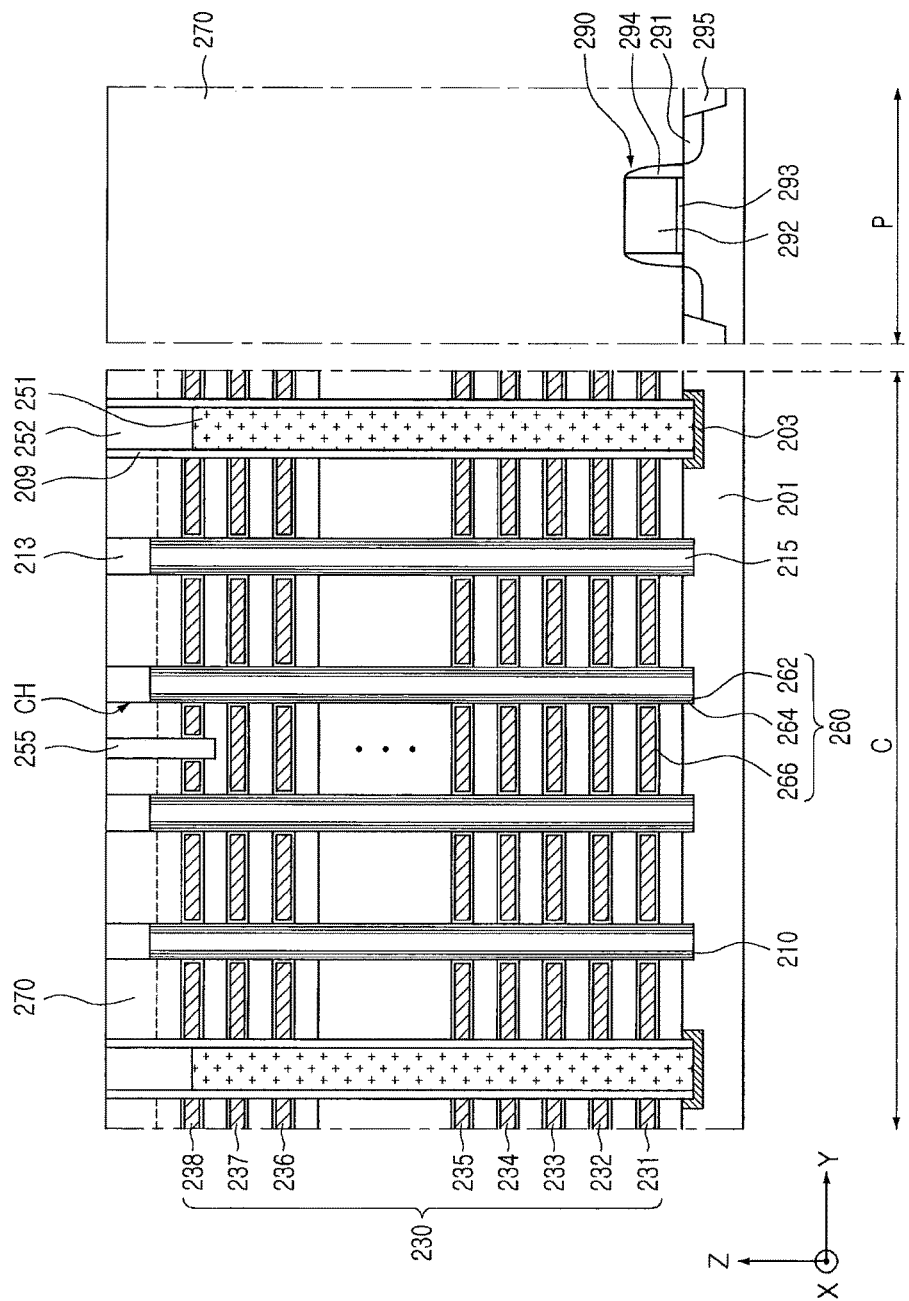

Referring to FIGS. 41 and 42, a second layer 252 may be formed in the open area HE. The second layer 252 may be formed by depositing a metal on an inner surface of the open area HE and on the interlayer insulating layer 270, and performing a CMP process in which the metal disposed on the interlayer insulating layer 270 is removed. Accordingly, an upper surface of the second layer 252 may be coplanar with an upper surface of the interlayer insulating layer 270.

The second layer 252 may include a plurality of layers. As illustrated in FIG. 10, the second layer 252 may include a barrier layer 252a and a metal layer 252b formed on the barrier layer 252a. The barrier layer 252a may be formed of Ti/TiN, and the metal layer 252b may be formed of tungsten (W).

Figure 43:
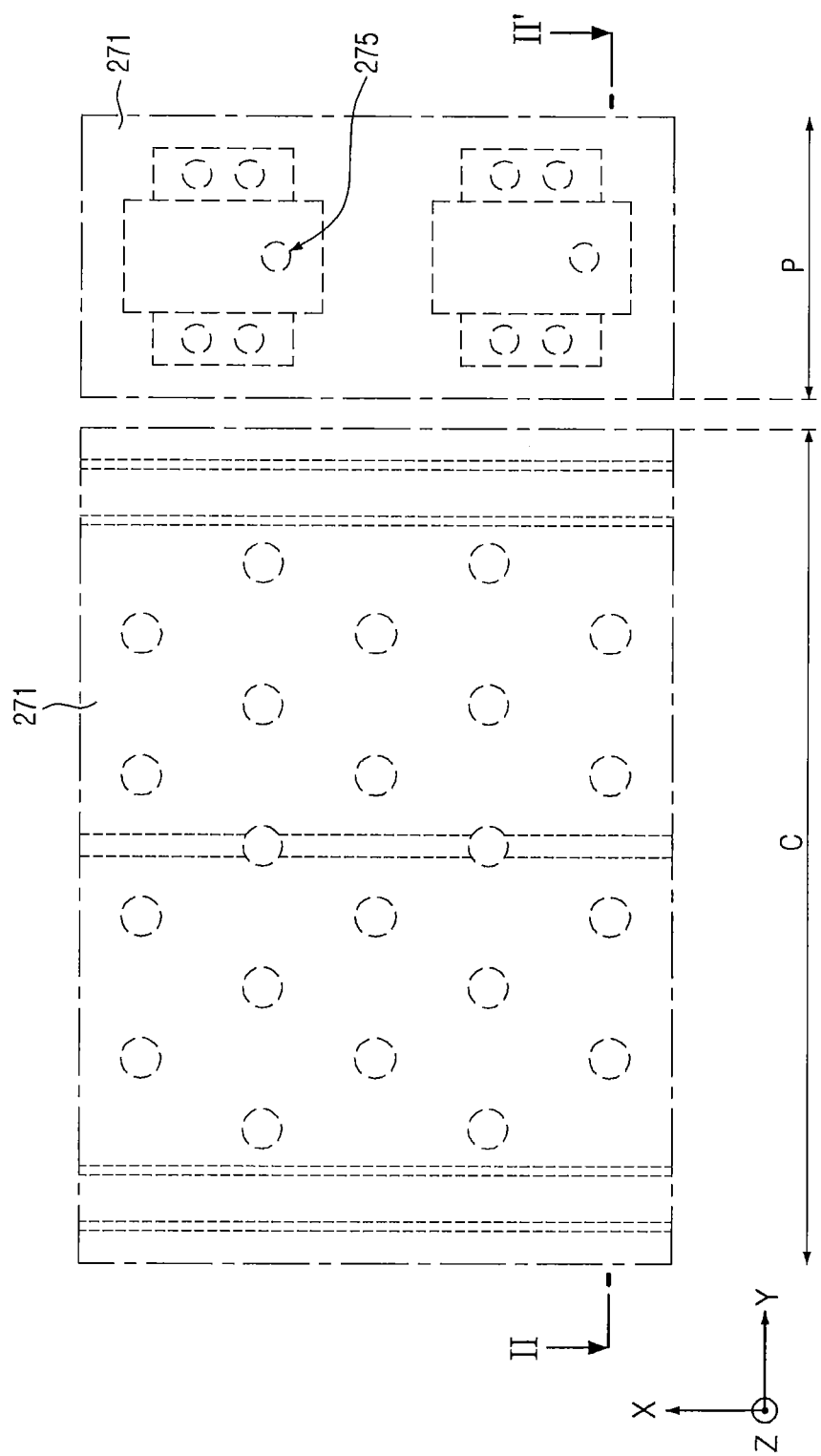
Figure 44:
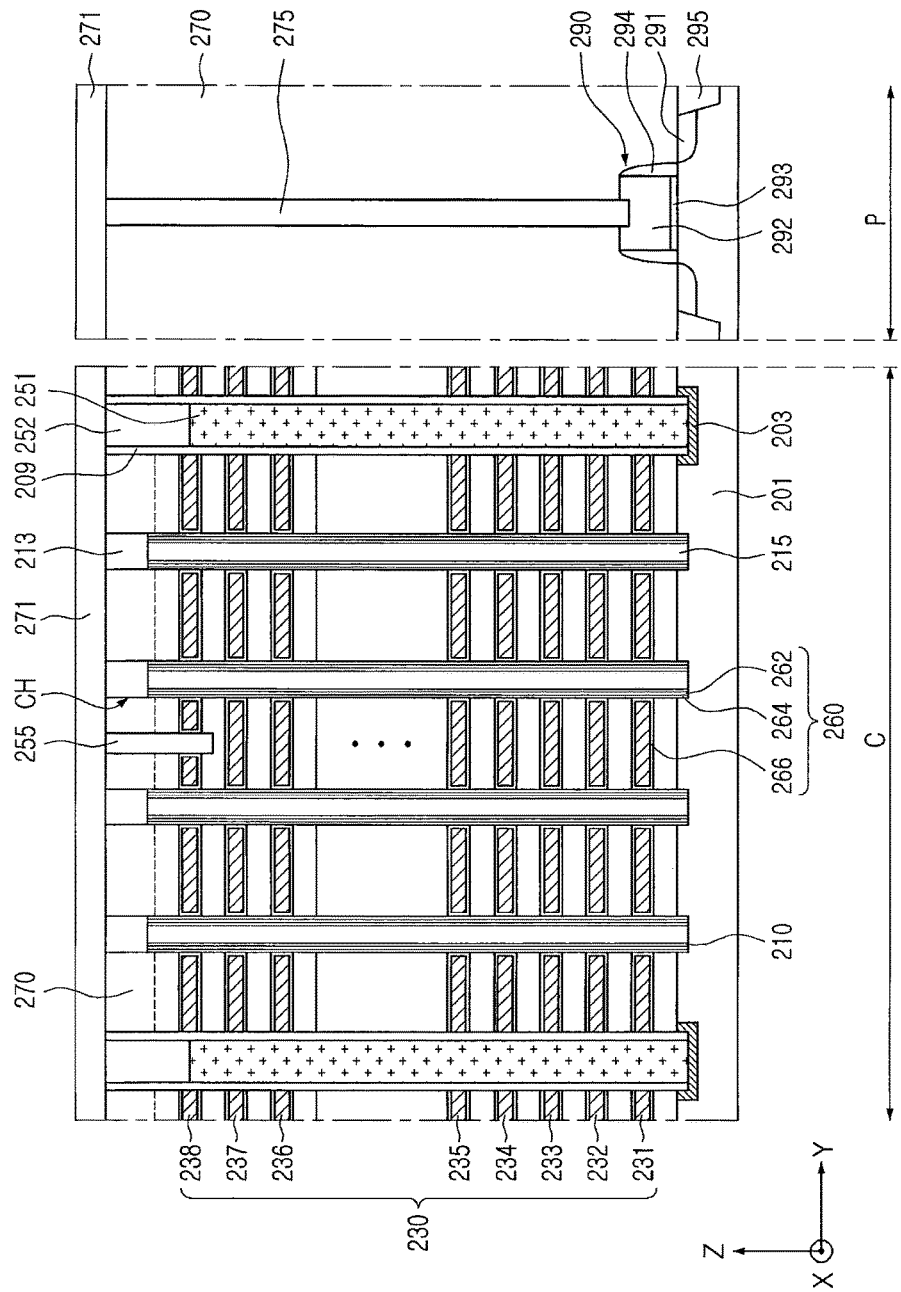

Referring now to FIGS. 43 and 44, an upper insulating layer 271 may be formed on the interlayer insulating layer 270 and the second layer 252. The upper insulating layer 271 may be formed of silicon oxide, similar to the interlayer insulating layer 270 and an isolation insulating layer 255. After the upper insulating layer 271 is formed, a third layer 253 may be formed using a damascene process as described with reference to FIGS. 29 to 36.

Figure 45:
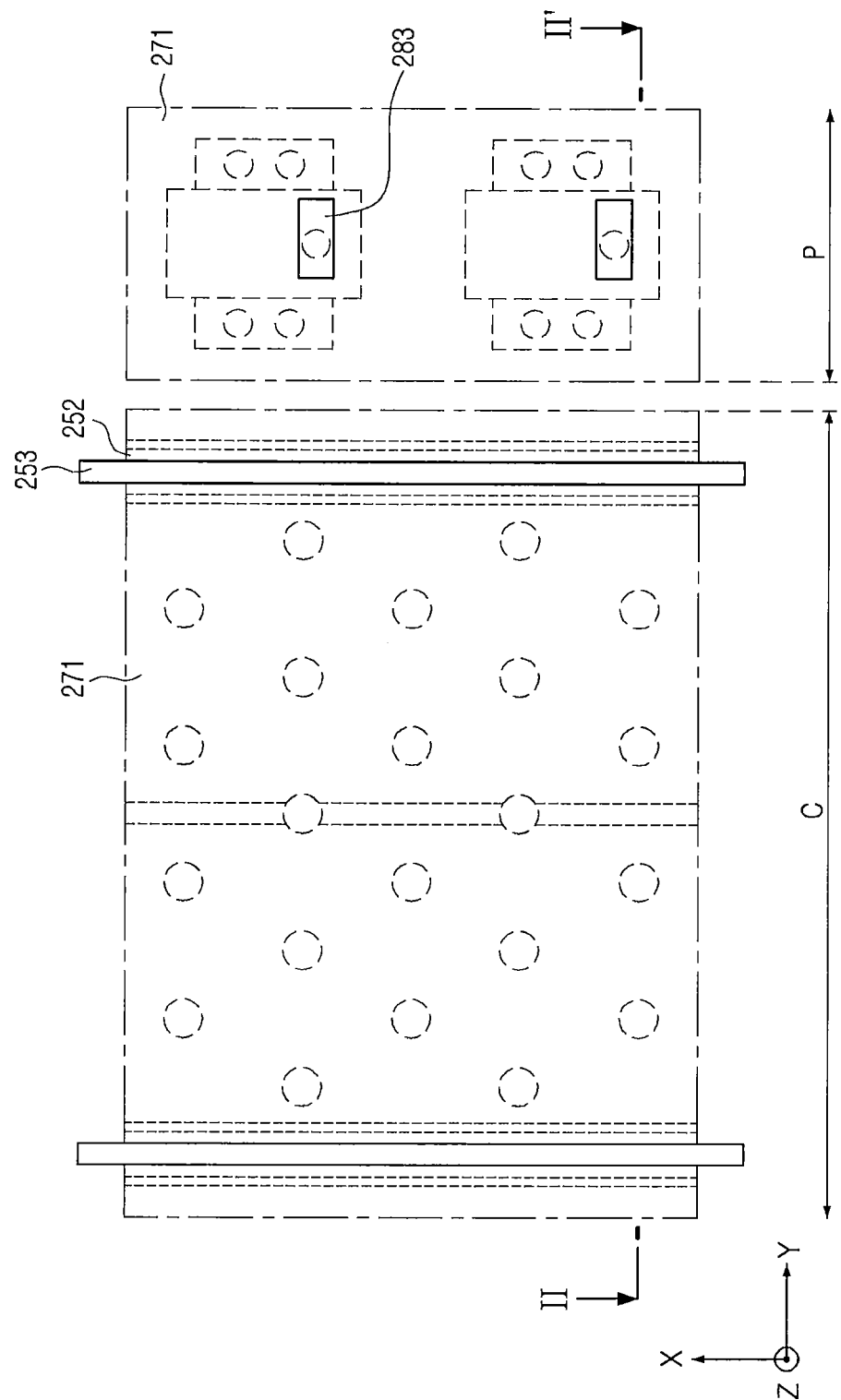
Figure 46:
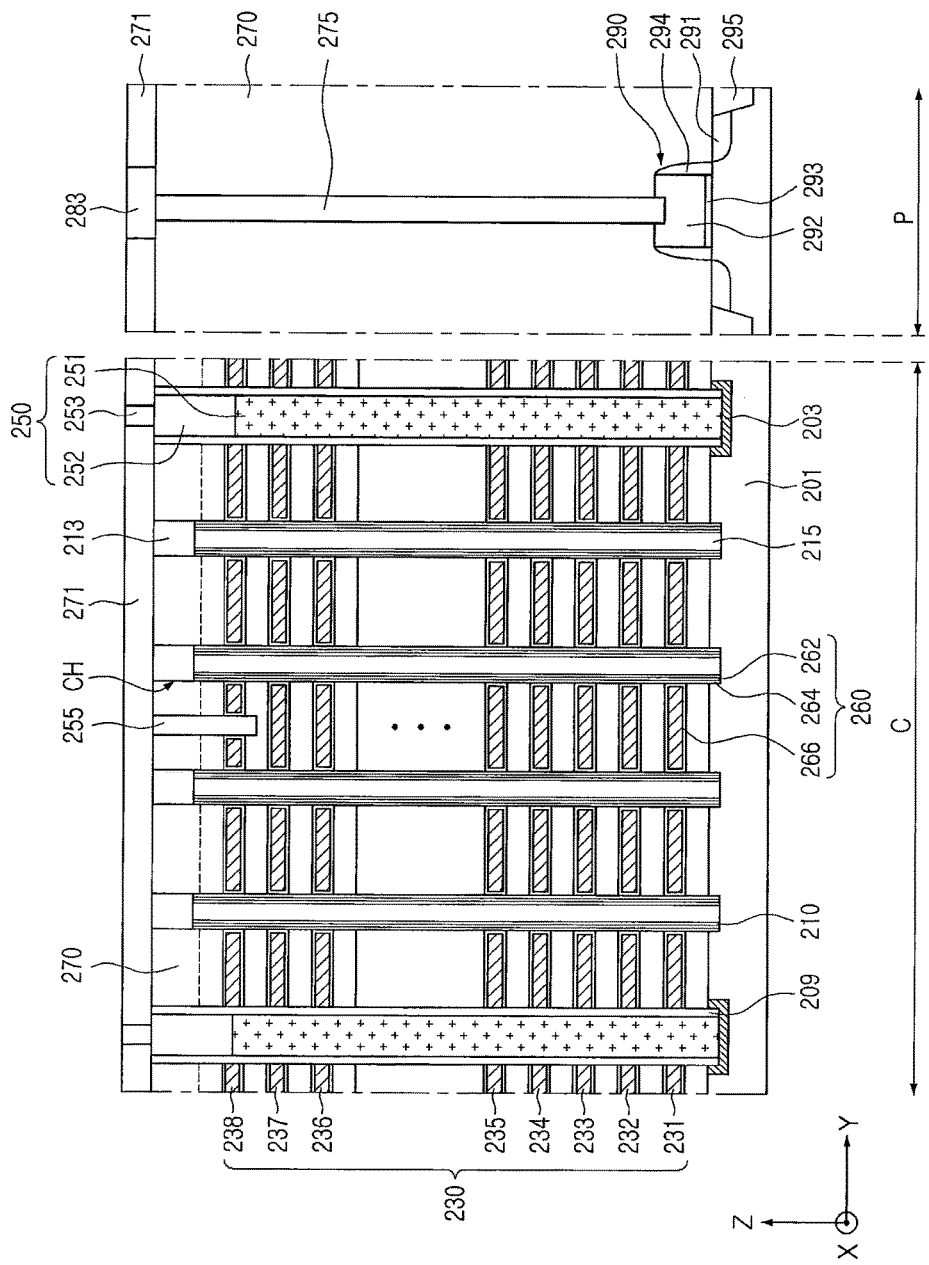

Referring to FIGS. 45 and 46, the third layer 253 may be formed together with a contact metal layer 283 disposed on a peripheral contact 275. The third layer 253 may be formed on the second layer 252, and may extend further than the first layer 251 in the first direction (the x-axis direction).

The third layer 253 may include a plurality of layers, similar to the second layer 252. In other words, as illustrated in FIG. 10, the third layer 253 may include a barrier layer 253a formed of Ti/TiN or the like, and a metal layer 253b formed of tungsten (W) or the like.

In the process of fabricating the memory device 200 described with reference to FIGS. 37 to 46, both of the second layer 252 and the third layer 253 may be formed in the damascene process. Since the first layer 251 is formed of polysilicon doped with n-type impurities, and the second layer 252 and the third layer 253 are formed on the first layer 251, a high resistance component of the polysilicon of the first layer 251 may be compensated. In particular, the high resistance component of the polysilicon may be effectively compensated by forming at least one of the second layer 252 and the third layer 253 to be longer than the first layer 251.

Figure 47:
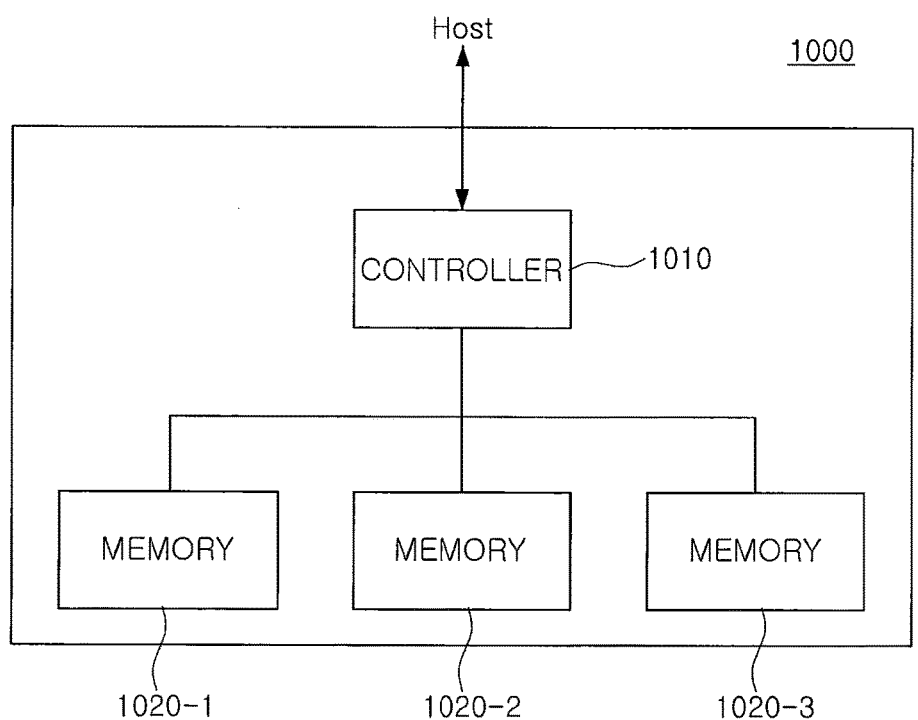
FIG. 47 is a block diagram illustrating an electronic apparatus including a memory device according to some embodiments of the present inventive concept.

FIG. 47 is a block diagram illustrating electronic device including a memory device according to example embodiments of the present inventive concept. Referring to FIG. 47, a storage apparatus 1000 according to some example embodiments of the present inventive concept may include a controller 1010 communicating with a host HOST, and memories 1020-1, 1020-2, and 1020-3 storing data. Each of the memories 1020-1, 1020-2, and 1020-3 may include the memory devices 100, 200, and 300 according to the above-described various example embodiments of the present inventive concept.

The host HOST communicating with the controller 1010 may be a variety of electronic devices in which the storage apparatus 1000 is installed, such as a smartphone, a digital camera, a desktop PC, a laptop PC, or a media player. The controller 1010 may receive a request for data reading or writing from the host HOST to generate a command CMD for writing data to the memories 1020-1, 1020-2, and 1020-3 or reading data from the memories 1020-1, 1020-2, and 1020-3.

As illustrated in FIG. 47, one or more memories 1020-1, 1020-2, and 1020-3 may be connected in parallel to the controller 1010 in the storage apparatus 1000. By connecting the plurality of memories 1020-1, 1020-2, and 1020-3 to the controller 1010 in parallel, the storage apparatus 1000 having a large amount of capacity, such as a solid state drive (SSD), may be implemented.

As set forth above, according to the example embodiments of the present inventive concept, a common source line may include a plurality of layers formed of different materials, and at least a portion of the plurality of layers may be formed of a semiconductor material doped with impurities. Accordingly, since problems generated when the common source line is formed only of the metal are solved, reliability of a memory device may be improved.

While example embodiments have been shown and described above, it will be apparent to those skilled in the art that modifications and variations could be made without departing from the scope of the present invention as defined by the appended claims.

What is claimed is:

1. A memory device, comprising:
a gate structure including a plurality of gate electrode layers stacked on an upper surface of a substrate;
a plurality of channel areas passing through the gate structure and extending in a direction perpendicular to the upper surface of the substrate;
a source area disposed in the substrate to extend in a first direction and including impurities; and
a common source line extending in the direction perpendicular to the upper surface of the substrate to be connected to the source area, and including a plurality of layers containing different materials, wherein the common source line comprises:
a first layer disposed on the source area; and
a second layer disposed on the first layer and being thinner than the first layer,
wherein the second layer includes a barrier layer disposed on an upper surface of the first layer and a metal layer disposed on the barrier layer.

2. The memory device of claim 1, wherein the first layer includes polysilicon doped with impurities; and
the second layer includes at least one of a metal, a metal silicide, and a metal compound.

3. The memory device of claim 1, wherein the second layer extends longer than the first layer in the first direction.

4. The memory device of claim 1:
wherein the first layer includes polysilicon doped with impurities having a same conductivity-type as the source area; and
wherein an impurity concentration of the first layer is higher than that of the source area.

5. The memory device of claim 1:
wherein the common source line includes a third layer disposed on the second layer; and
wherein the third layer includes at least one of a metal, a metal silicide, and a metal compound.

6. The memory device of claim 5, wherein the third layer has a greater thickness than the second layer.

7. The memory device of claim 5, wherein the third layer extends longer than the first layer and the second layer in the first direction.

8. The memory device of claim 1, further comprising an interlayer insulating layer disposed on the gate structure, wherein at least one of the plurality of layers included in the common source line is disposed on the interlayer insulating layer.

9. The memory device of claim 8, wherein an upper surface of one of the plurality of layers included in the common source line is coplanar with an upper surface of the interlayer insulating layer.

10. The memory device of claim 1, wherein a height of the common source line is greater than a height of the gate structure.

11. The memory device of claim 10, further comprising a side spacer disposed between the common source line and the plurality of gate electrode layers to divide the gate structure into a plurality of parts.

12. A memory device, comprising:
a substrate;
a source area disposed in the substrate to extend in a first direction and including n-type impurities;

a plurality of channel areas extending in a direction perpendicular to an upper surface of the substrate;

a plurality of gate electrode layers stacked on the upper surface of the substrate and disposed to be adjacent to at least a portion of the plurality of channel areas; and a common source line layer disposed on the source area to extend in the first direction, and including a first layer containing polysilicon having a higher concentration of n-type impurities than the source area and a second layer disposed on an upper surface of the first layer and containing at least one of a metal, a metal silicide, and a metal compound.

13. The memory device of claim 12, wherein the second layer extends longer than the first layer in the first direction.

14. The memory device of claim 12, further comprising:

a plurality of peripheral circuit devices disposed around the plurality of gate electrode layers;

a peripheral circuit contact connected to the plurality of peripheral circuit devices; and a contact metal layer disposed on an upper surface of the peripheral circuit contact, wherein an upper surface of the contact metal layer is coplanar with an upper surface of the second layer.

15. A vertical memory device comprising:

a gate structure including a plurality of gate electrodes stacked on a substrate;

a source area in the substrate, the source area extending in a first direction and including impurities; and a common source line extending in a direction perpendicular to an upper surface of the substrate to be connected to the source area and including a plurality of layers containing different materials, wherein the common source line comprises:

a first layer disposed on the source area and including polysilicon doped with impurities; and a second layer disposed on the first layer and including a barrier layer on an upper surface of the first layer and a metal layer on the barrier layer, wherein the second layer is thinner than the first layer and extends longer than the first layer in the first direction.

16. The device of claim 15, wherein the second layer comprises a first metal layer including Titanium (Ti) and a second metal layer of tungsten (W) thereon.

17. The device of claim 15, wherein a concentration of n-type impurities in the common source line is higher than a concentration of n-type impurities in the source area.

* * * * *